United States Patent
Junus et al.

(10) Patent No.: US 11,460,926 B2
(45) Date of Patent: *Oct. 4, 2022

(54) HUMAN-COMPUTER INTERFACE SYSTEM

(71) Applicant: Sensel, Inc., Sunnyvale, CA (US)

(72) Inventors: James Junus, Sunnyvale, CA (US);
Ninad Sathe, Sunnyvale, CA (US);
Shuangming Li, Sunnyvale, CA (US);
Ilya Daniel Rosenberg, Sunnyvale, CA (US); John Aaron Zarraga, Sunnyvale, CA (US); Eric Rosales, Sunnyvale, CA (US)

(73) Assignee: Sensel, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/367,576

(22) Filed: Jul. 5, 2021

(65) Prior Publication Data
US 2021/0333880 A1    Oct. 28, 2021

Related U.S. Application Data

(63) Continuation-in-part of application No. 17/191,631, filed on Mar. 3, 2021, now Pat. No. 11,269,452, and
(Continued)

(51) Int. Cl.
*G06F 3/01* (2006.01)
*G06F 3/045* (2006.01)
*G06F 3/041* (2006.01)

(52) U.S. Cl.
CPC .............. *G06F 3/016* (2013.01); *G06F 3/045* (2013.01); *G06F 3/0416* (2013.01); *G06F 2203/04105* (2013.01)

(58) Field of Classification Search
CPC ........ G06F 3/016; G06F 3/0416; G06F 3/045; G06F 2203/04105; G06F 1/16;
(Continued)

(56) References Cited

U.S. PATENT DOCUMENTS 4,959,631 A    9/1990  Hasegawa et al.
8,981,242 B2 *  3/2015  Bayramoglu ........... G06F 3/046
                                                   345/173
(Continued)

FOREIGN PATENT DOCUMENTS

CN    102341768 A    2/2012
CN    101828161 B    4/2013
(Continued)

OTHER PUBLICATIONS

ESSR received in EP Application No. 17776861.1 dated Oct. 29, 2019.
(Continued)

*Primary Examiner* — Rodney Amadiz
(74) *Attorney, Agent, or Firm* — Run8 Patent Group, LLC; Peter Miller; Alexander Rodriguez

(57) ABSTRACT

One variation of a system includes a substrate including: a first layer including a first spiral trace coiled in a first direction; a second layer arranged below the first layer and including a second spiral trace coiled in a second direction and cooperating with the first spiral trace to form a multi-layer inductor; and a sensor layer including an array of drive and sense electrode pairs. The system also includes: a cover layer arranged over the substrate and defining a touch sensor surface; and a first magnetic element arranged below the substrate and defining a first polarity facing the multi-layer inductor. The system further includes a controller configured to drive an oscillating voltage across the multi-layer inductor to oscillate the substrate in response to detecting an input on the touch sensor surface based on electrical values from the set of drive and sense electrode pairs.

20 Claims, 20 Drawing Sheets

Related U.S. Application Data a continuation-in-part of application No. 17/092,002, filed on Nov. 6, 2020, which is a continuation of application No. 16/297,426, filed on Mar. 8, 2019, now Pat. No. 10,866,642, and a continuation-in-part of application No. 15/845,751, filed on Dec. 18, 2017, now Pat. No. 10,564,839, which is a continuation-in-part of application No. 15/476,732, filed on Mar. 31, 2017, now Pat. No. 10,331,265.

(60) Provisional application No. 63/048,071, filed on Jul. 3, 2020, provisional application No. 62/984,448, filed on Mar. 3, 2020, provisional application No. 63/040,433, filed on Jun. 17, 2020, provisional application No. 63/063,168, filed on Aug. 7, 2020, provisional application No. 62/640,138, filed on Mar. 8, 2018, provisional application No. 62/316,417, filed on Mar. 31, 2016, provisional application No. 62/343,453, filed on May 31, 2016.

(58) Field of Classification Search
CPC ...... G06F 3/03547; H03K 2217/96015; H03K 2217/96062; H03K 17/9618
See application file for complete search history.

(56) References Cited

U.S. PATENT DOCUMENTS

| | | | |
|---|---|---|---|
| 9,019,207 | B1 | 4/2015 | Hamburgen et al. |
| 9,158,377 | B2 | 10/2015 | Shinozaki |
| 9,829,981 | B1 | 11/2017 | Ji |
| 10,101,859 | B2 | 10/2018 | Jin |
| 10,209,846 | B2 | 2/2019 | Wang et al. |
| 10,331,265 | B2* | 6/2019 | Rosenberg ............ G06F 3/0414 |
| 10,459,542 | B1 | 10/2019 | Costante et al. |
| 10,564,839 | B2 | 2/2020 | Rosenberg et al. |
| 10,963,059 | B2 | 3/2021 | Rosenberg et al. |
| 2002/0149561 | A1 | 10/2002 | Fukumoto et al. |
| 2003/0095095 | A1 | 5/2003 | Pihlaja |
| 2005/0038944 | A1 | 2/2005 | Harada et al. |
| 2005/0180082 | A1* | 8/2005 | Nakamura ............ H01H 13/85 361/139 |
| 2007/0015966 | A1 | 1/2007 | Niwa et al. |
| 2009/0256817 | A1 | 10/2009 | Perlin et al. |
| 2010/0128002 | A1 | 5/2010 | Stacy et al. |
| 2010/0141606 | A1 | 6/2010 | Bae et al. |
| 2010/0156818 | A1 | 6/2010 | Burrough et al. |
| 2010/0253633 | A1 | 10/2010 | Nakayama et al. |
| 2011/0025631 | A1 | 2/2011 | Han |
| 2011/0025648 | A1 | 2/2011 | Laurent et al. |
| 2011/0090151 | A1 | 4/2011 | Huang et al. |
| 2011/0134061 | A1 | 6/2011 | Lim |
| 2011/0248957 | A1 | 10/2011 | Park |
| 2012/0068938 | A1 | 3/2012 | Kontio |
| 2012/0068971 | A1 | 3/2012 | Pemberton-Pigott |
| 2012/0154316 | A1 | 6/2012 | Kono |
| 2012/0188194 | A1 | 7/2012 | Sulem et al. |
| 2012/0235942 | A1 | 9/2012 | Shahoian et al. |
| 2014/0008203 | A1 | 1/2014 | Nathan et al. |
| 2014/0055407 | A1 | 2/2014 | Lee et al. |
| 2014/0362014 | A1 | 12/2014 | Ullrich et al. |
| 2015/0002416 | A1 | 1/2015 | Koike et al. |
| 2015/0054768 | A1 | 2/2015 | Grant et al. |
| 2015/0091858 | A1 | 4/2015 | Rosenberg et al. |
| 2015/0153829 | A1 | 6/2015 | Shiraishi |
| 2015/0185848 | A1 | 7/2015 | Levesque et al. |
| 2016/0062574 | A1 | 3/2016 | Anzures et al. |
| 2016/0165931 | A1 | 6/2016 | Lengerich et al. |
| 2016/0259411 | A1 | 9/2016 | Yoneoka et al. |
| 2016/0370899 | A1 | 12/2016 | Chang et al. |
| 2017/0285848 | A1 | 10/2017 | Rosenberg et al. |
| 2017/0336891 | A1 | 11/2017 | Rosenberg et al. |
| 2017/0336904 | A1 | 11/2017 | Hsieh et al. |
| 2017/0344115 | A1 | 11/2017 | Ji |
| 2018/0059791 | A1 | 3/2018 | Hajati |
| 2019/0196646 | A1 | 6/2019 | Rosenberg et al. |
| 2019/0212842 | A1 | 7/2019 | Hinson et al. |
| 2019/0212874 | A1 | 7/2019 | Nathan et al. |
| 2019/0265834 | A1 | 8/2019 | Rosenberg et al. |
| 2019/0339776 | A1 | 11/2019 | Rosenberg et al. |
| 2021/0333880 | A1 | 10/2021 | Junus et al. |

FOREIGN PATENT DOCUMENTS

| | | |
|---|---|---|
| EP | 0469255 A1 | 2/1992 |
| EP | 0469255 B1 | 6/1995 |
| EP | 2375308 A1 | 10/2011 |
| EP | 3043240 A1 | 7/2016 |
| JP | H1185380 A | 3/1999 |
| JP | H11212725 A | 8/1999 |
| JP | 2002149312 A | 5/2002 |
| JP | 2004310518 A | 11/2004 |
| JP | 2007026344 A | 2/2007 |
| JP | 2008192092 A | 8/2008 |
| JP | 2011048409 A | 3/2011 |
| JP | 2011048665 A | 3/2011 |
| JP | 2011209785 A | 10/2011 |
| JP | 2012027875 A | 2/2012 |
| JP | 2012048407 A | 3/2012 |
| JP | 2012181833 A | 9/2012 |
| JP | 2012522317 A | 9/2012 |
| JP | 2015002853 A | 1/2015 |
| JP | 2015125666 A | 7/2015 |
| WO | 2010104953 A1 | 9/2010 |
| WO | 2011111906 A1 | 9/2011 |
| WO | 2012081182 A1 | 6/2012 |
| WO | 2013001779 A1 | 1/2013 |
| WO | 2013104919 A1 | 7/2013 |
| WO | 2013186844 A1 | 12/2013 |
| WO | 2016035628 A1 | 3/2016 |
| WO | 2018112466 A1 | 6/2018 |
| WO | 2019021466 A1 | 1/2019 |

OTHER PUBLICATIONS

ESSR received in EP Application No. 17880897.8 dated Jul. 3, 2020.
ESSR received in EP. Application No. 19764741.5 dated Nov. 15, 2021.
International Search Report received in PCT/US17/55575 dated Jun. 20, 2017.
International Search Report received in PCT/US17/67064 dated Mar. 6, 2018.
International Search Report received in PCT/US19/21466 dated Jun. 21, 2019.
International Search Report received in PCT/US21/20753 dated Jul. 27, 2021.
ISR received in PCT/US2021/040404 dated Oct. 20, 2021.
Office Action received in CN Application No. 201780034147.4 dated Mar. 19, 2021.
Office Action received in EP Application No. EP17776861.1 dated Oct. 6, 2021.
Office Action received in Japanese Patent Application No. 2020-113821 dated Jul. 27, 2021.
Office Action received in Japanese Patent Application No. 2020-546911 dated Nov. 8, 2021.
Notification of the International Application Number and of the International Filing Date for International Patent Application No. PCT/US2021/040404; dated Sep. 27, 2021; 1 page.
International Search Report received in PCT/US2019/021466 dated Jun. 21, 2019.
Japanese Patent Application No. 2020546911 dated Nov. 8, 2021.
Notice of Allowance received in U.S. Appl. No. 16/277,774 dated Feb. 24, 2021.
Notice of Allowance received in U.S. Appl. No. 17/092,002 dated Sep. 20, 2021.
Notice of Allowance received in U.S. Appl. No. 17/367,572 dated Feb. 3, 2022.

(56) References Cited

OTHER PUBLICATIONS

Notice of Allowance received in JP Application No. 2018-551260 dated May 27, 2020.
Office Action received in U.S. Appl. No. 16/297,426 dated Apr. 22, 2020.
Office Action received in U.S. Appl. No. 15/845,751 dated Jun. 11, 2019.
Office Action received in U.S. Appl. No. 16/405,937 dated Apr. 23, 2020.
Office Action received in U.S. Appl. No. 16/727,774 dated Aug. 6, 2020.
Office Action Received in U.S. Appl. No. 17/181,486 dated Aug. 3, 2021.
Office Action Received in U.S. Appl. No. 15/476,732 dated Oct. 2, 2018.

* cited by examiner

HUMAN-COMPUTER INTERFACE SYSTEM

CROSS-REFERENCE TO RELATED APPLICATIONS

This application claims priority to 63/048,071, filed on 3 Jul. 2020, which is incorporated in its entirety by this reference.

This application is a continuation-in-part application of U.S. patent application Ser. No. 17/191,631, filed on 3 Mar. 2021, which claims the benefit of U.S. Provisional Patent Application Nos. 62/984,448, filed 3 Mar. 2020, 63/040,433, filed on 17 Jun. 2020, and 63/063,168, filed on 7 Aug. 2020, each of which is incorporated in its entirety by this reference.

This application is a continuation-in-part application of U.S. patent application Ser. No. 17/092,002, filed on 6 Nov. 2020, which is a continuation application of U.S. patent application Ser. No. 16/297,426, filed on 8 Mar. 2019, which claims the benefit of U.S. Provisional Application No. 62/640,138, filed on 8 Mar. 2018, each of which is incorporated in its entirety by this reference.

U.S. patent application Ser. No. 16/297,426 is also a continuation-in-part application of U.S. patent application Ser. No. 15/845,751, filed on 18 Dec. 2017, which is a continuation-in-part application of U.S. patent application Ser. No. 15/476,732, filed on 31 Mar. 2017, which claims the benefit of U.S. Provisional Application No. 62/316,417, filed on 31 Mar. 2016, and U.S. Provisional Application No. 62/343,453, filed on 31 May 2016, each of which is incorporated in its entirety by this reference.

This application is also related to U.S. patent application Ser. No. 14/499,001, filed on 26 Sep. 2014, and to U.S. patent application Ser. No. 17/191,631, filed on 3 Mar. 2021, each of which is incorporated in its entirety by this reference.

TECHNICAL FIELD

This invention relates generally to the field of touch sensors and more specifically to a new and useful human-computer interface system in the field of touch sensors.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 1:
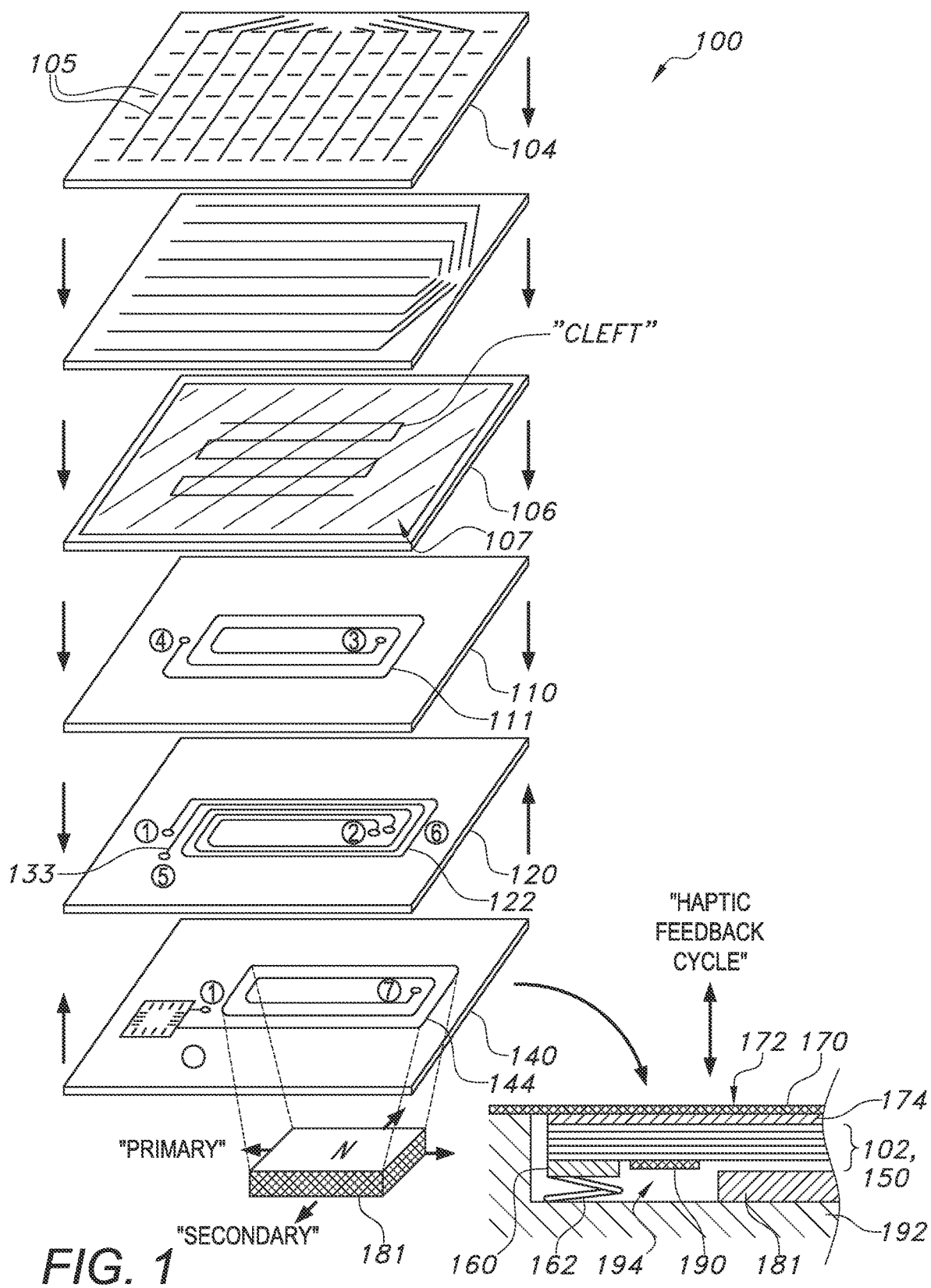
FIG. 1 is a schematic representation of a system.

As shown in FIG. 1, a system 100 includes: a substrate 102; a cover layer 170; a first magnetic element 181; and a controller 190. The substrate 102 includes: a first layer no including a first spiral trace 111 coiled in a first direction; a second layer 120; and a sensor layer including an array of drive and sense electrode pairs 105. The second layer 120: is arranged below the first layer no; and includes a second spiral trace 122 coiled in a second direction opposite the first direction, coupled to the first spiral trace 111 by a via between the first layer no and the second layer 120, and cooperating with the first spiral trace 111 to form a multi-layer inductor 150. The cover layer 170 is arranged over the substrate 102 and defines a touch sensor surface 172. The first magnetic element 181 is arranged below the substrate 102 and defines a first polarity facing the multi-layer inductor 150. The controller 190 is configured to: read a set of electrical values from the set of drive and sense electrode pairs 105; detect a first input on the touch sensor surface 172 based on the set of electrical values; and, in response to detecting the first input, drive an oscillating voltage across the multi-layer inductor 150 to induce alternating magnetic coupling between the multi-layer inductor 150 and the first magnetic element 181 and oscillate the substrate 102 and the cover layer 170 relative to the chassis 192.

Figure 2:
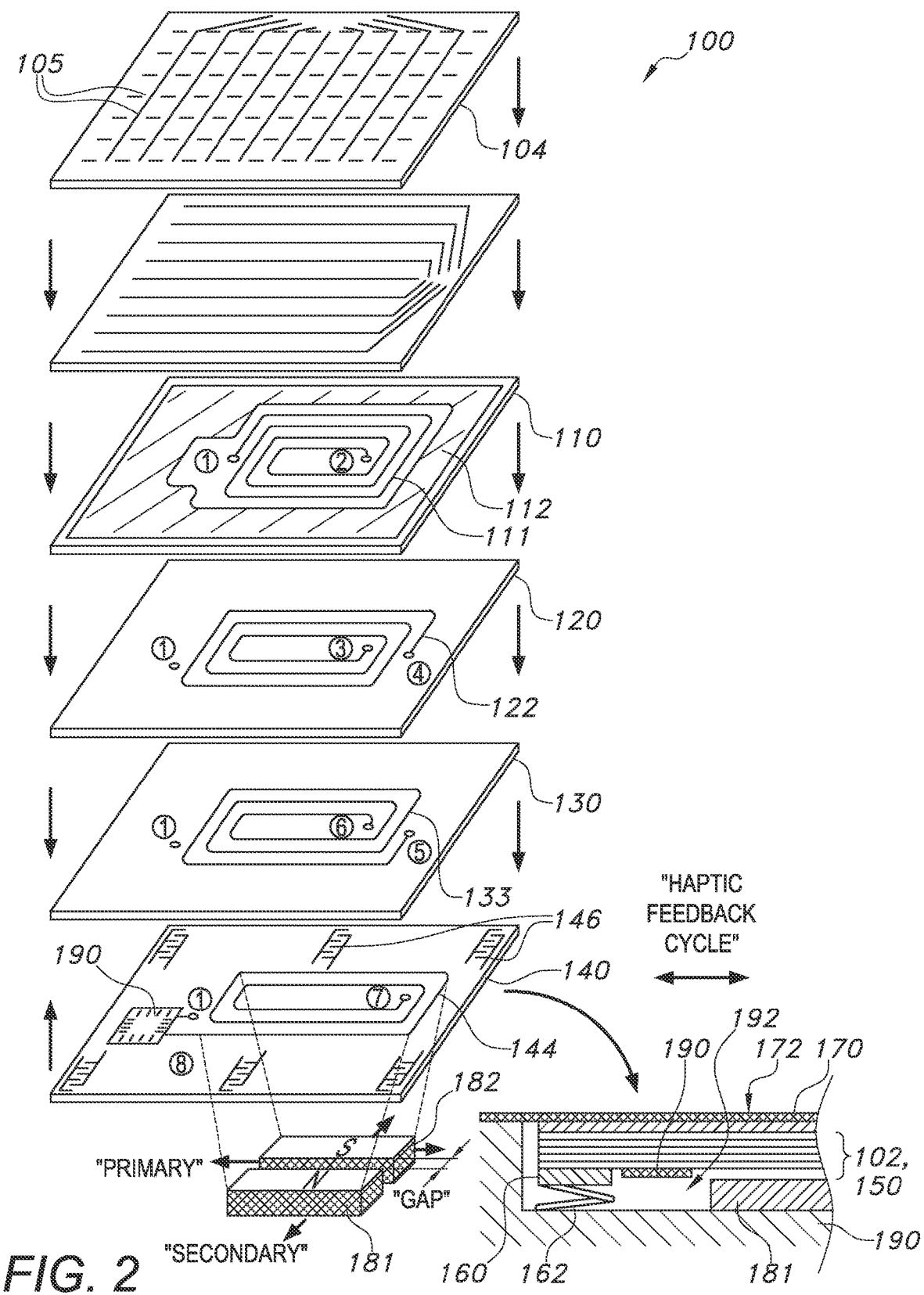
FIG. 2 is a schematic representation of one variation of the system.

One variation of the system 100 shown in FIG. 2 includes: a substrate 102; a cover layer 170; a set of deflection spacers 160; a first magnetic element 181; and a controller 190. In this variation, the substrate 102 defines a unitary structure and includes a first layer 110, a second layer 120, and a bottom layer 140. The first layer 110: is arranged below the top layer 104; and includes a first spiral trace 111 coiled in a first direction and defining a first end and a second end. The second layer 120: is arranged below the first layer no; and includes a second spiral trace 122 coiled in a second direction opposite the first direction, defining a third end and a fourth end, the third end electrically coupled to the second end of the first spiral trace 111, and cooperating with the first spiral trace 111 to form a multi-layer inductor 150 defining a primary axis. The bottom layer 140: is arranged below the second layer 120 opposite the first layer no; and includes a set of sensor traces 146 located proximal a perimeter of the substrate 102. The set of deflection spacers 160 is coupled to the second set of sensor traces 146 and supports the substrate 102 on a chassis 192 of a device. The cover layer 170 is arranged over the substrate 102 opposite the set of deflection spacers 160 and defines a touch sensor surface 172. The first magnetic element 181: is arranged in the chassis 192 below the substrate 102; defines a first polarity facing the multi-layer inductor 150; and extends parallel to the primary axis of the multi-layer inductor 150. The controller 190 is configured to: read a set of electrical values from the set of sensor traces 146; interpret a force magnitude of a first input on the touch sensor surface 172 based on the set of electrical values; and, in response to detecting the force magnitude exceeding a threshold force, drive an oscillating voltage across the multi-layer inductor 150 during a haptic feedback cycle to induce alternating magnetic coupling between the multi-layer inductor 150 and the first magnetic element 181 and oscillate the substrate 102 and the cover layer 170 relative to the first magnetic element 181.

Figure 3:
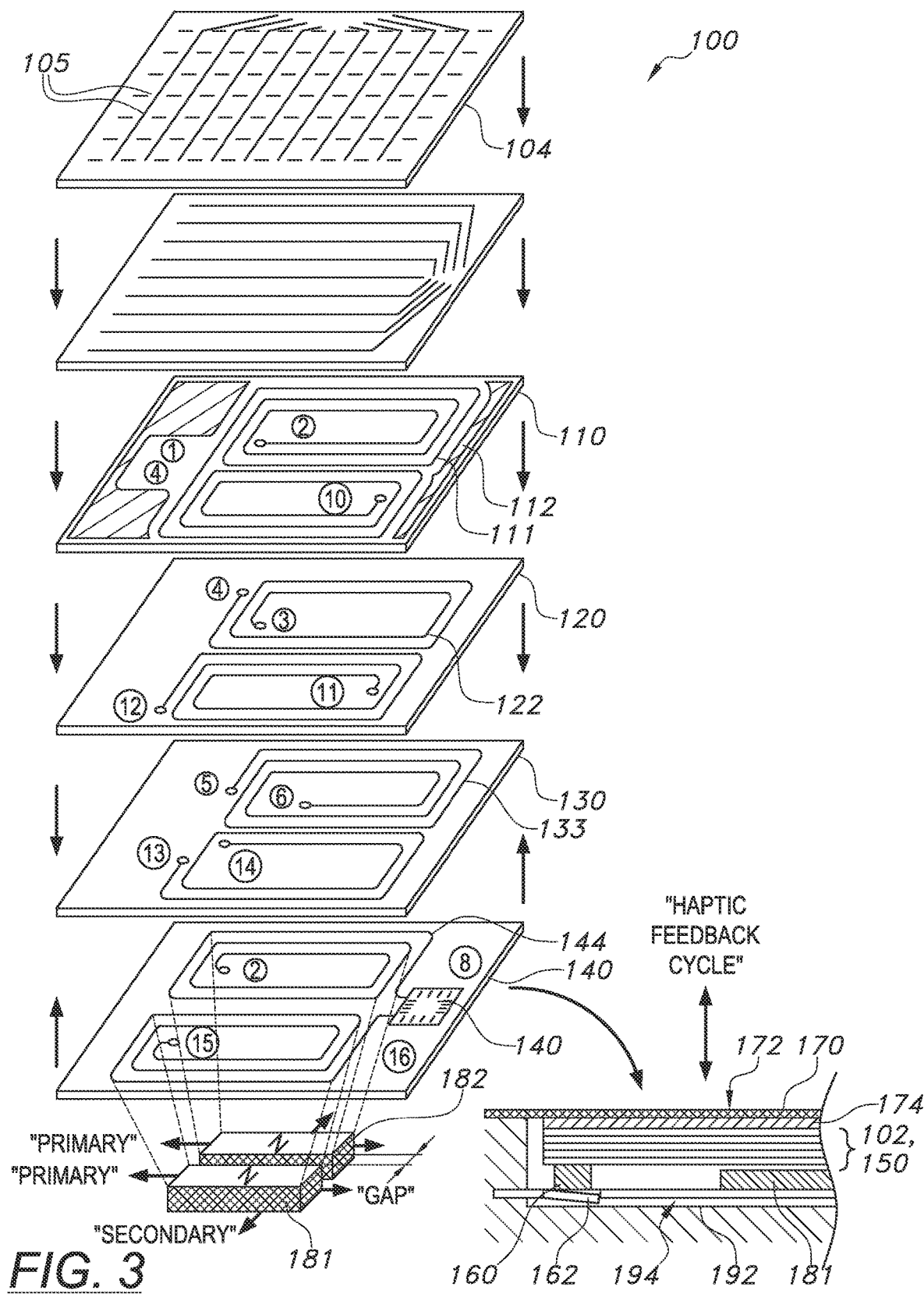
FIG. 3 is a schematic representation of one variation of the system.

Yet another variation of the system 100 shown in FIG. 3 includes: a substrate 102; a cover layer 170; a first magnetic element 181; a second magnetic element 182; and a controller 190. In this variation, the substrate 102 defines a unitary structure and includes a top layer 104, a first layer 110, and a bottom layer 140. The top layer 104 includes an array of drive and sense electrode pairs 105. The first layer 110: is arranged below the top layer 104; and includes a first spiral trace 111 coiled in a first direction and defining a first end and a second end. The second layer 120: is arranged below the first layer no opposite the top layer 104; and includes a second spiral trace 122 coiled in a second direction opposite the first direction, defining a third end and a fourth end, the third end electrically coupled to the second end of the first spiral trace 111, and cooperating with the first spiral trace 111 to form a multi-layer inductor 150 defining a primary axis and a secondary axis. The cover layer 170 is arranged over the top layer 104 and defines a touch sensor surface 172. The first magnetic element 181: is arranged below the substrate 102; defines a first polarity facing the multi-layer inductor 150; extends along the primary axis of the multi-layer inductor 150; and is arranged on a first side of the primary axis of the multi-layer inductor 150. The second magnetic element 182: is arranged below the substrate 102 adjacent the first magnetic element 181; defines a second polarity, opposite the first polarity, facing the multi-layer inductor 150; extends along the primary axis of the multi-layer inductor 150; and is arranged on a second side of the primary axis of the multi-layer inductor 150. The controller 190 is configured to: read a set of electrical values from the set of drive and sense electrode pairs 105; detect a first input on the touch sensor surface 172 based on the set of electrical values; and, in response to detecting the first input, drive an oscillating voltage across the multi-layer inductor 150 during a haptic feedback cycle to induce alternating magnetic coupling between the multi-layer inductor 150 and the first magnetic element 181 and the second magnetic element 182 and oscillate the substrate 102 and the cover layer 170 relative to the first magnetic element 181 and the second magnetic element 182.

Another variation of the system 100 includes: a substrate 102; a first magnetic element 181; and a controller 190. In this variation, the substrate 102 defines a unitary structure and includes: a first layer comprising a first spiral trace, coiled in a first direction, and defining a first end and a second end; a second layer arranged below the first layer and comprising a second spiral trace, coiled in a second direction opposite the first direction defining a third end electrically coupled to the second end of the first spiral trace, defining a fourth end, and cooperating with the first spiral trace to form a multi-layer inductor defining a primary axis and a secondary axis. The first magnetic element: is arranged below the substrate; defines a first polarity facing the multi-layer inductor; extends along the primary axis of the multi-layer inductor; and is arranged on a first side of the primary axis of the multi-layer inductor. The second magnetic element: is arranged below the substrate adjacent the first magnetic element; defines a second polarity, opposite the first polarity, facing the multi-layer inductor; extends along the primary axis of the multi-layer inductor; and is arranged on a second side of the primary axis of the multi-layer inductor. The controller is configured to, in response to an input on a touch sensor surface arranged over the substrate, drive an oscillating voltage across the multi-layer inductor during a haptic feedback cycle to: induce alternating magnetic coupling between the multi-layer inductor and the first magnetic element and the second magnetic element; and oscillate the substrate relative to the first magnetic element and the second magnetic element.

Yet another variation of the system 100 includes: a substrate 102; a set of deflection spacers 160; an array of spring elements; a first magnetic element 181; and a controller 190. In this variation, the substrate 102 defines a substrate defining a unitary structure and comprising: a first layer comprising a first spiral trace coiled in a first direction and defining a first end and a second end; and a bottom layer arranged below the first layer and comprising a second spiral trace coiled in a second direction opposite the first direction, defining a third end electrically coupled to the second end of the first spiral trace, defining a fourth end, and cooperating with the first spiral trace to form a multi-layer inductor defining a primary axis. The set of deflection spacers, each deflection spacer in the set of deflection spacers arranged over a discrete deflection spacer location, in a set of discrete deflection spacer locations, on the bottom layer of the substrate. The array of spring elements: couples the set of deflection spacers to a chassis of a computing device; supports the substrate on the chassis; and is configured to yield to oscillation of the substrate. The first magnetic element: is arranged in the chassis below the substrate; defines a first polarity facing the multi-layer inductor; and extends parallel to the primary axis of the multi-layer inductor. The controller configured to, in response to an input on a touch sensor surface arranged over the substrate, drive an oscillating voltage across the multi-layer inductor during a haptic feedback cycle to: induce alternating magnetic coupling between the multi-layer inductor and the first magnetic element; and oscillate the substrate relative to the first magnetic element and against the set of spring elements.

2. Applications

As shown in FIGS. 1-3, the system 100 for human-computer interfacing includes: a touch sensor; a multi-layer inductor 150; and a controller 190. The touch sensor includes: a substrate 102; an array of drive and sense electrode pairs 105 patterned across the substrate 102; a cover layer 170 defining a touch sensor surface 172; and a force-sensitive layer 174 arranged between the substrate 102 and the cover layer 170 and including a material exhibiting changes in local contact resistance (and/or changes in local bulk resistance) responsive to changes in force magnitude applied to the touch sensor surface 172. As shown in FIGS. 8, 9A, 10A, 10B, and 11A, 11B, 11C, and 11D, the substrate 102 is flexibly mounted within a receptacle 194 (e.g., a touchpad receptacle 194) of a chassis 192 of a computing device to permit movement (i.e., oscillation, vibration) of the substrate 102 within the chassis 192 during a haptic feedback cycle.

A set of magnetic elements are arranged within (e.g., rigidly coupled to, bonded to) a receptacle 194 (e.g., a touchpad receptacle 194) within the receptacle 194. A set of spiral traces are fabricated within each of multiple adjacent layers of the substrate 102—below the drive and sense electrode pairs 105—and are connected by vias to form a multi-layer inductor 150 arranged over the magnetic elements.

During a scan cycle, the controller 190: reads electrical values from the drive and sense electrode pairs 105 during a scan cycle; and interprets locations and force magnitudes of inputs on the touch sensor surface 172 based on these electrical values. In response to detecting a new input—that exceeds a threshold force magnitude—on the touch sensor surface 172, the controller 190: outputs a command based on a location and/or force magnitude of the input; and selectively drives the multi-layer inductor 150 with an oscillating voltage (or oscillating current), which induces an alternating magnetic field through the multi-layer inductor 150, magnetically couples the multi-layer inductor 150 to the magnetic elements, yields an alternating force between the multi-layer inductor 150 and the magnetic elements, and thus oscillates the substrate 102 and the touch sensor surface 172 relative to the chassis 192 of the device.

2.1 Integrated Induction Coil

In this variation, the multi-layer inductor 150 and the set of magnetic elements can cooperate to form an integrated vibrator configured to oscillate the substrate 102 within the chassis 192. For example, the multi-layer inductor 150 can be formed by a set of planar coil traces etched or fabricated on each of multiple layers within the substrate 102 and interconnected by vias through these layers to form one continuous inductor with multiple turns, one or more cores, and/or one or more windings arranged over the set of magnetic elements.

For example, the multi-layer inductor 150 can include: a first trace spiraling inwardly in a first wind direction on a bottom layer 140 of the substrate 102; a second trace spiraling outwardly in the first wind direction on a second layer 120 of the substrate 102; a third trace spiraling inwardly in the first wind direction on a third layer 130 of the substrate 102; and a fourth trace spiraling outwardly in the first wind direction—between adjacent loops of the second trace—on the second layer 120 of the substrate 102. Vias can connect: the end of the first spiral trace 111 in the first layer 110 to the start of the second spiral trace 122 in the second layer 120; the end of the second spiral trace 122 in the second layer 120 to the start of the third spiral trace 133 in the third layer 130; the end of the third spiral trace 133 in the third layer 130 to the start of the fourth spiral trace 144 in the second layer 120; and the end of the fourth spiral trace 144 in the second layer 120 to the bottom layer 140 near the start of the first spiral trace 111.

Thus, in this example, the multi-layer inductor 150 can include multiple spiral traces spanning multiple layers of the substrate 102 and connected to form a continuous inductive coil with two terminals falling in close proximity (e.g., within two millimeters) on the bottom layer 140 of the substrate 102.

The set of magnetic elements can be bonded, fastened, mounted, and/or integrated, etc. into a chassis 192 of a device beneath the multi-layer inductor 150 and can magnetically couple to the multi-layer inductor 150 when a voltage is applied across the multi-layer inductor 150 by the controller 190. In particular, the controller 190 can supply an oscillating voltage (and therefore an alternating current) to the multi-layer inductor 150 (e.g., via a drive circuit coupled to and triggered by the controller 190), which induces: an alternating magnetic field through the multi-layer inductor 150; induces alternating magnetic coupling between the set of magnetic elements and the multi-layer inductor 150; and thus oscillates the substrate 102.

2.2 Unitary Substrate with Integral Input and Output Components

Generally, in this variation, the system 100 functions as a touch sensor with an integrated haptic actuator, pressure sensing, and shielding within a thin (e.g., 4-millimeter-thick) package. For example, the system 100 can be installed in a touchpad receptacle 194 (hereafter the "receptacle 194") in a laptop computer (shown in FIGS. 13, 14, 15A, 15B, and 15C), in a touchpad receptacle 194 in a peripheral user input device (shown in FIG. 16), or under a display of a tablet or smartphone.

As shown in FIGS. 5A, 5B, 6, and 7, the system 100 includes a thin (e.g., 2.5-millimeter-thick) substrate 102 that defines a suite of thin (or "2.5D") traces that form: drive and sense electrodes of a touch sensor; drive and sense electrodes of a set of secondary force or pressure sensors; and an inductor configured to magnetically couple to an adjacent magnetic element. In particular, the multi-layer inductor 150: is integrated into a substrate 102 in the form of multiple interconnected spiral traces etched or otherwise fabricated across multiple layers of the substrate 102; and is configured to magnetically couple to a magnetic element integrated into (e.g., located within and retained by) a chassis 192. Thus, the set of magnetic elements and the multi-layer inductor 150 cooperate to function as a multi-layer inductor 150 configured to oscillate a touch sensor surface 172 responsive to polarization of the multi-layer inductor 150 (e.g., by a drive circuit or controller 190), thereby enabling the system 100 to output real-time haptic feedback in response to inputs on the touch sensor surface 172.

Therefore, the system 100 can include a set of planar, interconnected spiral traces fabricated across multiple conductive (e.g., copper) layers of the substrate 102 to form a multi-layer inductor 150 located fully within the substrate 102 and fabricated concurrently with and with the same processes as touch sensor electrode traces that form a capacitive or resistive touch sensor across a top of the substrate 102 and that form a capacitive or resistive pressure sensor across a bottom of the substrate 102.

More specifically, a dense grid array of drive and sense electrode pairs 105 can be concurrently fabricated across a top layer 104 of the substrate 102 to form a touch sensor configured to detect the x-position, the y-position, and/or a force magnitude of an input on the touch sensor surface 172. Additionally or alternatively, a set of sensor traces 146 can be concurrently fabricated on a bottom layer 140 of the substrate 102 at intermittent locations about a perimeter of the substrate 102 to form a sparse array of force sensors configured to detect a force magnitude of an input on the touch sensor surface 172. The electrical traces that form these sensors can then therefore fall fully within the substrate 102. A thin cover layer 170 (e.g., a 0.5-millimeter-thick glass or polymer panel for a capacitive touch sensor; a 0.5-millimeter-thick force-sensing layer for the resistive touch sensor arrange across the top layer 104 of the substrate 102) can be installed over the top layer 104 of the substrate 102 to enclose the touch sensor and form a touch sensor surface 172. Force-sensing coupons and/or low-durometer spacers (e.g., with a total thickness of one millimeter) can be installed over each sensor trace on the bottom of the substrate 102 to form a set of deflection spacers 160 configured to support the substrate 102 with the receptacle 194 of the substrate 102, to carry forces input on the touch sensor surface 172 into the chassis 192, and to output signals corresponding to forces carried by the individual sensor traces 146, which the controller 190 can convert into individual forces and total forces carried at these deflection spacers 160 in response to inputs on the touch sensor surface 172. A thin, non-conductive, non-magnetic buffer layer (e.g., a polyimide film less than 0.2 millimeters in thickness) can be applied over the bottom spiral trace of the multi-layer inductor 150 to maintain a minimal gap between the multi-layer inductor 150 and the set of magnetic elements arranged in the receptacle 194 below. Thus, the total height of the system 100 with the cover layer 170 and the set of deflection spacers 160 may be less than 4 millimeters.

Furthermore, the chassis 192 of a device (e.g., a laptop computer, a peripheral input device) can define a shallow (e.g., 4-millimeter-deep) receptacle 194, and the system 100 can be installed in the receptacle 194—with the deflection spacers 160 in contact with the base of the receptacle 194—to enable touch sensing, pressure sensing, and haptic feedback functionality in the device with no or limited increase in thickness of the chassis 192. In one implementation, the chassis 192 of the device further includes a cavity recessed below the receptacle 194, and the set of magnetic elements is installed (e.g., bonded, potted) within the cavity below the multi-layer inductor 150 on the substrate 102. Alternatively, a thinner magnetic element (e.g., 0.8 mm in thickness) can be installed in the receptacle 194 between the base of the cavity and the bottom of the substrate 102 (e.g., between the base of the cavity and the buffer layer arranged over the first spiral trace 111 of the multi-layer inductor 150).

Therefore, the system 100—including the substrate 102, the touch sensor, and/or the deflection spacers 160, etc.— can seat low in the receptacle 194 of the device with a small gap between the bottom layer 140 of the substrate 102 and the receptacle 194 (e.g., less than 300 microns rather than multiple millimeters to accommodate a discrete inductor installed on the substrate 102), thereby limiting total assembled height of the system 100 and the device. Furthermore, integration of the multi-layer inductor 150 into the substrate 102 may reduce and/or eliminate possibility of fatigue or other damage to the multi-layer inductor 150 resulting from repeated cycling and may enable a consistent offset between the multi-layer inductor 150 and the set of magnetic elements, thereby enabling looser tolerances for vertical separation distance between the substrate 102 and the receptacle 194.

Figure 16:
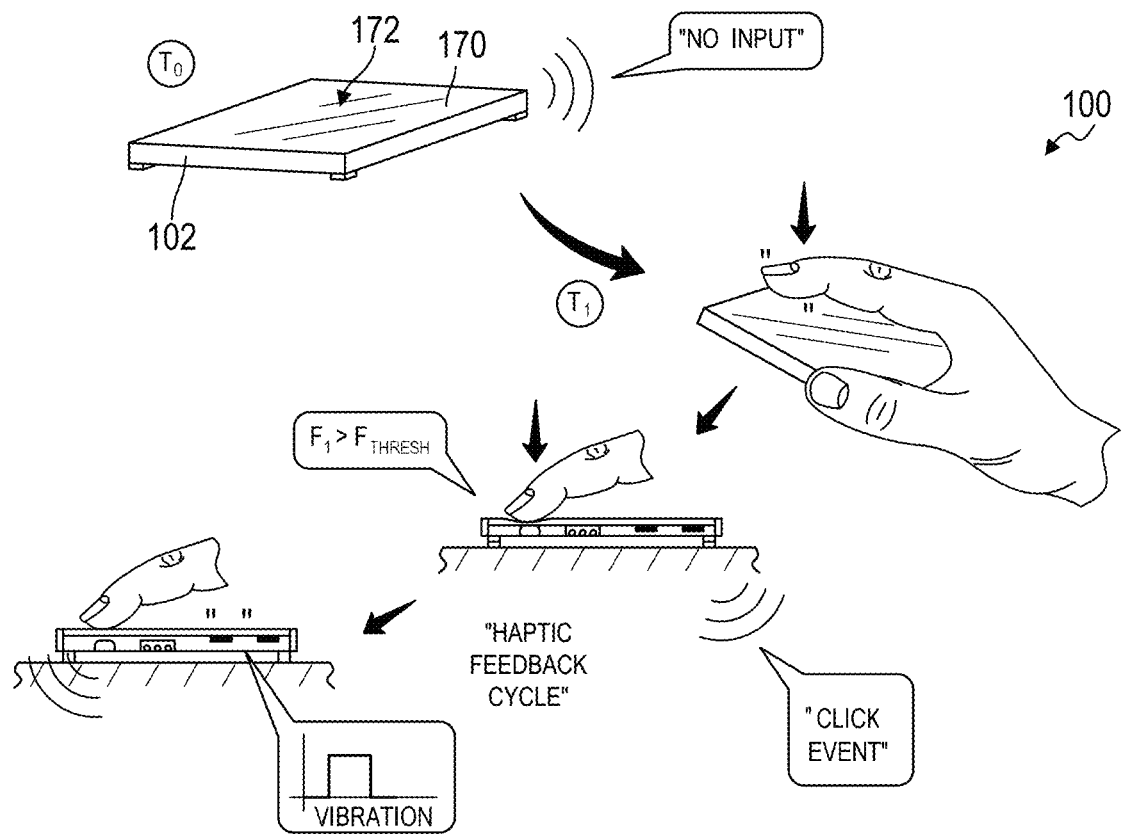
FIG. 16 is a flowchart representation of one variation of the system.

As described above and shown in FIGS. 13, 14, 15A, 15B, and 15C, the system 100 can be integrated into the chassis 192 of a computing device, such as a laptop computer, to form a force-sensitive trackpad or keyboard surface configured to serve real-time haptic feedback to a user interfacing with the computing device and to detect positions and/or forces of the inputs applied over the trackpad or keyboard surface. Additionally and/or alternatively, the system 100 can be integrated into a portable electronic device—such as under the display of a smartphone or smartwatch, or as a peripheral trackpad and/or keyboard device—in order to enable real-time force sensing and haptic feedback capabilities on these portable electronic devices, as shown in FIG. 16.

3. Substrate and Touch Sensor

Figure 6:
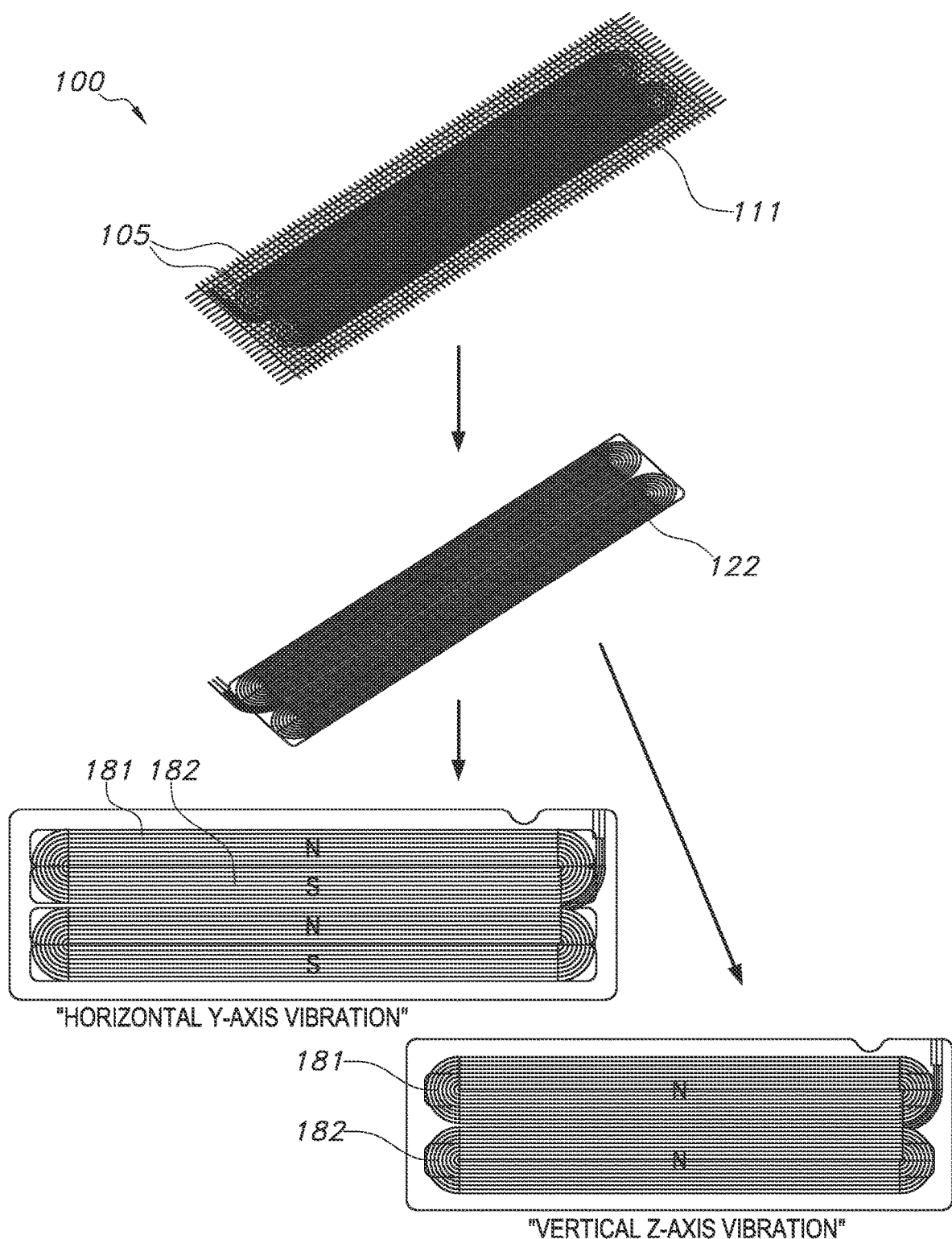
FIG. 6 is a schematic representation of one variation of the system.
Figure 12:
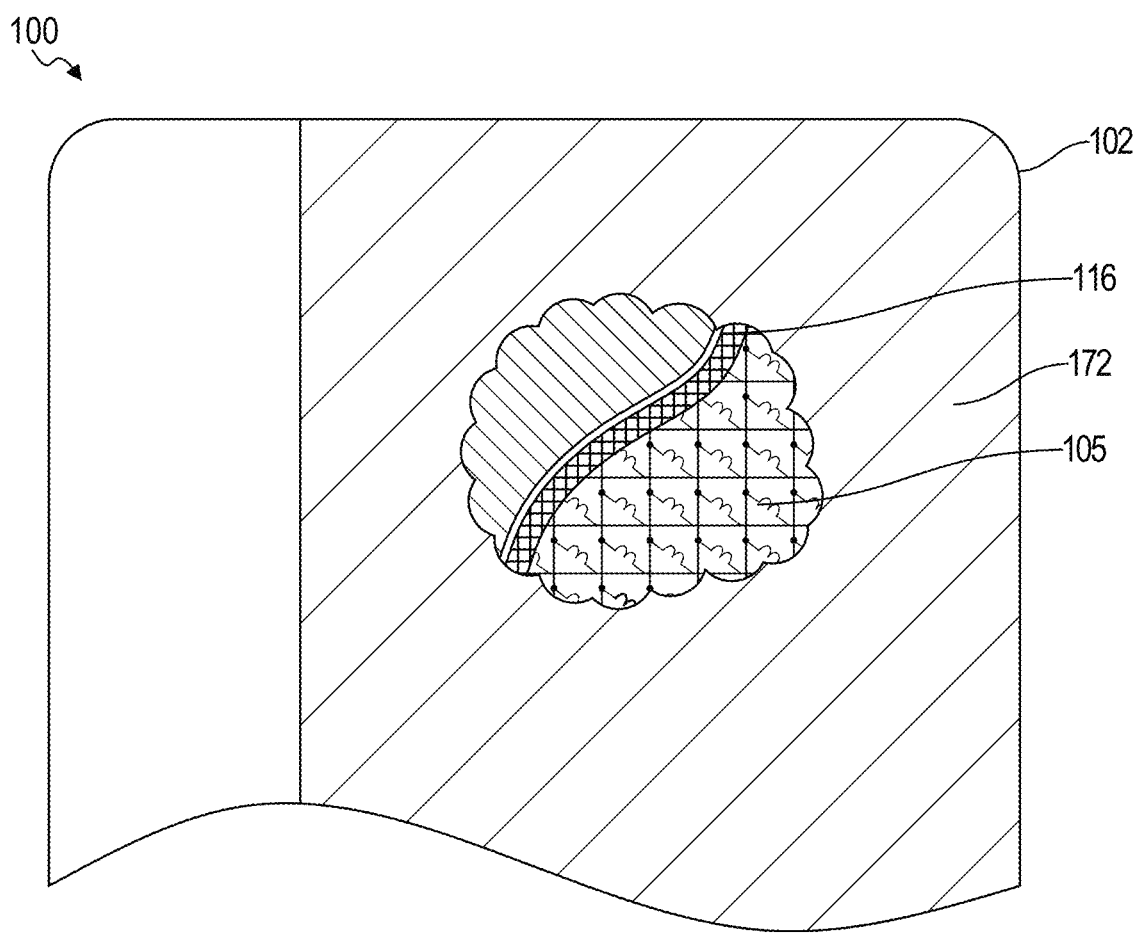
FIG. 12 is a schematic representation of one variation of the system.
Figure 13:
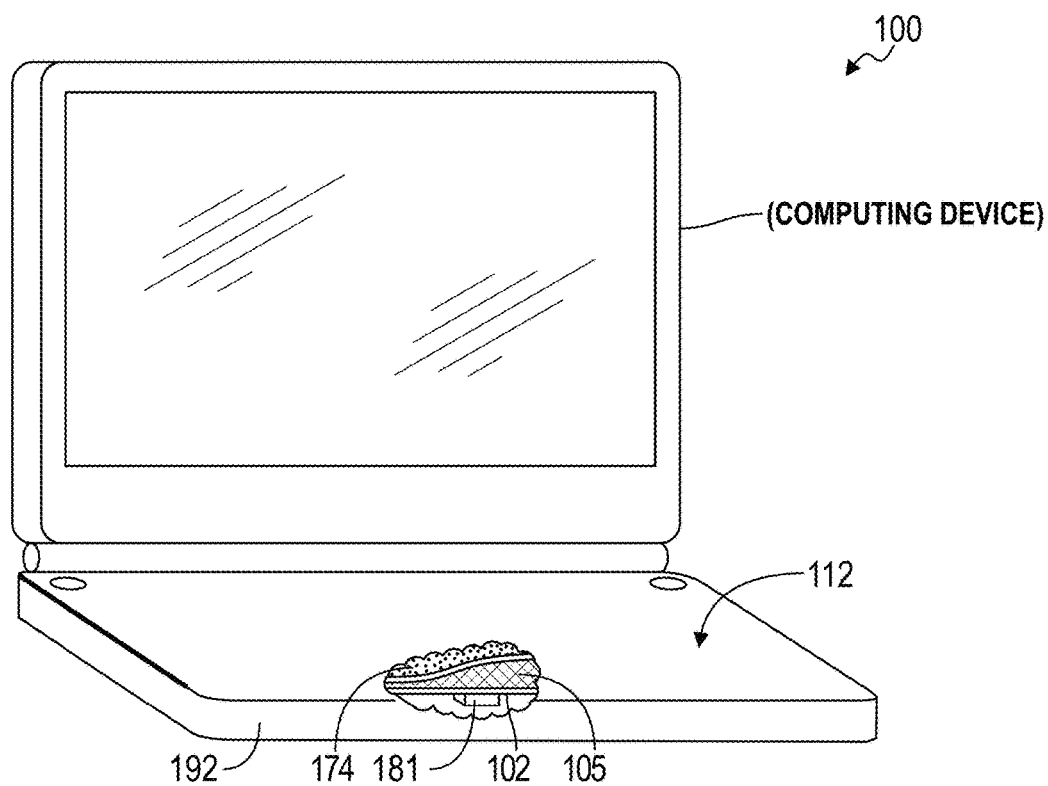
FIG. 13 is a schematic representation of one variation of the system.
Figure 14:
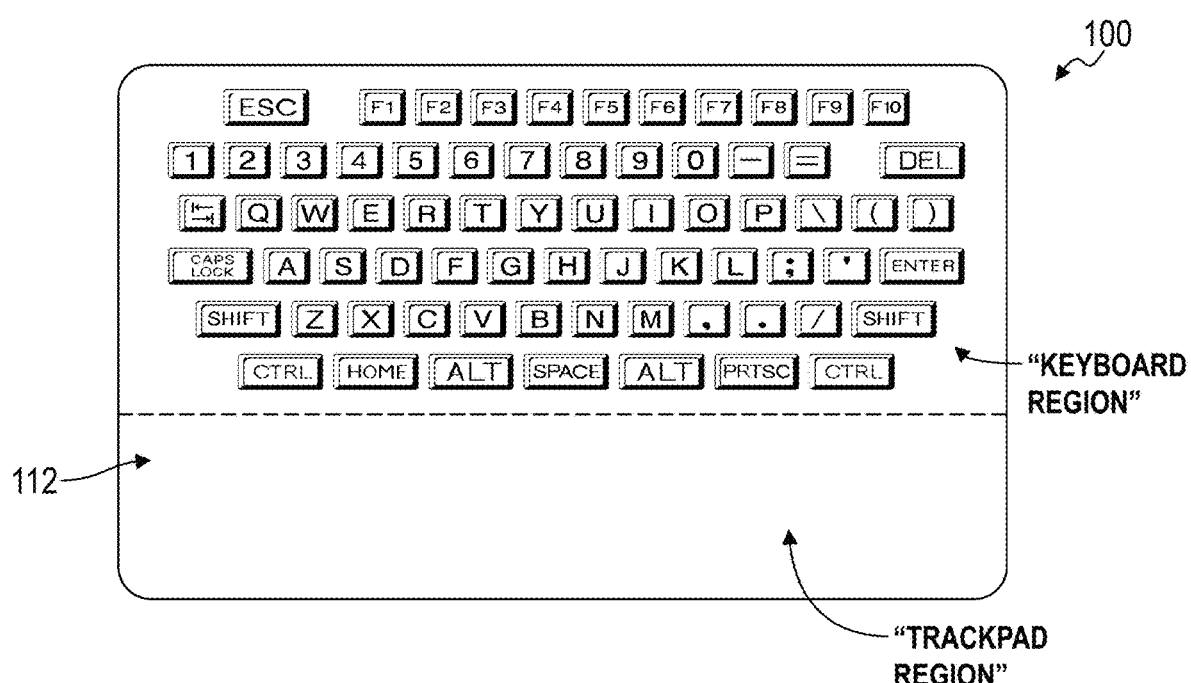
FIG. 14 is a schematic representation of one variation of the system.
Figure 15A:
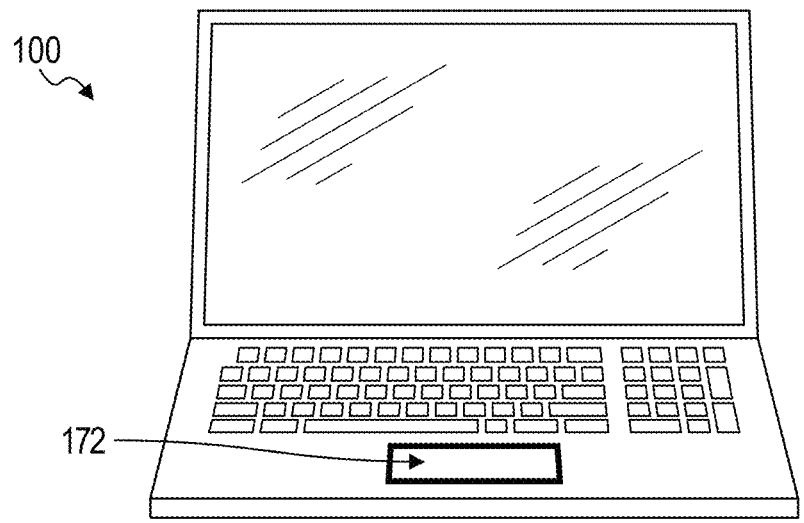
FIGS. 15A-15C are schematic representations of one variation of the system.
Figure 15B:
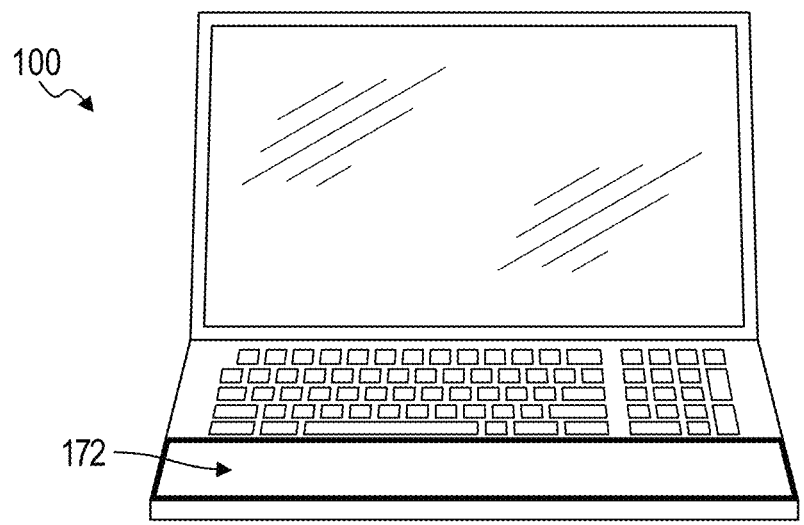
Figure 15C:
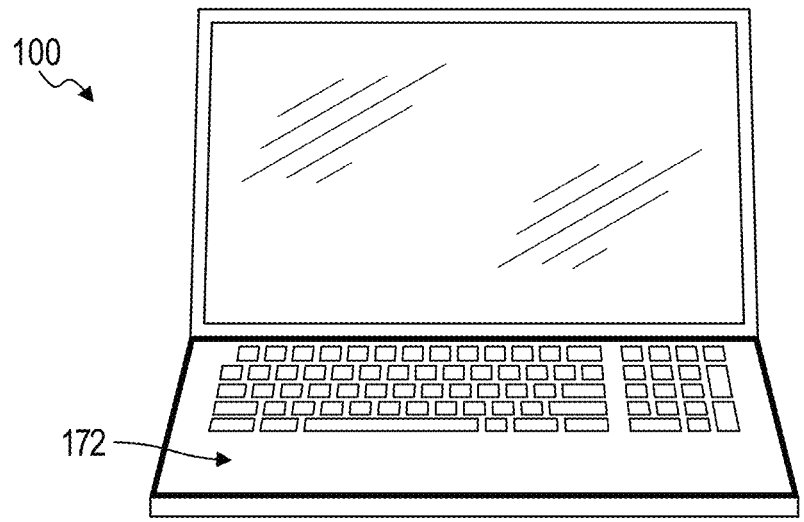

As shown in FIGS. 6 and 12, the system 100 includes a substrate 102 that includes a set of (e.g., six) conductive layers etched to form a set of conductive traces; a set of (e.g., five) substrate layers interposed between the stack of conductive layers; and a set of vias that connect the set of conductive tracers through the set of substrate layers. For example, the substrate 102 can include a six-layer, rigid fiberglass PCB.

In particular, a top conductive layer and/or a second conductive layer of the substrate 102 can include a set of traces that cooperate to form an array (e.g., a grid array) of drive and sense electrode pairs 105 within a touch sensor. Subsequent conductive layers of the substrate 102 below the touch sensor can include interconnected spiral traces that cooperate to form a single- or multi-core, single- or multi-winding, multi-layer inductor 150. Furthermore, a bottom conductive layer and/or a penultimate conductive layer of the substrate 102 can include a set of interdigitated electrodes distributed about the perimeter of the substrate 102 to form a sparse array of force sensors.

3.1 Resistive Touch Sensor

In one implementation, the first and second conductive layers of the substrate 102 include columns of drive electrodes and rows of sense electrodes (or vice versa) that terminate in a grid array of drive and sense electrode pairs 105 on the top layer 104 of the substrate 102. In this implementation, the system 100 further includes a force-sensitive layer 174: arranged over the top conductive layer of the substrate 102 (e.g., interposed between the top layer 104 of the substrate 102 and the cover layer 170); and exhibiting local changes in contact resistance across the set of drive and sense electrode pairs 105 responsive to local application of forces on the cover layer 170 (i.e., on the touch sensor surface 172.)

Accordingly, during a scan cycle, the controller 190 can: serially drive the columns of drives electrodes; serially read electrical values—(e.g., voltages) representing electrical resistances across drive and sense electrode pairs 105—from the rows of sense electrodes; detect a first input at a first location (e.g., an (x, y) location) on the touch sensor surface 172 based on deviation of electrical values—read from a subset of drive and sense electrode pairs 105 adjacent the first location—from baseline resistance-based electrical values stored for this subset of drive and sense electrode pairs 105; and interpret a force magnitude of the first input based on a magnitude of this deviation. As described below, the controller 190 can then drive an oscillating voltage across the multi-layer inductor 150 in the substrate 102 during a haptic feedback cycle in response to the force magnitude of the first input exceeding a threshold input force.

The array of drive and sense electrode pairs 105 on the first and second conductive layers of the substrate 102 and the force-sensitive layer 174 can thus cooperate to form a resistive touch sensor readable by the controller 190 to detect lateral positions, longitudinal positions, and force (or pressure) magnitudes of inputs (e.g., fingers, styluses, palms) on the touch sensor surface 172.

3.2 Capacitive Touch Sensor

In another implementation, the first and second conductive layers of the substrate 102 include columns of drive electrodes and rows of sense electrodes (or vice versa) that terminate in a grid array of drive and sense electrode pairs 105 on the top conductive layer (or on both the top and second conductive layers) of the substrate 102.

During a scan cycle, the controller 190 can: serially drive the columns of drive electrodes; serially read electrical values (e.g., voltage, capacitance rise time, capacitance fall time, resonant frequency)—representing capacitive coupling between drive and sense electrode pairs 105—from the rows of sense electrodes; and detect a first input at a first location (e.g., an (x, y) location) on the touch sensor surface 172 based on deviation of electrical values—read from a subset of drive and sense electrode pairs 105 adjacent the first location—from baseline capacitance-based electrical values stored for this subset of drive and sense electrode pairs 105. For example, the controller 190 can implement mutual capacitance techniques to read capacitance values between these drive and sense electrode pairs 105 and to interpret inputs on the touch sensor surface 172 based on these capacitance values.

The array of drive and sense electrode pairs 105 on the first and second conductive layers of the substrate 102 and the force-sensitive layer 174 can thus cooperate to form a capacitive touch sensor readable by the controller 190 to detect lateral and longitudinal positions of inputs (e.g., fingers, styluses, palms) on the touch sensor surface 172.

3.3 Touchscreen

In one variation, the system includes (or interfaces with) a touchscreen 196 arranged over the substrate and that includes: a digital display; a touch sensor arranged across the display; and a cover layer arranged over the display and defining the touch sensor surface 172. Accordingly, in this variation, the controller is configured to drive the oscillating voltage across the multi-layer inductor during the haptic feedback cycle in response to the touchscreen 196 detecting the input on the touch sensor surface.

In particular, in this variation, the substrate 102 can: receive or integrate with a touch screen (i.e., an integrated display and touch sensor); and can cooperate with the first magnetic element 181 and the controller 190 to vibrate the touch sensor surface over the touchscreen 196 responsive to an input on the touch sensor surface, such as detected by a separate controller coupled to the touchscreen 196.

4. Multi-Layer Inductor

As described above, the system 100 includes a multi-layer inductor 150 formed by a set of interconnected spiral traces fabricated directly within conductive layers within the substrate 102.

Generally, the total inductance of a single spiral trace may be limited by the thickness of the conductive layer. Therefore, the system 100 can include a stack of overlapping, interconnected spiral traces fabricated on a set of adjacent layers of the substrate 102 to form a multi-layer, multi-turn, and/or multi-core inductor that exhibits greater inductance—and therefore greater magnetic coupling to the set of magnetic elements—than a single spiral trace on a single conductive layer of the substrate 102. These spiral traces can be coaxially aligned about a common vertical axis (e.g., centered over the set of magnetic elements) and electrically interconnected by a set of vias through the intervening substrate layers of the substrate 102.

Furthermore, the substrate 102 can include conductive layers of different thicknesses. Accordingly, spiral traces within thicker conductive layers of the substrate 102 can be fabricated with narrower trace widths and more turns, and spiral traces within thinner conductive layers of the substrate 102 can be fabricated with wider trace widths and fewer turns in order to achieve similar electrical resistances within each spiral trace over the same coil footprint. For example, lower conductive layers within the substrate 102 can include heavier layers of conductive material (e.g., one-ounce copper approximately 35 microns in thickness) in order to accommodate narrower trace widths and more turns within the coil footprint in these conductive layers, thereby increasing inductance of each spiral trace and yielding greater magnetic coupling between the multi-layer inductor 150 and the set of magnetic elements during a haptic feedback cycle. Conversely, in this example, the upper layers of the substrate 102—which include many (e.g., thousands of) drive and sense electrode pairs 105 of the touch sensor—can include thinner layers of conductive material.

4.1 Single Core+Even Quantity of Coil Layers

In one implementation shown in FIG. 2, the substrate 102 includes an even quantity of spiral traces fabricated within an even quantity of substrate layers within the substrate 102 to form a single-coil inductor.

In one example, the substrate 102 includes: a top layer 104 and an intermediate layer 106 containing the array of drive and sense electrode pairs 105; a first layer 110; a second layer 120; a third layer 130; and a fourth (e.g., a bottom) layer. In this example, the first layer 110 includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second layer 120 includes a second spiral trace 122 coiled in a second direction opposite the first direction and defining a third end—electrically coupled to the second end of the first spiral trace 111—and a fourth end. In particular, the second spiral trace 122 can define a second planar coil spiraling outwardly in the clockwise direction from the third end proximal the center of the second planar coil to the fourth end at a periphery of the second planar coil.

Similarly, the third layer 130 includes a third spiral trace 133 coiled in the first direction and defining a fifth end—electrically coupled to the fourth end of the second spiral trace 122—and a sixth end. In particular, the third spiral trace 133 can define a third planar coil spiraling inwardly in the clockwise direction from the fifth end at the periphery of the third planar coil to the sixth end proximal a center of the third planar coil. Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 can be coupled to the third end of the second spiral trace 122 by a first via; the fourth end of the second spiral trace 122 can be coupled to the fifth end of the third spiral trace 133 by a second via; the sixth end of the third spiral trace 133 can be coupled to the seventh end of the fourth spiral trace 144 by a third via; and the first, second, third, and fourth spiral traces 111, 122, 133, 144 can cooperate to form a single-core, four-layer inductor. The controller 190 (or a driver):

can be electrically connected to the first end of the first spiral trace 111 and the eighth end of the fourth spiral trace 144 (or "terminals" of the multi-layer inductor 150); and can drive these terminals of the multi-layer inductor 150 with an oscillating voltage during a haptic feedback cycle in order to induce an alternating magnetic field through the multi-layer inductor 150, which couples to the magnetic elements and oscillates the substrate 102 within the chassis 192. In particular, when the controller 190 drives the multi-layer inductor 150 at a first polarity, current can flow in a continuous, clockwise direction through the first, second, third, and fourth spiral traces 111, 122, 133, 144 to induce a magnetic field in a first direction around the multi-layer inductor 150. When the controller 190 reverses the polarity across terminals of the multi-layer inductor 150, current can reverse directions and flow in a continuous, counter-clockwise direction through the first, second, third, and fourth spiral traces 111, 122, 133, 144 to induce a magnetic field in a second, opposite direction at the multi-layer inductor 150.

Furthermore, in this implementation, because the multi-layer inductor 150 spans an even quantity of conductive layers within the substrate 102, the terminals of the multi-layer inductor 150 can be located on the peripheries of the first and last layers of the substrate 102 and thus enable direct connection to the controller 190 (or driver).

4.2 Single Core+Odd Quantity of Coil Layers

In another implementation shown in FIG. 1, the multi-layer inductor 150 spans an odd number of (e.g., 3, 5) conductive layers of the substrate 102. In this implementation, a conductive layer of the substrate 102 can include two parallel and offset spiral traces that cooperate with other spiral traces in the multi-layer inductor 150 to locate the terminals of the multi-layer inductor 150 at the periphery of the multi-layer inductor 150 for direct connection to the controller 190 or driver.

In one example, the substrate 102 includes: a top layer 104 and an intermediate layer 106 containing the array of drive and sense electrode pairs 105; a first layer 110; a second layer 120; a third layer 130; and a fourth (e.g., a bottom) layer. In this example, the first layer 110 includes a ground electrode (e.g., a continuous trace): spanning the footprint of the array of drive and sense electrode pairs 105 in the top and intermediate layers 104, 106; driven to a reference potential by the controller 190; and configured to shield the drive and sense electrode pairs 105 from electrical noise generated by the multi-layer inductor 150.

In this example, the third layer 130 includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second layer 120 includes a second spiral trace 122 coiled in a second direction opposite the first direction and defining a third end—electrically coupled to the second end of the first spiral trace 11 in the third layer 130—and a fourth end. In particular, the second spiral trace 122 can define a second planar coil spiraling outwardly in the clockwise direction from the third end proximal the center of the second planar coil to the fourth end at a periphery of the second planar coil.

The third layer 130 further includes a third spiral trace 133 coiled in the first direction and defining a fifth end—electrically coupled to the fourth end of the second spiral trace 122 in the second layer 120—and a sixth end. In particular, the third spiral trace 133 can define a third planar coil: spiraling inwardly in the clockwise direction from the fifth end at the periphery of the third planar coil to the sixth end proximal a center of the third planar coil; and nested within the first planar coil that also spirals inwardly in the clockwise direction within the third layer 130.

Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 within the third layer 130 can be coupled to the third end of the second spiral trace 122 within the second layer 120 by a first via; the fourth end of the second spiral trace 122 within the second layer 120 can be coupled to the fifth end of the third spiral trace 133 within the third layer 130 by a second via; the sixth end of the third spiral trace 133 within the third layer 130 can be coupled to the seventh end of the fourth spiral trace 144 within the fourth layer by a third via; and the first, second, third, and fourth spiral traces 111, 122, 133, 144 can cooperate to form a single-core, three-layer inductor. The controller 190: can be electrically connected to the first end of the first spiral trace 111 within the third layer 130 and the eight end of the fourth spiral trace 144 within the fourth layer (or "terminals" of the multi-layer inductor 150); and can drive these terminals of the multi-layer inductor 150 with an oscillating voltage during a haptic feedback cycle in order to induce an alternating magnetic field through the multi-layer inductor 150, which couples to the magnetic elements and oscillates the substrate 102 within the chassis 192. In particular, when the controller 190 drives the multi-layer inductor 150 at a first polarity, current can flow in a continuous, clockwise direction through the first, second, third, and fourth spiral traces 111, 122, 133, 144 within the second, third, and fourth layers of the substrate 102 to induce a magnetic field in a first direction around the multi-layer inductor 150. When the controller 190 reverses the polarity across terminals of the multi-layer inductor 150, current can reverse directions and flow in a continuous, counter-clockwise direction through the first, second, third, and fourth spiral traces 111, 122, 133, 144 to induce a magnetic field in a second, opposite direction at the multi-layer inductor 150.

Therefore, in this implementation, the substrate 102 can include an even number of single-coil layers and an odd number of two-coil layers selectively connected to form a multi-layer inductor 150 that includes two terminals located on the periphery of the multi-layer inductor 150.

4.3 Double Core+Even Quantity of Coil Layers

Figure 7:
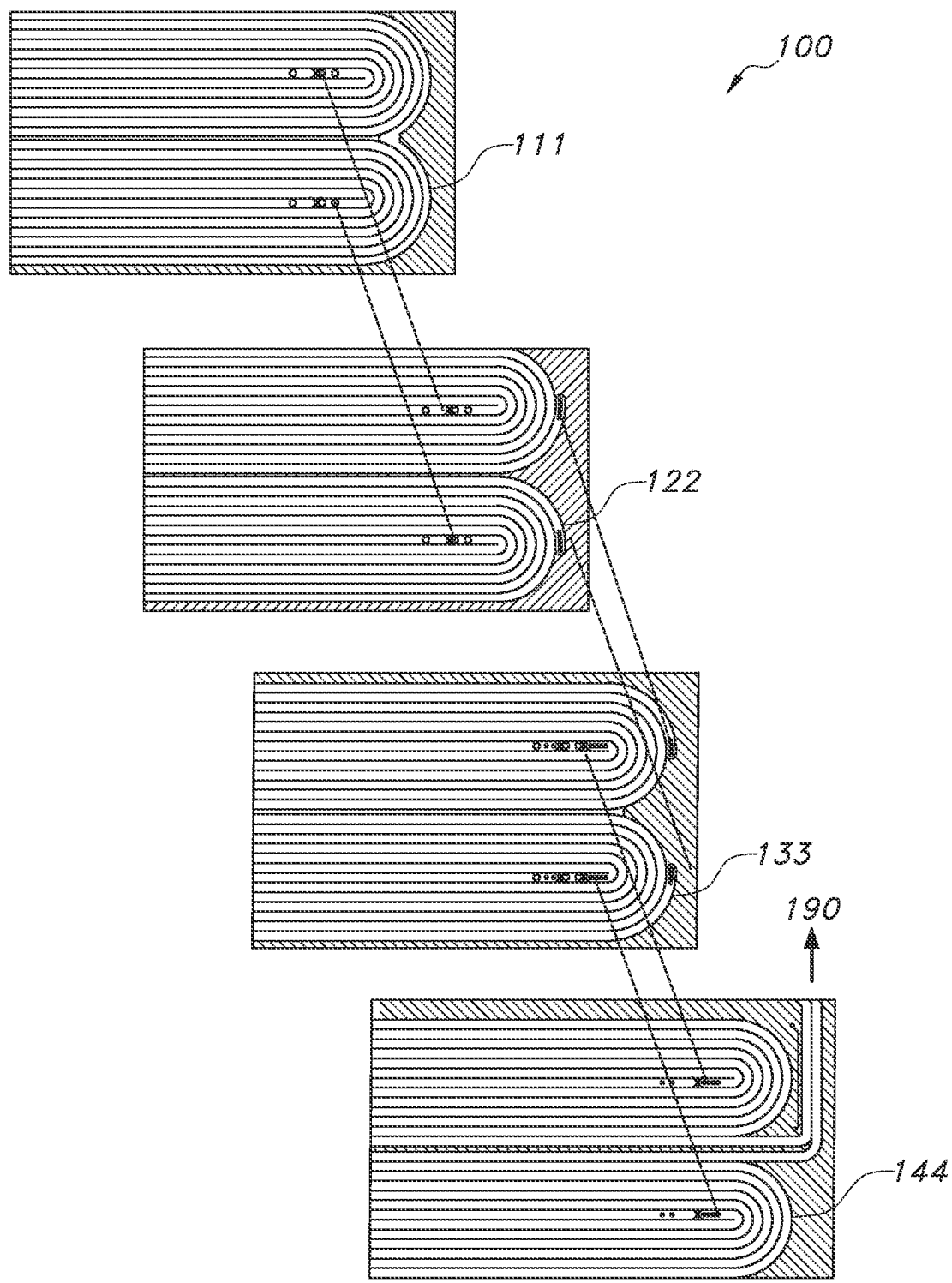
FIG. 7 is a schematic representation of one variation of the system.

In another implementation shown in FIGS. 3 and 7, the substrate 102 includes an even quantity of spiral traces fabricated within an even quantity of substrate layers within the substrate 102 to form a dual-core inductor (that is, two separate single-core inductors connected in series).

In one example, the substrate 102 includes: a top layer 104 and an intermediate layer 106 containing the array of drive and sense electrode pairs 105; a first layer 110; a second layer 120; a third layer 130; and a fourth (e.g., a bottom) layer.

In this example, the first layer no includes a first spiral trace 111 coiled in a first direction and defining a first end and a second end. In particular, the first spiral trace 111 can define a first planar coil spiraling inwardly in a clockwise direction from the first end at the periphery of the first planar coil to the second end proximal a center of the first planar coil. The second layer 120 includes a second spiral trace 122 coiled in a second direction opposite the first direction and defining a third end—electrically coupled to the second end of the first spiral trace 111—and a fourth end. In particular, the second spiral trace 122 can define a second planar coil spiraling outwardly in the clockwise direction from the third end proximal the center of the second planar coil to the fourth end at a periphery of the second planar coil. The third layer 130 includes a third spiral trace 133 coiled in the first direction and defining a fifth end—electrically coupled to the fourth end of the second spiral trace 122—and a sixth end. In particular, the third spiral trace 133 can define a third planar coil spiraling inwardly in the clockwise direction from the fifth end at the periphery of the third planar coil to the sixth end proximal a center of the third planar coil. Furthermore, the fourth layer includes a fourth spiral trace 144 coiled in the second direction and defining a seventh end—electrically coupled to the sixth end of the first spiral trace 111—and an eighth end. In particular, the fourth spiral trace 144 can define a fourth planar coil spiraling outwardly in the clockwise direction from the seventh end proximal the center of the fourth planar coil to the eighth end at a periphery of the fourth planar coil.

Accordingly: the second end of the first spiral trace 111 can be coupled to the third end of the second spiral trace 122 by a first via; the fourth end of the second spiral trace 122 can be coupled to the fifth end of the third spiral trace 133 by a second via; the sixth end of the third spiral trace 133 can be coupled to the seventh end of the fourth spiral trace 144 by a third via; and the first, second, third, and fourth spiral traces 111, 122, 133, 144 can cooperate to form a first single-core, four-layer inductor.

Furthermore, in this example, the first layer no includes a fifth spiral trace adjacent the first spiral trace 111, coiled in the second direction, and defining a ninth end—coupled to the first end of the first planar coil—and a tenth end. In particular, the fifth spiral trace can define a fifth planar coil spiraling inwardly in a clockwise direction from the ninth end at the periphery of the fifth planar coil to the tenth end proximal a center of the fifth planar coil. The second layer 120 includes a sixth spiral trace adjacent the second spiral trace 122, coiled in the first direction, and defining an eleventh end—electrically coupled to the tenth end of the fifth spiral trace—and a twelfth end. In particular, the sixth spiral trace can define a sixth planar coil spiraling outwardly in the clockwise direction from the eleventh end proximal the center of the sixth planar coil to the twelfth end at a periphery of the sixth planar coil. The third layer 130 includes a seventh spiral trace adjacent the third spiral trace 133, coiled in the second direction, and defining a thirteenth end—electrically coupled to the twelfth end of the sixth spiral trace—and a fourteenth end. In particular, the seventh spiral trace can define a seventh planar coil spiraling inwardly in the clockwise direction from the thirteenth end at the periphery of the seventh planar coil to the fourteenth end proximal a center of the seventh planar coil. Furthermore, the fourth layer includes an eighth spiral trace adjacent the fourth spiral trace 144, coiled in the first direction, and defining a fifteenth end—electrically coupled to the fourteenth end of the seventh spiral trace—and a sixteenth end. In particular, the eighth spiral trace can define an eighth planar coil spiraling outwardly in the clockwise direction from the fifteenth end proximal the center of the eighth planar coil to the sixteenth end at a periphery of the eighth planar coil.

Accordingly: the tenth end of the fifth spiral trace can be coupled to the eleventh end of the sixth spiral trace by a fourth via; the twelfth end of the sixth spiral trace can be coupled to the thirteenth end of the seventh spiral trace by a fifth via; the fourteenth end of the seventh spiral trace can be coupled to the fifteenth end of the eighth spiral trace by a sixth via; and the fifth, sixth, seventh, and eighth spiral traces can cooperate to form a second single-core, four-layer inductor.

Furthermore, the first end of the first spiral trace 111 can be coupled to (e.g., form a continuous trace with) the ninth end of the fifth spiral trace within the first conductive layer. The first and second single-core, four-layer inductors can therefore be fabricated in series to form a four-layer, dual-core inductor with the eighth and sixteenth ends of the fourth and eighth spiral traces, respectively, forming the terminals of the four-layer, dual-core inductor. Therefore, when these first and second multi-layer inductors are driven to a first polarity, current can flow in a continuous circular direction through both the first multi-layer inductor such that the first and second multi-layer inductors produce magnetic fields in the same phase and in the same direction.

The controller 190 (or a driver): can be electrically connected to these terminals and can drive these terminals with an oscillating voltage during a haptic feedback cycle in order to induce: a first alternating magnetic field through the first single-core, four-layer inductor (formed by the first, second, third, and fourth spiral traces 111, 122, 133, 144); and a second alternating magnetic field—in phase with the first alternating magnetic field—through the second single-core, four-layer inductor (formed by the fifth, sixth, seventh, and eighth spiral traces). In particular, when the controller 190 drives the four-layer, dual-core inductor at a first polarity, current can flow: in a continuous, clockwise direction through the first, second, third, and fourth spiral traces 111, 122, 133, 144 to induce a magnetic field in a first direction around the first single-core, four-layer inductor; and in a continuous, clockwise direction through the fifth, sixth, seventh, and eighth spiral traces to induce a magnetic field in the first direction around the second single-core, four-layer inductor. When the controller 190 reverses the polarity across terminals of the dual-core, four-layer inductor, current can reverse directions to: flow in a continuous, counter-clockwise direction through the first, second, third, and fourth spiral traces 111, 122, 133, 144 to induce a magnetic field in a second, opposite direction around the first single-core, four-layer inductor; and in a continuous, counter-clockwise direction through the fifth, sixth, seventh, and eighth spiral traces to induce a magnetic field in the second direction around the second single-core, four-layer inductor.

4.4 Double Core+Odd Quantity of Coil Layers

In a similar implementation, the substrate 102 includes an odd quantity of spiral traces fabricated within an odd quantity of substrate layers within the substrate 102 to form a dual-core inductor.

For example, in this implementation, the dual-core inductor can include two single-coil, three-layer inductors connected in series. In this example, each single-coil, three-layer inductors includes: an even number of single-coil layers; and an odd number of two-coil layers selectively connected to form a single-coil, three-layer inductor that includes two terminals located on the periphery of the single-coil, three-layer inductor, as described above.

5. Magnetic Element

Generally, the system 100 includes a set of magnetic elements: rigidly coupled to the chassis 192 beneath the multi-layer inductor 150; and configured to magnetically couple to the multi-layer inductor 150 during a haptic feedback cycle, thereby applying an oscillating force to the multi-layer inductor 150 and oscillating the substrate 102— and therefore the touch sensor surface 172—within the receptacle 194 during this haptic feedback cycle.

In particular, the spiral traces within the multi-layer inductor 150 can span a coil footprint, such as a rectangular or ellipsoidal footprint including: long sides parallel to a primary axis of the multi-layer inductor 150; and short sides parallel to a secondary axis of the multi-layer inductor 150. For example: the substrate 102 can be 5 inches in width and 3 inches in length; the touch sensor surface 172 can span an area approximately 5 inches by 3 inches over the substrate 102; and the coil footprint of each single-core multi-layer inductor 150 within the substrate 102 can be approximately 1.5 inches in length and 0.5 inches in width with the primary axis of the single-core multi-layer inductor 150 extending laterally across the width of the substrate 102.

5.1 Horizontal Oscillation: Single-Core Multi-Layer Inductor

Figure 4A:
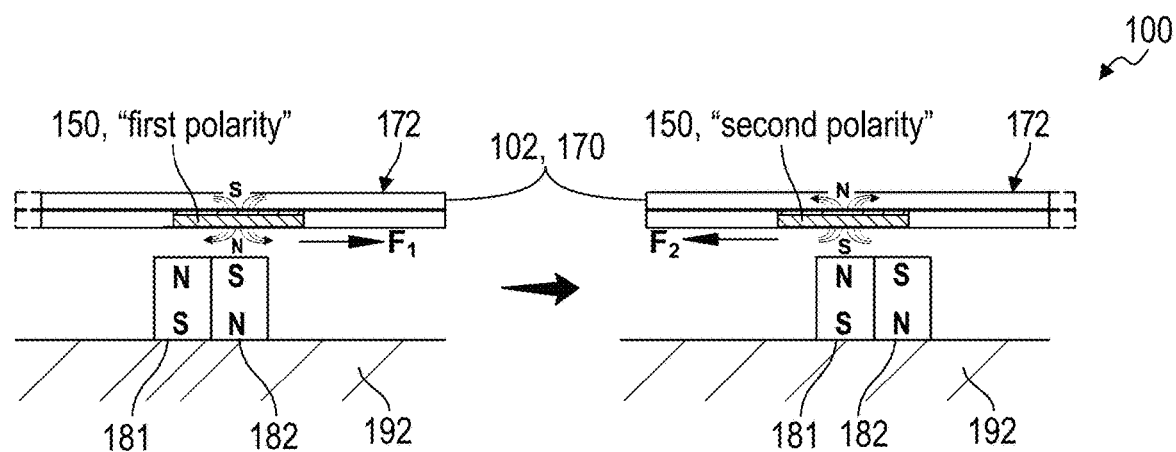
FIGS. 4A and 4B are flowchart representations of variations of the system.

In one implementation, the set of magnetic elements are arranged relative to the multi-layer inductor 150 in order to induce an oscillating force—between the multi-layer inductor 150 and the magnetic elements—parallel to the touch sensor surface 172 such that the substrate 102 oscillates horizontally in a plane parallel to the touch sensor surface 172 during a haptic feedback cycle, as shown in FIGS. 2 and 4A.

In this implementation, the system 100 can include a first magnetic element 181: arranged in a receptacle 194 defined by the chassis 192 of the device; defining a first magnetic polarity facing the multi-layer inductor 150; and extending along a first side of the primary axis. In this implementation, the system 100 can similarly include a second magnetic element 182: arranged in the receptacle 194; defining a second magnetic polarity facing the multi-layer inductor 150; and extending along a second side of the primary axis adjacent the first magnetic element 181. In particular, the first magnetic element 181 can be arranged immediately adjacent and the second magnetic element. The first and second magnetic elements 181, 182 can be arranged directly under the multi-layer inductor 150 and can face the multi-layer inductor 150 with opposing polarities, as shown in FIG. 4A. When the controller 190 drives the multi-layer inductor 150 with an alternating voltage (or current), the multi-layer inductor 150 can generate a magnetic field that extends vertically through the substrate 102 (e.g., normal to the touch sensor surface 172) and interacts with the opposing magnetic fields of the first and second magnetic elements 181, 182. More specifically, when the controller 190 drives the multi-layer inductor 150 to a positive voltage during a haptic feedback cycle, the multi-layer inductor 150 can generate a magnetic field that extends vertically through the substrate 102 in a first vertical direction, which: attracts the first magnetic element 181 (arranged with the first polarity facing the multi-layer inductor 150); repels the second magnetic element 182 (arranged with the second polarity facing the multi-layer inductor 150); yields a first lateral force a first lateral direction; and shifts the substrate 102 laterally in the first lateral direction. When the controller 190 then reverses the voltage across the multi-layer inductor 150 during this haptic feedback cycle, the multi-layer inductor 150 can generate a magnetic field that extends vertically through the substrate 102 in the opposing vertical direction, which: repels the first magnetic element 181; attracts the second magnetic element 182; yields a second lateral force an second, opposite lateral direction; and shifts the substrate 102 laterally in the second lateral direction.

Therefore, by oscillating the polarity of the multi-layer inductor 150, the controller 190 can: induce oscillating interactions (i.e., alternating attractive and repelling forces)—parallel to the touch sensor surface 172—between the multi-layer inductor 150 and the magnetic elements; and thus oscillate the substrate 102 and touch sensor surface 172 horizontally (e.g., within a plane parallel to the touch sensor surface 172).

Therefore, in this implementation, the spiral traces of the single-core multi-layer inductor 150 can define: a first length (e.g., 1.5 inches) along the primary axis of the multi-layer inductor 150; and a first width (e.g., 0.5 inch)—less than first length—along the secondary axis of the multi-layer inductor 150. Furthermore, the first magnetic element 181 can define: a length parallel to and offset from the primary axis and approximating the first length of the spiral traces; and a second width parallel to the secondary axis of the multi-layer inductor 150 and approximately half of the first width of the spiral traces. The second magnetic element 182 can similarly define: a length parallel to and offset from the primary axis and approximating the first length of the spiral traces; and a width parallel to the secondary axis of the multi-layer inductor 150 and approximately half of the first width of the spiral traces. The first and second magnetic elements 181, 182 can be abutted and arranged on each side of the primary axis of the multi-layer inductor 150.

For example, the set of magnetic elements can include a permanent dipole magnet arranged in the receptacle 194 of the device and centered under the multi-layer inductor 150 such that the two poles of the set of magnetic elements are located on opposite sides of the primary axis of the multi-layer inductor 150. As described above, the set of magnetic elements can also include a set of permanent dipole magnets arranged in an antipolar configuration (e.g., a Halbach array).

The controller 190 (or the driver) can therefore polarize the multi-layer inductor 150 by applying an alternating voltage across the first and second terminals of the multi-layer inductor 150, thereby inducing an alternating current through the set of spiral traces, inducing an alternating magnetic field normal to the touch sensor surface, inducing oscillating magnetic coupling between the multi-layer inductor 150 and the set of magnetic elements, and thus vibrating the substrate 102 in a plane parallel to the touch sensor surface 172 during a haptic feedback cycle.

5.2 Horizontal Oscillation: Dual-Core Multi-Layer Inductor

Similarly, in the implementation described above in which the substrate 102 includes two adjacent single-core, multi-layer inductors 150 connected in series, the system 100 can include: a first magnetic element 181 arranged in the receptacle 194, defining a first magnetic polarity facing the first single-core multi-layer inductor 150, and extending along a first side of a first primary axis of the first single-core multi-layer inductor 150; a second magnetic element 182 arranged in the receptacle 194, defining a second magnetic polarity facing the first single-core multi-layer inductor 150, and extending along a second side of the first primary axis adjacent the first magnetic element 181; a third magnetic element arranged in the receptacle 194, defining the second magnetic polarity facing the second single-core multi-layer inductor 150, and extending along a first side of a second primary axis of the second single-core multi-layer inductor 150; and a fourth magnetic element arranged in the receptacle 194, defining the first magnetic polarity facing the second single-core multi-layer inductor 150, and extending along a second side of the second primary axis adjacent the third magnetic element, as shown in FIG. 6.

Accordingly, by oscillating the polarity of the first and second single-core multi-layer inductors 150—which include traces that spiral in the same direction and are therefore in phase—the controller 190 can: induce oscillating interactions parallel to the touch sensor surface 172 between the first single-core multi-layer inductor 150, the first magnetic element 181, and the second magnetic element 182 and between the second single-core multi-layer inductor 150, the third magnetic element, and the fourth magnetic element; and thus oscillate the substrate 102 and touch sensor surface 172 horizontally (e.g., within a plane parallel to the touch sensor surface 172).

5.3 Vertical Oscillation

Figure 4B:
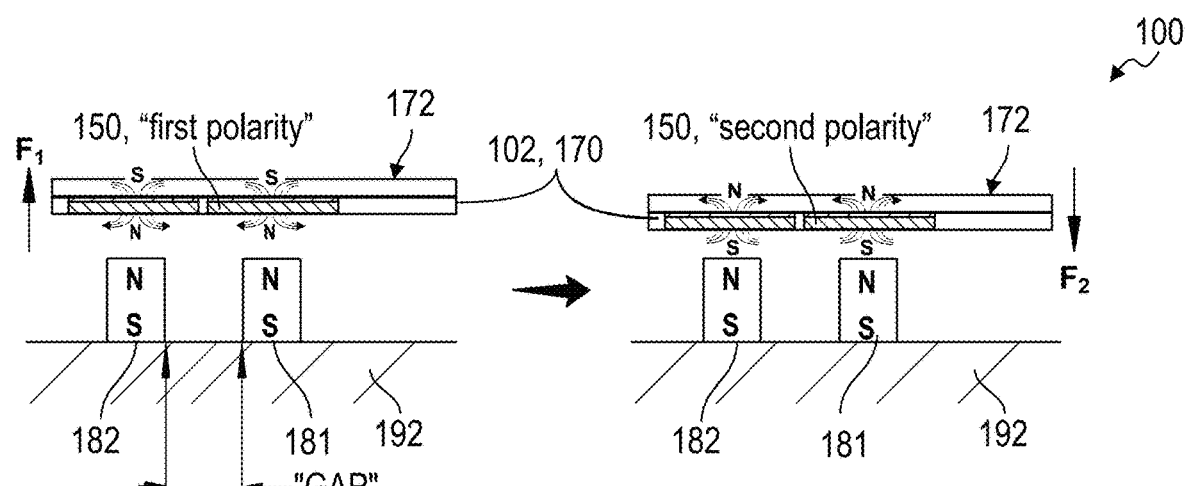
Figure 5A:
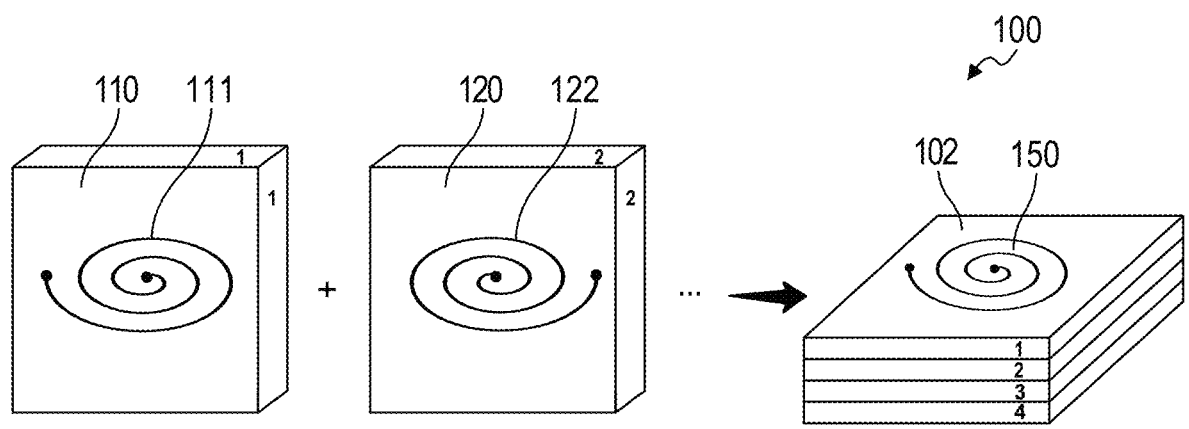
FIGS. 5A and 5B are flowchart representations of one variation of the system.
Figure 5B:
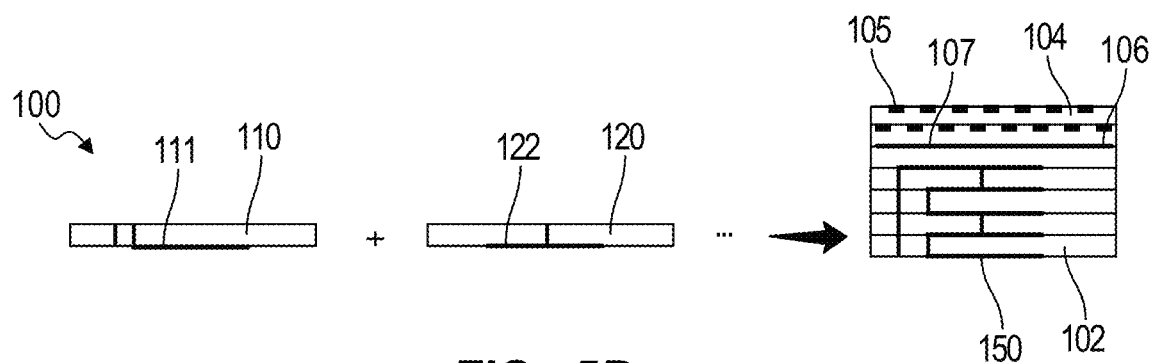

In another implementation, the set of magnetic elements are arranged relative to the multi-layer inductor 150 in order to induce an oscillating force—between the multi-layer inductor 150 and the magnetic elements—normal to the touch sensor surface 172 such that the substrate 102 oscillates vertically within the chassis 192 during a haptic feedback cycle, as shown in FIGS. 1 and 4B.

In the implementation described above in which the substrate 102 includes a single-core multi-layer inductor 150, the system 100 can include a first magnetic element 181: arranged in the receptacle 194 of the chassis 192; defining a first magnetic polarity facing the single-core multi-layer inductor 150; approximately centered under the multi-layer inductor 150; and extending laterally across the primary axis of the multi-layer inductor 150. The first magnetic element 181 can thus generate a magnetic field that extends predominantly vertically toward the multi-layer inductor 150 and that is approximately centered under the multi-layer inductor 150. More specifically, the first magnetic element 181 can generate a magnetic field that extends predominately normal to the touch sensor surface 172 proximal the center of the multi-layer inductor 150. As shown in FIG. 4B, when the controller 190 drives the multi-layer inductor 150 to a positive voltage during a haptic feedback cycle, the multi-layer inductor 150 can generate a magnetic field that extends vertically through the substrate 102 in a first vertical direction, which: repels the first magnetic element 181 (arranged with the first polarity facing the multi-layer inductor 150); yields a first vertical force in a first vertical direction; and lifts the substrate 102 vertically off of the first magnetic element 181. When the controller 190 then reverses the voltage across the multi-layer inductor 150 during this haptic feedback cycle, the multi-layer inductor 150 can generate a magnetic field that extends vertically through the substrate 102 in a second, opposite vertical direction, which: attracts the first magnetic element 181; yields a second vertical force in a second, opposite vertical direction; and draws the substrate 102 downward and back toward the first magnetic element 181.

Therefore, by oscillating the polarity of the multi-layer inductor 150, the controller 190 can: induce oscillating interactions (i.e., alternating attractive and repelling forces)—normal to the touch sensor surface 172—between the multi-layer inductor 150 and the first magnetic element 181; and thus oscillate the substrate 102 and touch sensor surface 172 vertically (e.g., normal to the touch sensor surface 172).

Furthermore, the system 100 can be reconfigured for vertical and horizontal oscillations of the touch sensor surface 172 by exchanging: a single magnetic element that spans the full width of and is centered under the multi-layer inductor 150; for a pair of opposing magnetic elements arranged under the multi-layer inductor 150 and on each of the primary axis of the multi-layer inductor 150 with no or minimal other modifications to the system 100, as shown in FIG. 6.

5.4 Vertical Oscillation: Dual-Core Multi-Layer Inductor

Similarly, in the implementation described above in which the substrate 102 includes two adjacent single-core, multi-layer inductors 150 connected in series and in phase (i.e., phased by 0°), the system 100 can include a first magnetic element 181: arranged in the receptacle 194; defining a first magnetic polarity facing the first single-core multi-layer inductor 150; approximately centered under the first single-core multi-layer inductor 150; and extending laterally across the primary axis of the first single-core multi-layer inductor 150. The system 100 can similarly include a second magnetic element 182: arranged in the receptacle 194 adjacent the first magnetic element 181; defining the first magnetic polarity facing the second single-core multi-layer inductor 150; approximately centered under the second single-core multi-layer inductor 150; and extending laterally across the primary axis of the second single-core multi-layer inductor 150, as shown in FIGS. 3 and 4B.

Accordingly, by oscillating the polarity of the first and second single-core multi-layer inductors 150—which are in phase—the controller 190 can: induce oscillating interactions normal to the touch sensor surface 172 between the first single-core multi-layer inductor 150 and the first magnetic element 181 and between the second single-core multi-layer inductor 150 and the second magnetic element 182; and thus oscillate the substrate 102 and touch sensor surface 172 vertically (e.g., normal to the touch sensor surface 172).

6. Chassis Integration

As described above, the substrate 102 is flexibly mounted to the chassis 192 (e.g., within or over a receptacle 194 defined by the chassis 192) to enable the substrate 102 to oscillate horizontally or vertically relative to the chassis 192 during a haptic feedback cycle.

6.1 Deflection Spacers

Figure 8:
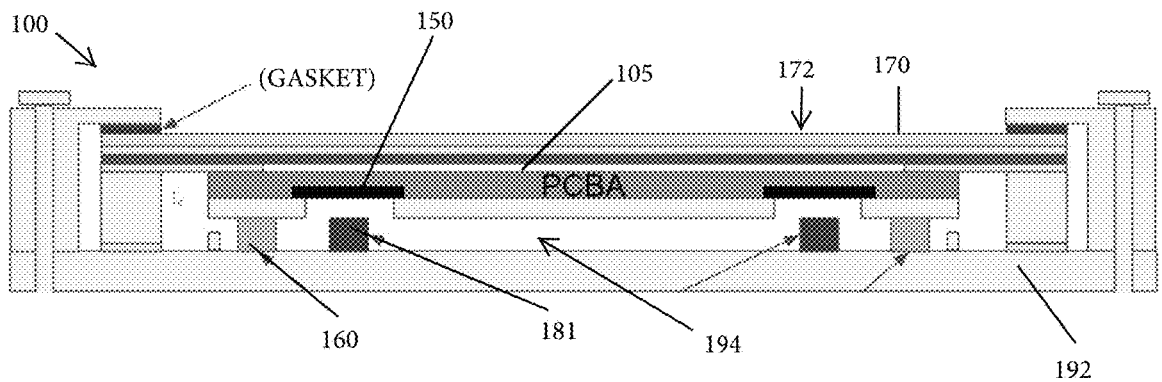
FIG. 8 is a schematic representation of one variation of the system.
Figure 10A:
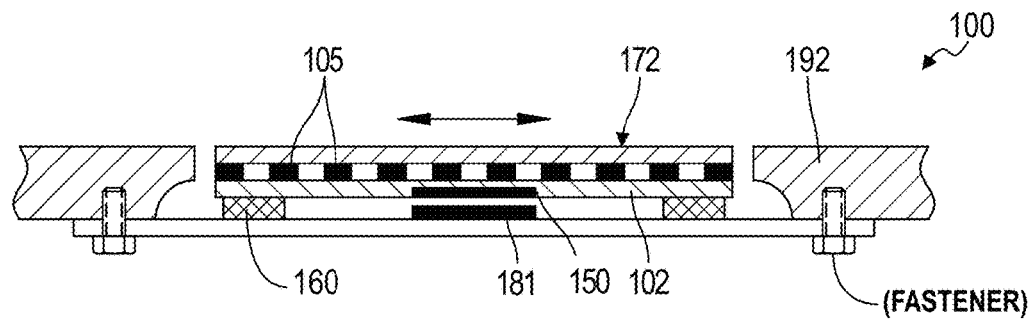
FIGS. 10A and 10B are schematic representations of one variation of the system.

In one configuration shown in FIGS. 2, 8, and 10A and as described in U.S. patent application Ser. No. 17/191,631, which is incorporated in its entirety by this reference: the top layer 104 of the substrate 102 includes an array of drive and sense electrode pairs 105 arranged in a grid array, at a first density, and in a mutual capacitance configuration; and a bottom layer 140 of the substrate 102 includes a second set of sensor traces 146 (e.g., a sparse perimeter array of interdigitated drive and sense electrode pairs 105) located proximal a perimeter of the substrate 102 at a second density less than the first density. In this implementation, the system 100 further includes a set of deflection spacers 160 (e.g., short elastic columns or buttons, adhesive films) coupled to the bottom layer 140 of the substrate 102 over each sensor trace and configured to support the substrate 102 on the chassis 192 of the device. In particular, each deflection spacer 160 can include a force-sensitive layer 174: arranged across a sensor trace in the second set of sensor traces 146; and exhibiting changes in contact resistance across the sensor trace responsive to a load on the touch sensor surface 172 that compresses the deflection space against the substrate 102.

Accordingly, in this implementation, the controller 190 can: read a first set of electrical values—representing capacitive coupling between drive and sense electrode pairs 105—from the set of drive and sense electrode pairs 105; and detect a first input at a first location on the touch sensor surface 172 based on deviation of electrical values—read from a subset of drive and sense electrode pairs 105 adjacent the first location—from baseline capacitance values stored for this subset of drive and sense electrode pairs 105. During this same scan cycle, the controller 190 can also: read a second set of electrical values (e.g., electrical resistances)—representing compression of the set of deflection spacers 160 against the second set of sensor traces 146—from the second set of sensor traces 146; interpret a force magnitude of the first input based on magnitudes of deviations of electrical (e.g., resistance) values from baseline electrical values across the set of sensor traces 146; and drive an oscillating voltage across the multi-layer inductor 150 during a haptic feedback cycle in response to the force magnitude of the first input exceeding a threshold input force.

Generally, in this configuration, the set of deflection spacers 160: are interposed between the bottom layer 140 of the substrate 102 and the base of the receptacle 194; and vertically support the substrate 102 within the receptacle 194.

In one implementation, each deflection spacer 160 includes a coupon: bonded to the bottom face of the substrate 102 and to the base of the receptacle 194; and formed in a low-durometer or elastic material that deflects laterally (or "shears") to enable the substrate 102 to translate laterally within the receptacle 194 responsive to alternating magnetic coupling between the multi-layer inductor 150 and the set of magnetic elements during a haptic feedback cycle. In another implementation, each deflection spacer 160 includes: a coupon bonded to the bottom face of the substrate 102; and a bottom face coated or including a low-friction material configured to slide across the base of the receptacle 194 to enable the substrate 102 to translate laterally in the receptacle 194 during a haptic feedback cycle while also vertically supporting the substrate 102 over the receptacle 194. In yet another implementation and as described below, each deflection spacer 160 is mounted to a spring or flexure element—which is mounted to the chassis 192—that enables the deflection spacer 160 to move laterally within the receptacle 194 while vertically supporting the substrate 102 within the receptacle 194.

In this configuration, the bottom conductive layer of the substrate 102 can include a pair of interdigitated drive and sense electrodes in each deflection spacer location about the perimeter of the substrate 102, as shown in FIG. 2. Furthermore, each deflection spacer 160 can include a layer of force-sensitive material—such as described above—facing the pair of interdigitated drive and sense electrodes at this deflection spacer location on the substrate 102. The controller 190 can thus: read an electrical resistance (or a voltage representing electrical resistance) across a pair of sensor traces 146 at a deflection spacer location; and transform this resistance into a force magnitude carried from the touch sensor surface 172, into the substrate 102, and into the adjacent the deflection spacer 160. In particular, the system 100 can include multiple deflection spacers 160, and the controller 190 can: read electrical values from sensor traces 146 at each deflection spacer location; convert these electrical values into force magnitudes carried by each deflection spacer 160; and aggregate these force magnitudes into a total force magnitude of an input on the touch sensor surface 172.

Therefore, in this configuration, the substrate 102 can define a unitary structure including a dense array of drive and sense electrode pairs 105 that form a touch sensor, a column of spiral traces that form a multi-layer inductor 150, and a sparse array of drive and sense electrode pairs 105 that form a set of force sensors that support the substrate 102 on the chassis 192.

6.1.1 Capacitive Deflection Spacer

Alternatively, the bottom layer 140 of the substrate 102 can include a sparse array of sensor traces 146 (e.g., interdigitated drive and sense electrode pairs 105) arranged in a capacitive sensing configuration at each deflection spacer location such that each of these sensor traces 146 capacitively couples: to the chassis 192; to the adjacent deflection spacer 160; to a spring element 162 supporting the substrate 102 at this deflection spacer location; or to another fixed metallic element at this deflection spacer location. Accordingly, during a scan cycle, the controller 190 can: read capacitance values from the sensor traces 146 at these deflection spacer locations; convert these capacitance values into force magnitudes carried by each deflection spacer 160 during the scan cycle; and aggregate these force magnitudes into a total force magnitude of an input on the touch sensor surface 172.

6.1.2 Inductor Integration with Deflection Spacers

Furthermore, in this configuration, the multi-layer inductor 150 can be integrated into a region of the substrate 102 offset from the deflection spacer 160 locations (i.e., inset from regions of the substrate 102 occupied by sensor traces 146 in these deflection spacer locations). For example, the array of deflection spacers 160 can be located proximal a perimeter of the substrate 102, and the spiral traces that form the multi-layer inductor 150 can be arranged near a lateral and longitudinal center of the substrate 102 in order to limit injection of electrical noise from the multi-layer inductor 150 into sensor traces 146 in these deflection spacers 160 during a haptic feedback cycle, as shown in FIG. 2.

6.2 Spring-Loaded Chassis Interface

Figure 22:
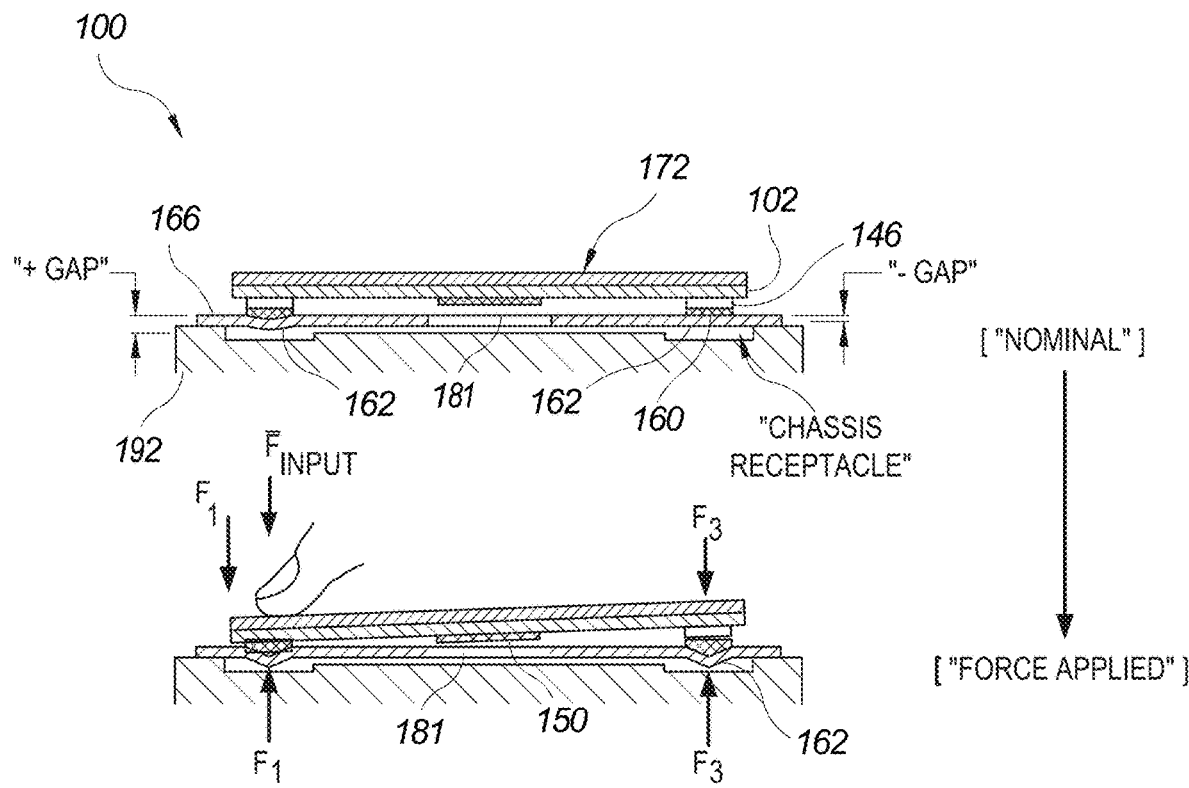
FIG. 22 is a flowchart representation of one variation of the system.

Additionally or alternatively as shown in FIGS. 2, 3, and 22 and as described in U.S. patent application Ser. No. 17/191,631, the system 100 can include a chassis interface 166: configured to mount to the chassis 192 of the device; and defining a set of spring elements 162 coupled to the substrate 102 (e.g., via a set of deflection spacers 160) and configured to deflect out of the plane of the chassis interface 166 responsive to an input on the touch sensor surface 172 and/or responsive to actuation of the multi-layer inductor 150 during a haptic feedback cycle.

In this implementation, the chassis 192 of the computing device can include a chassis receptacle 194 defining a depth approximating (or slightly more than) the thickness of a set of deflection spacers 160 (e.g., 1.2-millimeter chassis receptacle 194 depth for 1.0-millimeter-thick deflection spacers 160). The deflection spacers 160 are bonded to the chassis interface 166 at each spring element 162. The chassis interface 166 can then be rigidly mounted to the chassis 192 over the receptacle 194, such as via a set of threaded fasteners or an adhesive. The substrate 102 and the set of deflection spacers 160 may thus transfer a force—applied to the touch sensor surface 172—into these spring elements 162, which deflect inwardly below a plane of the chassis interface 166 and into the chassis receptacle 194.

(In the configuration described above in which the substrate 102 includes sensors traces at these deflection spacer locations, each spacer is also compressed between the substrate 102 and the adjacent spring element 162 when a force is applied to the touch sensor surface 172 and therefore exhibits a change in its local contact resistance across the adjacent sensor trace proportional to the force carried into the adjacent spring element 162. The controller 190 can therefore read electrical values (e.g., a resistances) across these sensor traces 146 and convert these electrical values into portion of the input force carried by each sensor trace.)

In one implementation, the chassis interface 166 and spring elements 162 define a unitary structure. In one example, the chassis interface 166 includes a thin-walled structure (e.g., a stainless steel 20-gage, or 0.8-millimeter-thick sheet) that is punched, etched, or laser-cut to form a flexure aligned to each deflection spacer location. Thus, in this example, each spring element 162 can define a flexure—such as a multi-arm spiral flexure—configured to laterally and longitudinally locate the system 100 over the chassis 192 and configured to deflect inwardly and outwardly from a nominal plane defined by the thin-walled structure. More specifically, in this example, the chassis interface 166 can include a unitary metallic sheet structure arranged between the substrate 102 and the chassis 192 and defining a nominal plane. Each spring element 162: can be formed (e.g., fabricated) in the unitary metallic structure; can define a stage coupled to a spacer opposite the bottom layer 140 of the substrate 102; can include a flexure fabricated in the unitary metallic structure; and can be configured to return to approximately the nominal plane in response to absence of a touch input applied to the touch sensor surface 172.

Furthermore, in this implementation, the magnetic elements can be arranged in the receptacle 194, and the spring elements 162 can locate the bottom layer 140 of the substrate 102 at a nominal gap (e.g., one millimeter) above the magnetic elements. However, application of an input on the touch sensor surface 172 can compress the spring elements 162, thereby closing this gap and bringing the multi-layer inductor 150 closer to the magnetic element, which may increase magnetic coupling between the multi-layer inductor 150 and the magnetic elements, increasing a peak-to-peak force between the multi-layer inductor 150 and the magnetic elements, and increasing the oscillation amplitude of the substrate 102 during a haptic feedback cycle, as shown in FIG. 22. Therefore, the spring elements 162 can compress during application of an input on the touch sensor surface 172, thereby a) closing a gap between the multi-layer inductor 150 and the magnetic elements and b) increasing the oscillation amplitude of the substrate 102 during a haptic feedback cycle—responsive to this input—proportional to the force magnitude of this input.

Accordingly, a low-force input on the touch sensor surface 172 may minimally compress the springs elements, minimally reduce the gap between the multi-layer inductor 150 and the magnetic elements, and thus yield low-amplitude oscillations during a haptic feedback cycle responsive to this low-force input. Conversely, a high-force input on the touch sensor surface 172 may compress the spring elements by a larger distance, significantly reduce the gap between the multi-layer inductor 150 and the magnetic elements, and thus yield higher-amplitude oscillations during a haptic feedback cycle responsive to this high-force input.

Therefore, in this configuration, the system 100 can include a set of spring elements 162: supporting the substrate 102 within the receptacle 194 with the multi-layer inductor 150 located over the first magnetic element 181 and the second magnetic element 182; and biasing the substrate 102 within the receptacle 194 to locate the multi-layer inductor 150 at a nominal offset distance above the first magnetic element 181 and the second magnetic element 182. In particular, the spring elements 162 can compress responsive to application of an input on the touch sensor surface 172 to: locate the multi-layer inductor 150 at a second offset distance, less than the nominal offset distance, above the first magnetic element 181 and the second magnetic element 182; and increase magnetic coupling between the multi-layer inductor 150, the first magnetic element 181, and the second magnetic element 182 during the haptic feedback cycle.

For example, the set of spring elements 162 can bias the substrate 102 within the receptacle 194 to locate the multi-layer inductor 150 (or the bottom spiral trace of the multi-layer inductor 150 in the bottom layer 140 of the substrate 102) at a nominal offset distance—between 400 and 600 microns—above the magnetic elements. The spring elements 162 can also cooperate to yield a spring constant between 800 and 1200 grams per millimeter across the touch sensor surface 172. Therefore, application of force greater than approximately 500 grams to the touch sensor surface 172 can fully compress the set of spring elements 162. However, the system 100 can also exhibit increasing oscillation amplitudes of the substrate 102 during haptic feedback cycles as a function of magnitude of applied force on the touch sensor surface 172, such as from a minimum threshold force of 5 grams up to the maximum force of 500 grams.

(In similar implementations shown in FIGS. 11A, 11B, 11C, and 11D, the substrate 102 can be mounted to the chassis 192 via a set of flexible grommets that are compliant in vertical and/or horizontal directions to enable the substrate 102 to oscillation within the receptacle 194 during a haptic feedback cycle.)

6.3 Spring Elements and Chassis Interface

In a similar variations shown in FIGS. 20 and 21, the system includes a set of deflection spacers 160, wherein each deflection spacer in the set is arranged over a discrete deflection spacer location—in a set of discrete deflection spacer locations—on a bottom surface (e.g., the bottom layer) of the substrate below. The system can further include an array of spring elements 162: that couple the set of deflection spacers 160 to the chassis of the computing device; supporting the substrate on the chassis; and configured to yield to oscillation of the substrate (e.g., vertically or horizontally) responsive to an oscillating voltage driven across the multi-layer inductor by the controller 190 during a haptic feedback cycle.

In one implementation shown in FIG. 20, the system includes chassis interface 166 defining a unitary metallic structure: arranged between the substrate and the chassis; that defines an aperture below the multi-layer inductor; and that comprises a set of flexures arrange about the aperture and defining the array of spring elements 162 (e.g., flexures). In this implementation, the system can also include a magnetic yoke 184 arranged in the aperture of the unitary metallic structure; and the first magnetic element and the second magnetic element can be arranged on the magnetic yoke below the multi-layer inductor. Accordingly, the magnetic yoke 184 can limit a permeability path for magnetic field lines between the rear faces of the first and second magnetic elements opposite the substrate.

6.3.1 Chassis Interface

More specifically, in this variation, the system 100 can include an array of spring elements 162: coupled to the set of deflection spacers 160 at the array of support locations; configured to support the substrate 102 on a chassis of a computing device; and configured to yield to displacement of the substrate 102 downward toward the chassis responsive to forces applied to the touch sensor surface 172.

In one implementation, the system 100 includes a chassis interface 166: configured to mount to the chassis of a computer system; and defining a set of spring elements 162 supported by each spacer 160 and configured to deflect out of the plane of the chassis interface 166 responsive to an input on the touch sensor surface 172.

In this implementation, the chassis of the computing device can include a chassis receptacle defining a depth approximating (or slightly more than) the thickness of the deflection spacers 160 (e.g., 1.2-millimeter depth for 1.0-millimeter-thick spacers 160). The deflection spacers 160 are bonded to the chassis interface 166 at each spring element 162. The chassis interface 166 can then be rigidly mounted to the chassis over the receptacle, such as via a set of threaded fasteners or an adhesive. The substrate 102 and the set of deflection spacers 160 may thus transfer a force—applied to the touch sensor surface 172—into these spring elements 162, which deflect inwardly below a plane of the chassis interface 166 and into the chassis receptacle. Concurrently, each spacer 160 is compressed between the substrate 102 and the adjacent spring element 162 and therefore exhibits a change in its local bulk resistance proportional to the force carried by this adjacent spring element 162.

6.3.2 Unitary Spring Elements and Chassis Interface Structure

In one implementation, the chassis interface 166 and spring elements 162 define a unitary structure (e.g., a "spring plate"). In one example, the chassis interface 166 includes a thin-walled structure (e.g., a stainless steel 20-gage, or 0.8-millimeter-thick sheet) that is punched, etched, or laser-cut to form a flexure aligned to each support location. Thus, in this example, each spring element 162 can define a flexure—such as a multi-arm spiral flexure—configured to laterally and longitudinally locate the system 100 over the chassis and configured to deflect inwardly and outwardly from a nominal plane defined by the thin-walled structure.

More specifically, in this example, the chassis interface 166 can include a unitary metallic sheet structure arranged between the substrate 102 and the chassis and defining a nominal plane. Each spring element 162: can be formed (e.g., fabricated) in the unitary metallic structure; can include a flexure fabricated in the unitary metallic structure; and can be configured to return to approximately the nominal plane in response to absence of a touch input applied to the touch sensor surface 172.

6.3.3 Spring Element Locations

In one implementation, the substrate 102 defines a rectangular geometry with support locations proximal the perimeter of this rectangular geometry. Accordingly, the deflection spacers 160 and the array of spring elements 162 can cooperate to support the perimeter of the substrate 102 against the chassis of the computing device.

In this implementation, the substrate 102 and the cover layer can cooperate to form a semi-rigid structure that resists deflection between support locations. For example, with the perimeter of the substrate 102 supported by the array of spring elements 162, the substrate 102 and the cover layer can exhibit less than 0.3 millimeter of deflection out of a nominal plane when a force of ~1.6 Newtons (i.e., 165 grams, equal to an "click" input force threshold) is applied to the center of the touch sensor surface 172. The substrate 102 and the cover layer can therefore cooperate to communicate this applied force to the perimeter of the substrate 102 and thus into the deflection spacers 160 and spring elements 162 below.

In this implementation, inclusion of a spring element 162 supporting the center of the substrate 102 may produce: a relatively high ratio of applied force to vertical displacement of the substrate 102 near both the center and the perimeter of the substrate 102; and a relatively low ratio of applied force to vertical displacement of the substrate 102 in an intermediate region around the center and inset from the perimeter of the substrate 102. Therefore, to avoid such non-linear changes in ratio of applied force to vertical displacement of the substrate 102—which may cause confusion or discomfort for a user interfacing with the system 100—the system 100 can: include spring elements 162 that support the perimeter of the substrate 102; exclude spring elements 162 supporting the substrate 102 proximal its center; and include a substrate 102 and a cover layer that form a substantially rigid structure.

More specifically, the array of spring elements 162 can support the perimeter of the substrate 102, and the substrate 102 and the cover layer can form a substantially rigid structure in order to achieve a ratio of applied force to vertical displacement of the substrate 102 that is approximately consistent or that changes linearly across the total area of the touch sensor surface 172.

6.3.4 Resistive Force Sensor

In this variation and as described above, the substrate can include a bottom layer: arranged below the second layer opposite the first layer; and comprising a set of sensor traces arranged at the set of discrete deflection spacer locations. Each deflection spacer in the set of deflection spacers 160 can include a force-sensitive material exhibiting variations in local contact resistance responsive to variations in applied force.

More specifically, in this variation, the array of spring elements 162 can include a unitary metallic structure arranged between the substrate and the chassis and defining a nominal plane. Each spring element: can be formed in the unitary metallic structure; can define a stage coupled to a deflection spacer, in the set of deflection spacers 160, opposite the bottom layer of the substrate; and can be configured to return toward the nominal plane in response to absence of inputs applied to the touch sensor surface. Each deflection spacer can electrically couple an adjacent sensor trace—in the set of sensor traces on the bottom layer of the substrate—with a resistance that varies according to magnitude of forces applied to the touch sensor surface and carried into the deflection spacer.

Accordingly, the controller 190 can: read resistance values from the set of sensor traces; interpret a force magnitude of the input applied to the touch sensor surface based on resistance values read from the set of sensor traces; and drive the oscillating voltage across the multi-layer inductor during the haptic feedback cycle in response to the force magnitude of the input exceeding a threshold force.

For example, a first spring element—in the array of spring elements 162—can yield to an input applied to a first region of the touch sensor surface proximal the first spring element at a first time. A first deflection spacer—in the set of deflection spacers 160—can then: compress between the first spring element and a first support location, in the array of support locations, on the bottom layer of the substrate; and exhibit a decrease in local contact resistance proportional to a force magnitude of the input. Accordingly, the controller 190 can: detect a first change in resistance value across a first sensor trace, adjacent the first deflection spacer, at the first time; and interpret the force magnitude of the input, partially carried by the first spring element, based on the first change in resistance value.

6.3.4.1 Capacitive Touch+Resistive Force

More specifically, in the variation of the system 100 described above that incudes an array of drive electrodes and sense electrodes that form a capacitive touch sensor across the top layer of the substrate 102, the controller 190 can: read capacitance values from the capacitive touch sensor and resistance values from the set of pressure sensors during a scan cycle; and fuse these data into a location and force magnitude of a touch input on the touch sensor surface 172 during this scan cycle.

For example, during a scan cycle, the controller 190 can: read a set of capacitance values (e.g., change in capacitance charge times, discharge times, or RC-circuit resonant frequencies) between drive electrodes and sense electrodes in the capacitive touch sensor; read a set of resistance values across electrode pairs 105 in the array of electrode pairs 105; detect a lateral position and a longitudinal position of a touch input on the touch sensor surface 172 based on the set of capacitance values (e.g., based on changes in capacitance values between drive electrodes and sense electrodes at known lateral and longitudinal positions across the top layer of the substrate 102); interpret a force magnitude of the touch input based on the set of resistance values, as described above; and output the lateral position, the longitudinal position, and the force magnitude of the touch input, such as in the form of a force-annotated touch image.

Therefore, in this example, if the controller 190 detects a single touch input on the touch sensor surface 172 during this scan cycle based on the set of capacitance values, the controller 190 can attribute the entire applied force to this singular touch input. Accordingly, the controller 190 can: implement methods and techniques described above to calculate individual forces carried by each spring element 162 based on resistance values read from the adjacent electrode pairs 105, stored baseline resistance values for these electrode pairs 105, and stored force models for these springs elements; sum these individual forces to calculate a total force applied to the touch sensor surface 172 during this scan cycle; and label the location of the touch input—derived from the set of capacitance values—with this total force.

6.3.5 Capacitive Force Sensor

In this variation and as described above, the substrate can alternatively include a bottom layer: arranged below the second layer opposite the first layer; and comprising a set of sensor traces arranged at the set of discrete deflection spacer locations. The system 100 can also include a coupling plate 168 configured to: couple to the chassis adjacent the array of spring elements; and effect (e.g., modify, change) capacitance values of (e.g., within) the set of sensor traces responsive to displacement of the substrate toward the coupling plate 168.

In this variation, the array of spring elements and the coupling plate 168 can form a unitary metallic structure: arranged between the substrate and the chassis; defining a nominal plane; and defining an array of capacitive coupling regions adjacent the set of discrete deflection spacer locations. Each spring element therefore: can be formed in the unitary metallic structure; can extend from a capacitive coupling region, in the array of capacitive coupling regions; and can be configured to return toward the nominal plane in response to absence of inputs applied to the touch sensor surface. Furthermore, each sensor trace: can capacitively couple to an adjacent capacitive coupling region, in the array of capacitive coupling regions, of the unitary metallic structure; and can move toward the adjacent capacitive coupling region in response to application of inputs on the touch sensor surface proximal the sensor trace.

Accordingly, in this variation, the controller can: read capacitance values from the set of sensor traces; interpret a force magnitude of the input applied to the touch sensor surface based on capacitance values read from the set of sensor traces; and drive the oscillating voltage across the multi-layer inductor during the haptic feedback cycle in response to the force magnitude of the input exceeding a threshold force. For example, a first spring element—in the array of spring elements—can yield to a touch input applied to a first region of the touch sensor surface proximal the first spring element at a first time. Accordingly, a first sensor trace—adjacent the first region of the touch sensor surface— moves toward a first capacitive coupling region by a distance proportional to a force magnitude of the input. Accordingly, the controller: detects a first change in capacitance value of the first sensor trace at the first time; interpret the force magnitude of the input based on the first change in capacitance value; and executes a haptic feedback cycle in response to the force magnitude of the input exceeding the threshold force.

In another example, the controller can: read capacitance values from the set of sensor traces at a scan frequency during a first time period; and interpret the force magnitude of the input applied to the touch sensor surface based on capacitance values read from the drive and sense electrode pairs during the first time period. Then, in response to the force magnitude of the input exceeding the threshold force, the controller can: drive an oscillating voltage across the multi-layer inductor during the haptic feedback cycle, following the first time period; and pause reading electrical values from the set of drive and sense electrode pairs during the haptic feedback cycle. The controller can then resume reading capacitance values from the sensor traces following completion of the haptic feedback cycle.

6.3.5.1 Mutual-Capacitance Sensors

Figure 23:
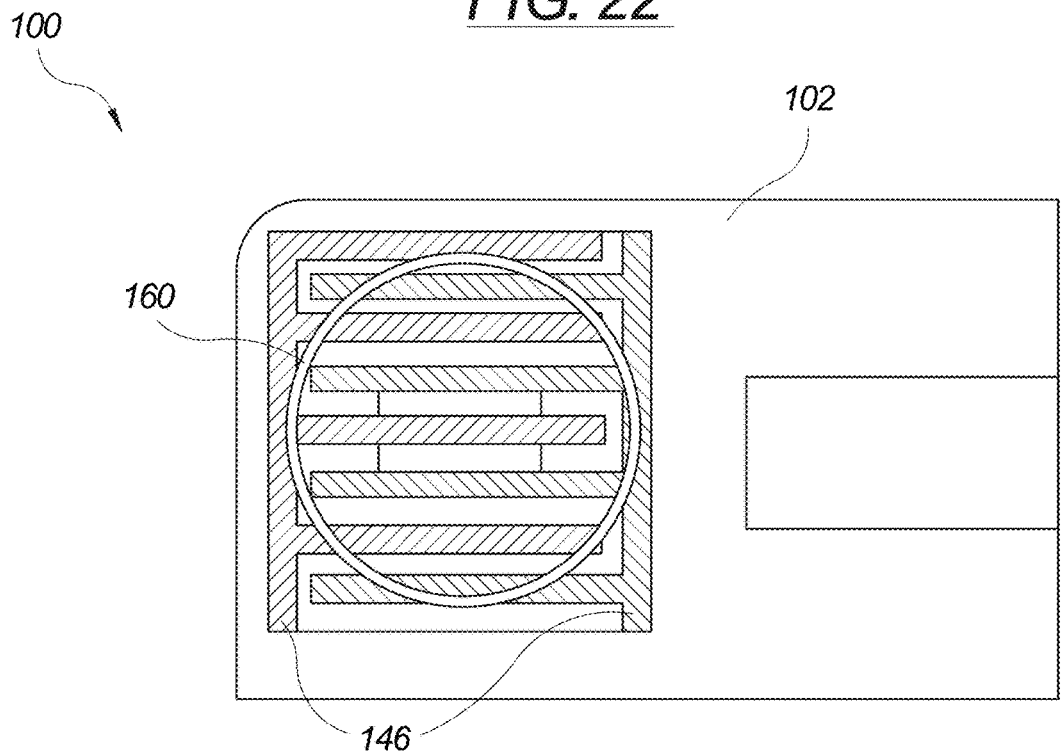
FIG. 23 is a schematic representation of one variation of the system.

In this variation, each sensor trace at a deflection spacer location on the bottom layer of the substrate can form a capacitance sensor arranged in a mutual-capacitance configuration, as shown in FIG. 23.

For example, each sensor trace 146 can include: a drive electrode arranged on the bottom layer of the substrate 102 adjacent a first side of a support location; and a sense electrode arranged on the bottom layer of the substrate 102 adjacent a second side of the support location opposite the drive electrode. In this example, the drive electrodes and sense electrodes within a sensor trace 146 can capacitively couple, and an air gap between the substrate 102 and the coupling plate 168 can form an air dielectric between the drive electrodes and sense electrodes. When the touch sensor surface 172 is depressed over a sensor trace 146, the adjacent spring element 162 can yield, thereby moving the drive electrodes and sense electrodes of the sensor trace 146 closer to the coupling plate 168 and reducing the air gap between these drive electrodes and sense electrodes. Because the coupling plate 168 exhibits a dielectric greater than air, the reduced distance between the coupling plate 168 and the substrate 102 thus increases the effective dielectric between the drive electrodes and sense electrodes and thus increases the capacitance of the drive electrodes and sense electrodes. The capacitance value of the sensor trace 146 may therefore deviate from a baseline capacitance value— such as in the form of an increase in the charge time of the sensor trace 146, an increase in the discharge time of the sensor trace 146, or a decrease in the resonant frequency of the sensor trace 146—when the touch sensor surface 172 is depressed over the sensor trace 146.

Therefore, in this implementation, the controller 190 can, during a scan cycle: drive the coupling plate 168 to a reference (e.g., ground) potential; (serially) drive each drive electrode in the sensor traces 146, such as a target voltage, over a target time interval, or with an alternating voltage of a particular frequency; read a set of capacitance values— from the sense electrodes in the array of sensor traces 146—that represent measures of mutual capacitances between drive electrodes and sense electrodes of these sensor traces 146; and interpret a distribution of forces applied to the touch sensor surface 172 based on this set of capacitance values and known spring constants of the array of spring elements 162, as described below.

6.3.5.2 Self-Capacitance Sensors

In another implementation, the sensor traces 146 are arranged in a self-capacitance configuration adjacent each support location.

For example, each sensor trace 146 can include a single electrode arranged on the bottom layer of the substrate 102 adjacent (e.g., encircling) a support location, and the coupling plate 168 can function as a common second electrode for each sensor trace 146. In this example, the single electrode within a sensor trace 146 and the coupling plate 168 can capacitively couple, and an air gap between the substrate 102 and the coupling plate 168 can form an air dielectric between the sensor trace 146 and the coupling plate 168. When the touch sensor surface 172 is depressed over the sensor trace 146, the adjacent spring element 162 can yield, thereby: moving the sensor trace 146 closer to the coupling plate 168; reducing the air gap between the sensor trace 146 and the coupling plate 168; and increasing the capacitance between the sensor trace 146 and the coupling plate 168. The capacitance value of the sensor trace 146 may therefore deviate from a baseline capacitance value—such as in the form of an increase in the charge time of the sensor trace 146, an increase in the discharge time of the sensor trace 146, or a decrease in the resonant frequency of the sensor trace 146—when the touch sensor surface 172 is depressed over the sensor trace 146.

Therefore, in this implementation, the controller 190 can, during a scan cycle: drive the coupling plate 168 to a reference (e.g., ground) potential; (serially) drive each sensor trace 146, such as a target voltage, over a target time interval, or with an alternating voltage of a particular frequency; read a set of capacitance values—from the array of sensor traces 146—that represent measures of self capacitances between the sensor traces 146 and the coupling plate 168; and interpret a distribution of forces applied to the touch sensor surface 172 based on this set of capacitance values and known spring constants of the array of spring elements 162, as described below.

6.3.5.3 Separate Coupling Plate Between Spring Plate and Substrate

The coupling plate 168 is configured to: couple to the chassis adjacent the array of spring elements 162; and effect capacitance values of the array of sensor traces 146 responsive to displacement of the substrate 102 toward the coupling plate 168.

Figure 21:
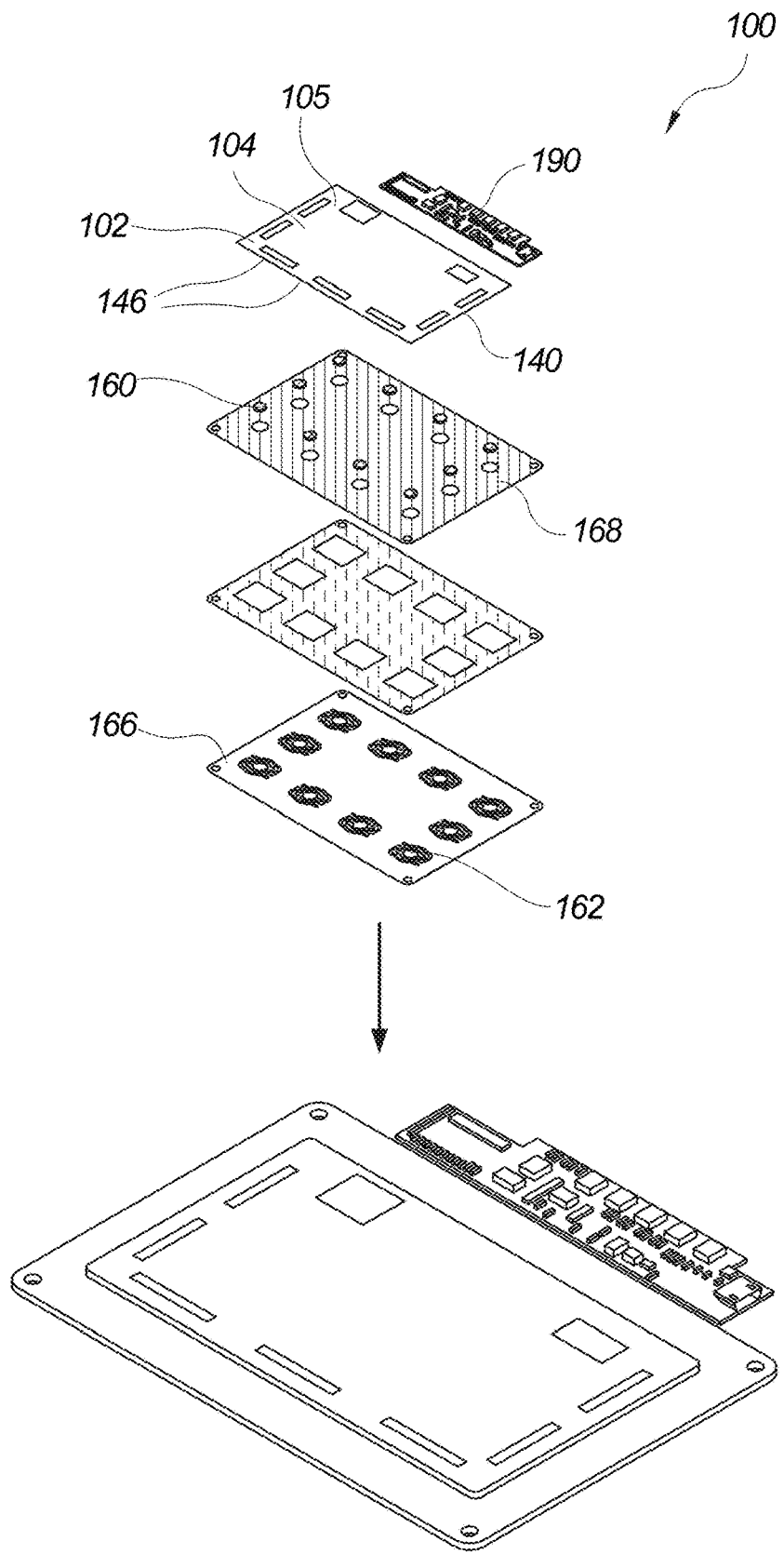
FIG. 21 is a schematic representation of one variation of the system.

In one implementation shown in FIG. 21, the coupling plate 168 defines a discrete structure interposed between the chassis interface 166 and the substrate 102 and rigidly mounted to the chassis of the computing device.

Generally, in this implementation, the coupling plate 168: can be interposed between the array of spring elements 162 and the substrate 102; can include an array of perforations aligned (e.g., coaxial) with the array of support locations and the array of spring elements 162 and defining geometries similar to (and slightly larger than) the stages on the spring elements 162; and define an array of capacitive coupling regions adjacent (e.g., encircling) the array of perforations. For example, the coupling plate 168 can include a thin-walled structure (e.g., a stainless steel 20-gage, or 0.8-millimeter-thick sheet) that is punched, etched, or laser-cut to form the array of perforations. In this implementation, each sensor trace 146 (e.g., drive electrodes and sense electrodes in the mutual capacitance configuration, a single electrode in the self capacitance configuration) can extend around a support location on the bottom layer of the substrate 102, such as up to a perimeter of the adjacent perforation in the coupling plate 168 such that the sensor trace 146 (predominantly) capacitively couples to the adjacent capacitive coupling region on the coupling plate 168 rather than the adjacent spring element 162.

Furthermore, in this implementation, the system 100 can further include a set of deflection spacers 160, each of which: extends through a perforation in the coupling plate 168; is (slightly) undersized for the perforation; and couples an adjacent support location on the bottom layer of the substrate 102 to an adjacent spring element 162 in the chassis interface 166. For example, each deflection spacer 160 can include a silicone coupon bonded (e.g., with a pressure-sensitive adhesive) to the stage of an adjacent spring element 162 on one side and to the adjacent support location on the substrate 102 on the opposing side.

Therefore, in this implementation, each sensor trace 146 can: capacitively couple to an adjacent capacitive coupling region of the coupling plate 168; and move toward the adjacent capacitive coupling region on the coupling plate 168 in response to application of a force on the touch sensor surface 172 proximal the sensor trace 146, which yields a change in the capacitance value of the sensor trace 146 representative of the portion of the force of this input carried the adjacent spring element 162. More specifically, because the coupling plate 168 is rigid and mechanically isolated from the substrate 102 and the spring elements 162, the capacitive coupling regions of the coupling plate 168 can remain at consistent positions offset above the chassis receptacle such that application of a force to the touch sensor surface 172 compresses all or a subset of the spring elements 162, moves all or a subset of the sensor traces 146 closer to their corresponding capacitive coupling regions, and repeatably changes the capacitance values of these sensor traces 146 as a function of (e.g., proportional to) the force magnitudes carried by the spring elements 162, which the controller 180 can then interpret to accurately estimate these force magnitudes, the total force applied to the touch sensor surface 172, and/or force magnitudes of individual touch inputs applied to the touch sensor surface 172.

Furthermore, in this implementation, the deflection spacer 160 can define a height approximating (or slightly greater than) a height of the maximum vertical compression of the adjacent spring element 162 corresponding to a target dynamic range of the adjacent sensor trace 146. For example, for a target dynamic range of 2 Newtons (e.g., 200 grams) for a pressure sensor given a maximum of one millimeter of vertical displacement of the touch sensor surface 172—and therefore a maximum of one millimeter of compression of the adjacent spring element 162—the spring element 162 can be tuned for a spring constant of 2000 Newtons per meter. Furthermore, the deflection spacer 160 can be of a height of approximately one millimeter, plus the thickness of the coupling plate 168 and/or a stack tolerance (e.g., 10%, of 0.1 millimeter).

In this implementation, the coupling plate 168 and the chassis interface 166 can be fastened directly to the chassis of the computing device. Alternatively, the coupling plate 168 and the chassis interface 166 can be mounted (e.g., fastened, riveted, welded, crimped) to a separate interface plate that is then fastened or otherwise mounted to the chassis. The system 100 can also include a non-conductive buffer layer arranged between the chassis interface 166 and the coupling plate 168, as shown in FIG. 21, in order to electrically isolate the chassis interface 166 from the coupling plate 168.

6.3.5.4 Integral Coupling Plate and Spring Plate

Figure 20:
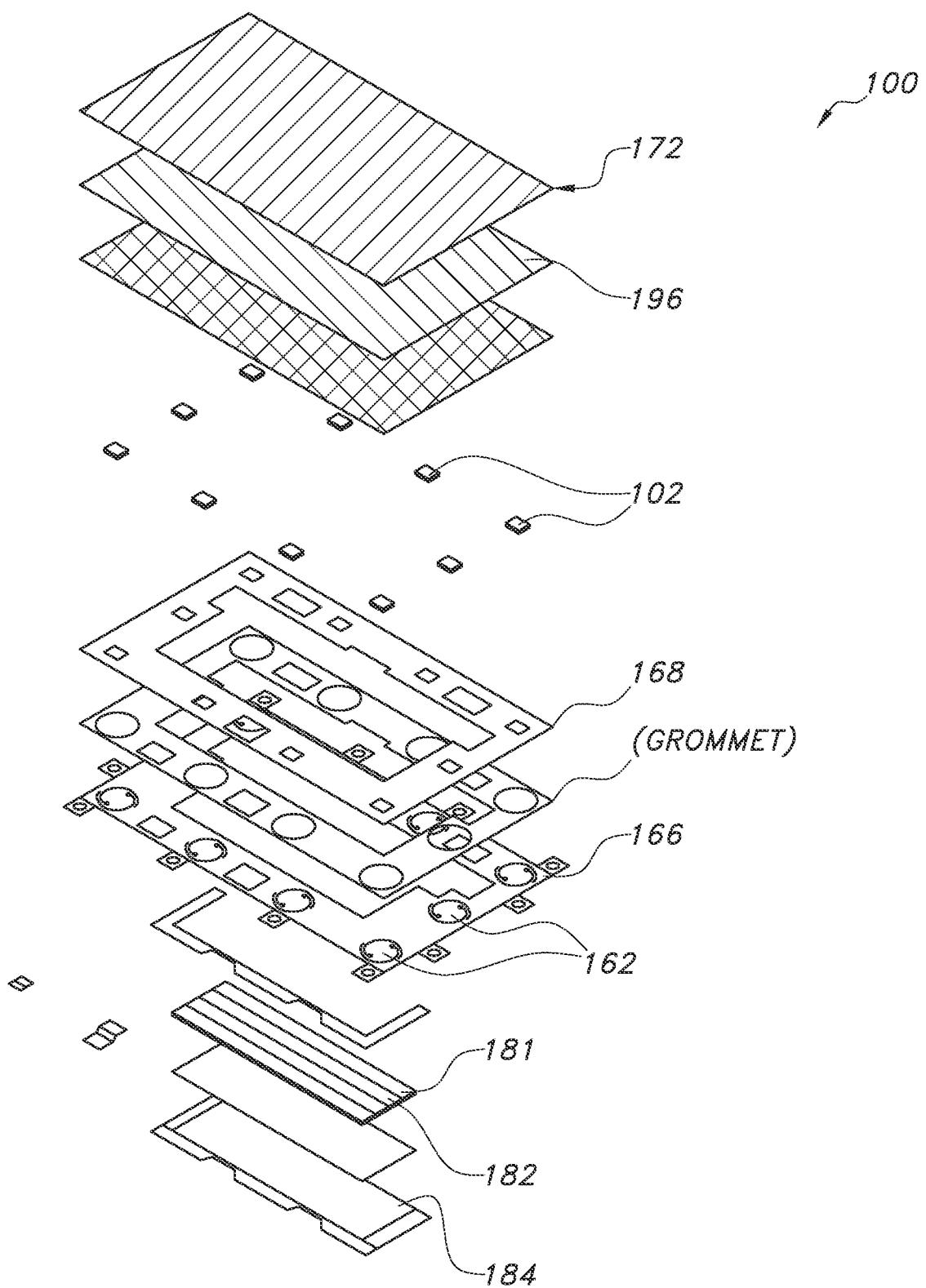
FIG. 20 is a schematic representation of one variation of the system.

In another implementation, the coupling plate 168 and the chassis interface 166 define a single unitary (e.g., metallic)

structure arranged between the substrate 102 and the chassis, as shown in FIGS. 20 and 21.

Generally, in this implementation, the unitary metallic structure can define: a nominal plane between the chassis receptacle and the substrate 102; and an array of capacitive coupling regions adjacent (e.g., aligned to, coaxial with) the array of support locations on the substrate 102. In this implementation, each spring element 162: can be formed in the unitary metallic structure (e.g., by etching, laser cutting); can extend from its adjacent capacitive coupling region; can define a stage coupled to the corresponding support location on the bottom layer of the substrate 102 (e.g., via a deflection spacer 160 as described above); and can be configured to return to approximately the nominal plane in response to absence of a touch input applied to the touch sensor surface 172.

When the unitary structure is rigidly mounted to the chassis of the computing device, the unitary structure can thus rigidly locate the capacitive coupling regions relative to the chassis and within (or parallel to) the nominal plane, and the stages of the spring elements 162 can move vertically relative to the nominal plane and the capacitive coupling regions.

Thus, each sensor trace 146 on the substrate 102 can: capacitively couple to an adjacent capacitive coupling region on the unitary metallic structure; and move toward this adjacent capacitive coupling region in response to application of a force on the touch sensor surface 172 proximal the sensor trace 146, which thus changes the capacitance value of the sensor trace 146 proportional to compression of the adjacent spring element 162 and therefore proportional to the portion of the force carried by the spring element 162.

Furthermore, in this implementation, the unitary metallic structure can be fastened directly to the chassis of the computing device. Alternatively, the unitary metallic structure can be mounted (e.g., fastened, riveted, welded, crimped) to a separate chassis interface 190 that is then fastened or otherwise mounted to the chassis.

6.4 Sliding Interface

Figure 10B:
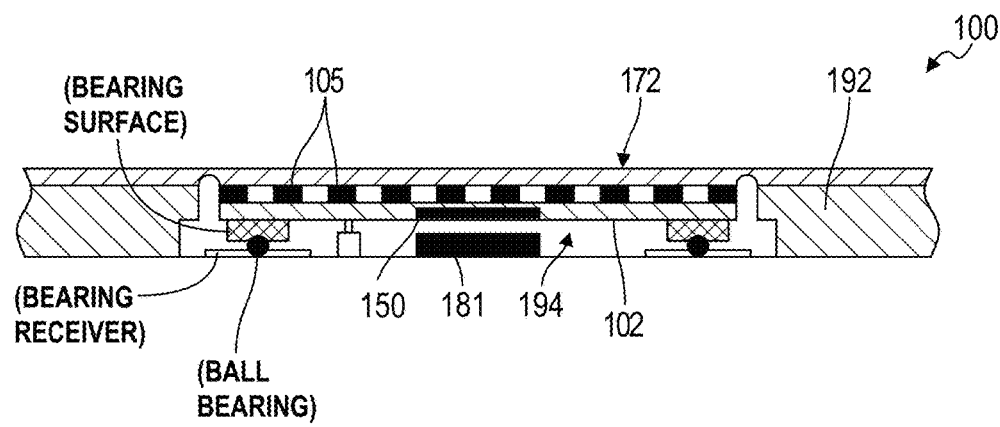
Figure 11A:
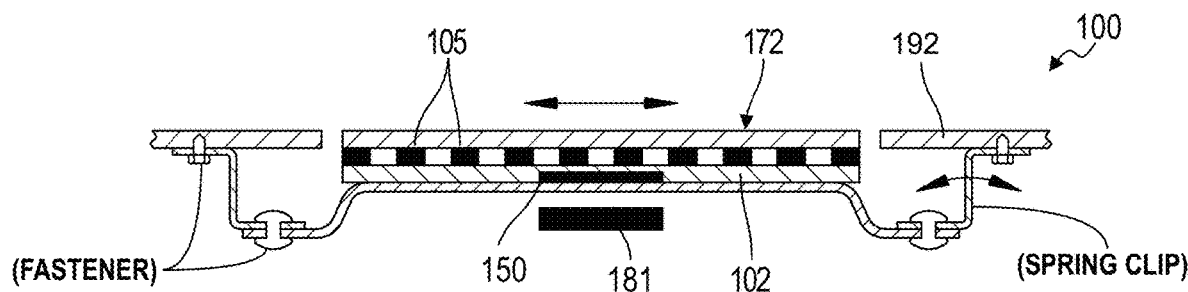
FIGS. 11A-11D are schematic representations of one variation of the system.
Figure 11B:
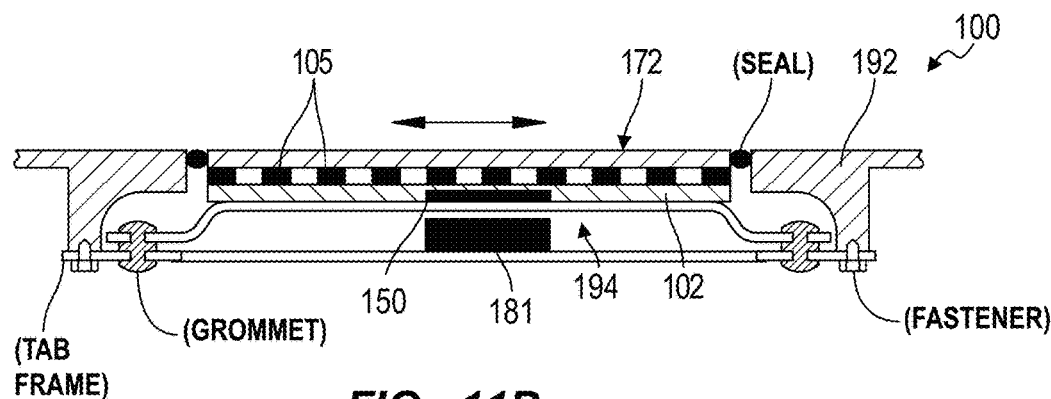
Figure 11C:
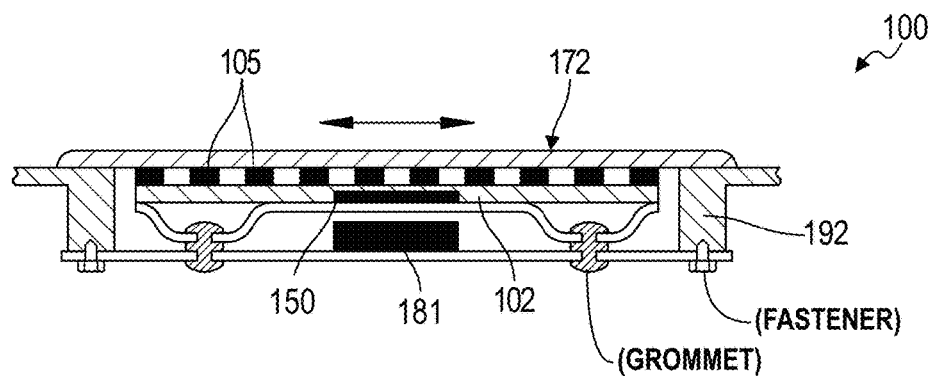
Figure 11D:
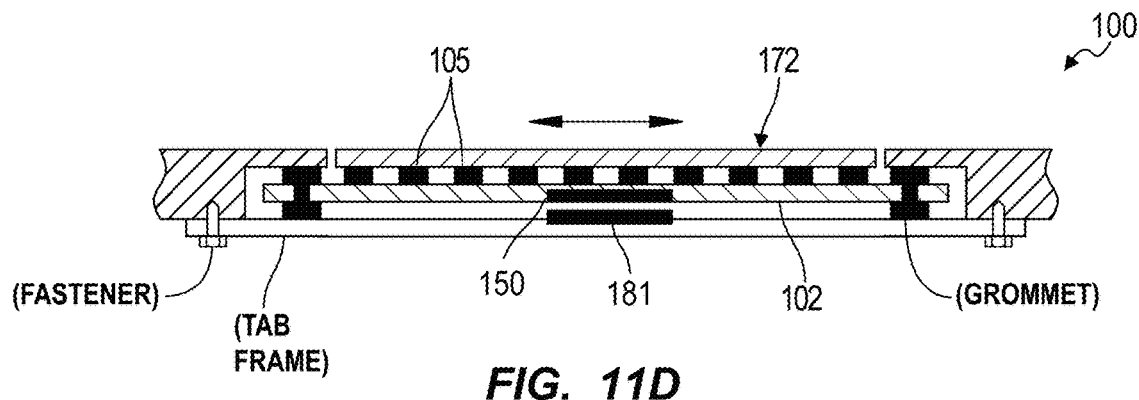

In another implementation shown in FIG. 10B, the substrate 102 rests on and slides over a bearing surface in the base of the receptacle 194, such as: a continuous, planar bearing surface; a discontinuous, planar bearing surface (e.g., a planar surface with relief channels to reduce stiction between the substrate 102 and the bearing surface); or a set of bushings (e.g., polymer pads) or bearings (e.g., steel ball-bearings) offset above and distributed across the base of the receptacle 194.

In one example: the receptacle 194 defines a planar base surface parallel to the vibration plane; the set of magnetic elements is retained in the base of the receptacle 194 below the planar base surface; and the substrate 102 includes a rigid (e.g., a fiberglass) PCB arranged over and in contact with the planar base surface, is configured to slide over the planar base surface parallel to the vibration plane, and is configured to transfer a vertical force in applied to the touch sensor surface 172 into the chassis 192.

In this configuration: the set of magnetic elements can be embedded in the base of the receptacle 194; and the system 100 can further include a low-friction layer interposed between the base of the receptacle 194 and the substrate 102. In particular, the low-friction layer can be configured: to prevent direct contact between the magnet elements and the bottom spiral trace of the multi-layer inductor 150 on the bottom layer 140 of the substrate 102; and to facilitate smooth oscillation of the substrate 102—and the touch sensor assembly more generally—over the base of the receptacle 194. For example, the low-friction layer can include a polytetrafluoroethylene (or "PTFE") film arranged between the set of magnetic elements and the multi-layer inductor 150. Alternatively, the low-friction layer can be arranged across the inner face of the substrate 102 and over the multi-layer inductor 150.

Furthermore, in this configuration, the system 100 can include a spring element 162 configured to center the substrate 102 within the receptacle 194 responsive to depolarization of the multi-layer inductor 150 during a haptic feedback cycle. In another example, the system 100 can include a flexure coupled to or physically coextensive with the substrate 102, extending onto and retained at the chassis 192, and thus functioning to re-center the touch sensor assembly relative to the set of magnetic elements upon conclusion of a haptic feedback cycle. In yet another example, in this configuration (and in the foregoing configurations), the system 100 can include a flexible membrane (e.g., a seal) located proximal a perimeter of the touch sensor surface 172, interposed between the touch sensor and an interior wall of the receptacle 194, and configured to seal an interstice between the touch sensor and the receptacle 194, such as from moisture and/or dust ingress.

7. Ground Plane Geometry and Shielding

The substrate 102 can further include a shielding trace fabricated in a conductive layer and configured to shield the touch sensor from electrical noise generated by the multi-layer inductor 150, such as during and after a haptic feedback cycle.

In one implementation, the substrate 102 further includes an intermediate layer 106 interposed between: the top layer 104, which contains the drive and sense electrode pairs 105; and the first layer 110 of the substrate 102 that contains the topmost spiral trace of the multi-layer inductor 150. In this implementation, the intermediate layer 106 can include a contiguous trace area that defines an electrical shield 107 configured to shield the set of drive and sense electrode pairs 105 of the touch sensor from electrical noise generated by the multi-layer inductor 150 when driven with an oscillating voltage by the controller 190 during a haptic feedback cycle. In particular, the controller 190 can drive the electrical shield 107 in the intermediate layer 106 to a reference voltage potential (e.g., to ground, to an intermediate voltage), such as: continuously throughout operation; or intermittently, such as during and/or slightly after a haptic feedback cycle. Thus, when driven to the reference potential, the electrical shield 107 can shield the drive and sense electrode pairs 105 of the touch sensor in the top layer 104 from electrical noise.

Furthermore, as shown in FIG. 1, the electrical shield 107 can include a cleft—such as in the form of a serpentine break across the width of the electrical shield 107—in order to prevent circulation of Eddy currents within the electrical shield 107, which may otherwise: create noise at the drive and sense electrode pairs 105 in the touch sensor above; and/or induce a second magnetic field opposing the magnetic field generated by the multi-layer inductor 150, which may brake oscillation of the substrate 102 during a haptic feedback cycle.

Additionally or alternatively, in the configuration described above in which the system 100 includes sensor traces 146 at deflection space locations on the bottom layer 140 of the substrate 102, the first layer 110 of the substrate 102—arranged below the top layer 104 and/or the intermediate layer 106 and containing the first spiral trace 11 of the multi-layer inductor 150—can include an electrical shield 107 separate from and encircling the first spiral trace 111. In this implementation, the controller 190 can drive both this electrical shield 107 in the first layer 110 and the multi-layer inductor 150 to a reference voltage potential (e.g., to ground, to an intermediate voltage)—outside of haptic feedback cycles—in order to: shield these sensor traces 146 from electrical noise from outside of the system 100; and/or shield the drive and sense electrode pairs 105 in the touch sensor from electrical noise generated by these sensor traces 146. Therefore in this implementation, the first layer 110 of the substrate 102—containing the first spiral trace 111 of the multi-layer inductor 150—can further include a shield electrode trace 112 adjacent and offset from the first spiral trace 111; and the controller 190 can drive the shield electrode trace 112 and the first spiral trace 111 to a reference potential in order to shield the second set of sensor traces 146—at the deflection spacer locations—from electrical noise when reading electrical values from these sensor traces 146.

For example, in this implementation, the controller 190 can hold the multi-layer inductor 150 (or a topmost spiral trace in the multi-layer inductor 150) at a virtual ground potential while scanning and processing resistance (or capacitance) data from drive and sense electrode pairs 105 in the touch sensor in the top conductive layer(s) of the substrate 102 during a scan cycle. The controller 190 can subsequently: detect an input on the touch sensor surface 172 based on a change in resistance (or capacitance) values read from drive and sense electrode pairs 105 in the touch sensor; release the multi-layer inductor 150 from the virtual reference potential; and polarize the multi-layer inductor 150 via a time-varying current signal during a haptic feedback cycle responsive to detecting this input on the touch sensor surface 172. More specifically, the controller 190 can: ground the electrical shield 107 and the multi-layer inductor 150 during a scan cycle in order to shield the touch sensor from electronic noise; and pause scanning of the touch sensor during haptic feedback cycles (e.g., while the multi-layer inductor 150 is polarized) in order to avoid generating and responding to noisy touch images during haptic feedback cycles.

Thus, in this variation, power electronics (e.g., the multi-layer inductor 150) and sensor electronics in both high- and low-resolution sensors (e.g., drive and sense electrode pairs 105 in the touch sensor and sensor traces 146 at the deflection spacer locations, respectively) can be fabricated on a single, unitary substrate 102, thereby eliminating manufacture and assembly of multiple discrete substrates for different haptic feedback and touch-sensing functions and enable the system 100 to perform touch sensing, force-sensing, and haptic feedback functions in a thinner package.

8. Controller

During operation, the controller 190 can: detect application of an input on the touch sensor surface 172 based on changes in electrical (e.g., capacitance or resistance, etc.) values between drive and sense electrode pairs 105 in the touch sensor integrated into the top layer(s) 104 of the substrate 102; characterize a force magnitude of the input based on these electrical values read from the touch sensor and/or based on electrical values read from sensor traces 146 in the deflection spacers 160 integrated into the bottom layer(s) 140 of the substrate 102; and/or interpret the input as a "click" input if the force magnitude of the input exceeds a threshold force magnitude (e.g., 160 grams). Then, in response to detecting the input and/or interpreting the input as a "click" input, the controller 190 can execute a haptic feedback cycle, such as by transiently polarizing the multi-layer inductor 150 in order to induce alternating magnetic coupling between the multi-layer inductor 150 and the set of magnetic elements and thus vibrating the substrate 102 within the chassis 192, serving haptic feedback to a user, and providing the user with tactile perception of downward travel of the touch sensor surface 172 analogous to depression of a mechanical momentary switch, button, or key.

8.1 Controller Mounted to Substrate

In the foregoing configurations: the controller 190 (and/or a driver) is mounted to the substrate 102, such as opposite the touch sensor (on the inner face of the substrate 102); and the system 100 further includes a flexible circuit extending between the substrate 102 and the chassis 192 and electrically coupled to a power supply arranged in the chassis 192. Thus, in this configuration, the controller 190 can: read electrical values between drive and sense electrode pairs 105 in the touch sensor or otherwise sample the adjacent touch sensor directly; generate a sequence of touch images based on these electrical values between drive and sense electrode pairs 105 in the touch sensor; and then output this sequence of touch images to a processor arranged in the chassis 192 via the flexible circuit. Furthermore, the driver can intermittently source current from the power supply to the multi-layer inductor 150 via the flexible circuit responsive to triggers from the adjacent controller 190. Thus, in this configuration, the touch sensor assembly can include the substrate 102, the touch sensor, (the touch sensor surface 172,) the controller 190, the driver, the multi-layer inductor 150, and the flexible circuit in a self-contained unit. This self-contained unit can then be installed over a receptacle 194 in a chassis 192 and the flexible circuit can be connected to a power and data port in the receptacle 194 to complete assembly of the system 100 into this device.

9. Haptic Feedback Cycle

In this variation, the multi-layer inductor 150—integrated into the substrate 102—and the set of magnetic elements—housed within the chassis 192 below the multi-layer inductor 150—cooperate to define a compact, integrated multi-layer inductor 150 configured to oscillate the substrate 102 and the touch sensor surface 172 responsive to polarization of the multi-layer inductor 150 by the controller 190 (e.g., in response detecting touch inputs on the touch sensor surface 172). More specifically, the controller 190, in conjunction with a drive circuit, can supply an alternating (i.e., time-varying) drive current to the multi-layer inductor 150 during a haptic feedback cycle, thereby generating a time-varying magnetic field through the multi-layer inductor 150 that periodically reverses direction. Thus, the controller 190 and/or the drive circuit can transiently polarize the multi-layer inductor 150 to generate magnetic forces between the multi-layer inductor 150 and the set of magnetic elements, thereby causing the multi-layer inductor 150 (and thus the substrate 102 and touch sensor surface 172) to be alternately attracted and repelled by poles of the set of magnetic elements and oscillating the touch sensor surface 172 relative to the chassis 192, as shown in FIGS. 16 and 17.

Figure 17:
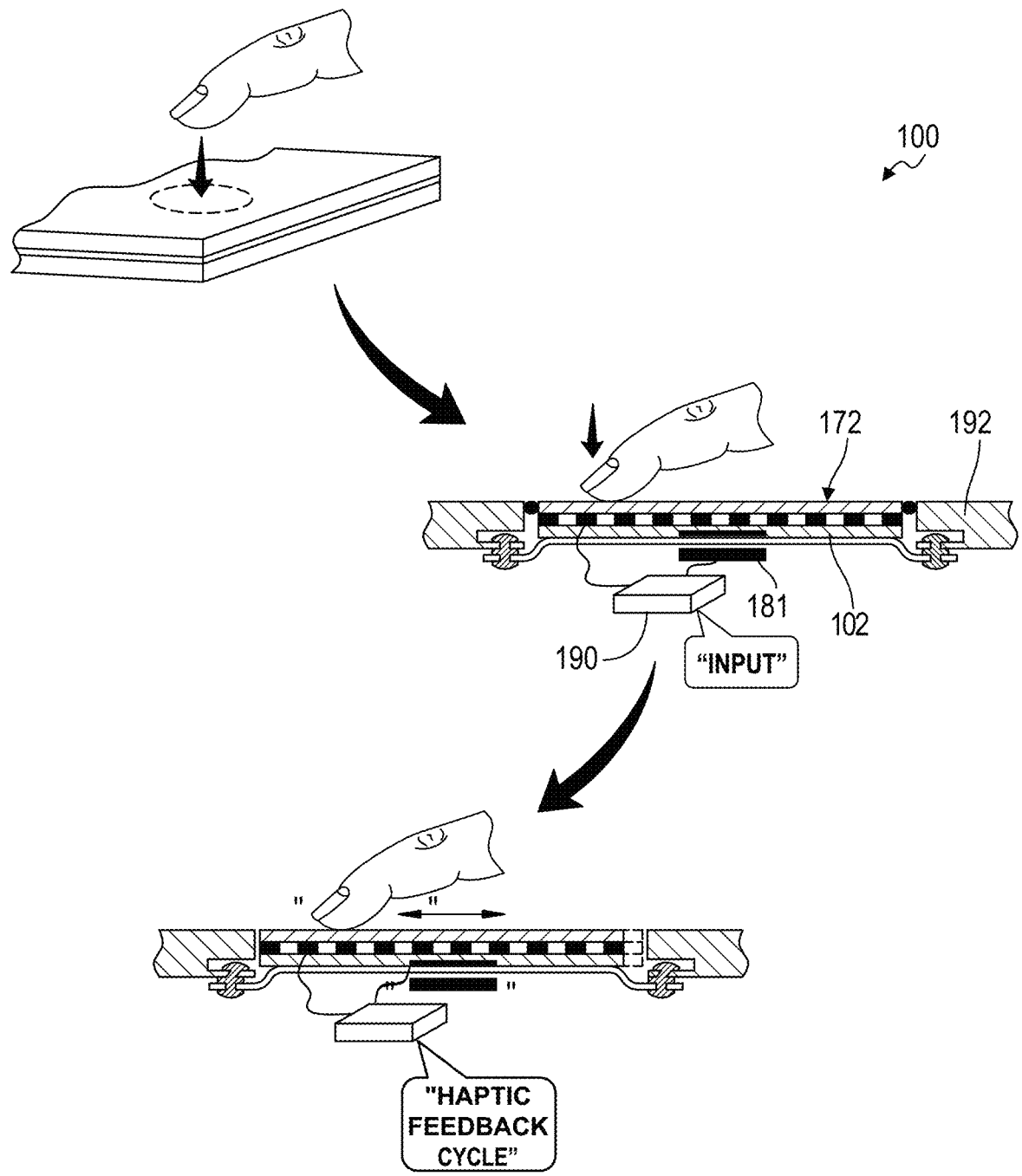
FIG. 17 is a flowchart representation of one variation of the system.

In particular, in response to detecting a touch input—on the touch sensor surface 172—that exceeds a threshold force (or pressure) magnitude, the controller 190 drives the multi-layer inductor 150 during a "haptic feedback cycle" in order to tactilely mimic actuation of a mechanical snap button, as shown in FIGS. 16 and 17. For example, in response to such a touch input, the controller 190 can trigger a motor driver to drive the multi-layer inductor 150 with a square-wave alternating voltage for a target click duration (e.g., 250 milliseconds), thereby inducing an alternating magnetic field through the multi-layer inductor 150, which magnetically couples to the set of magnetic elements, induces an oscillating force between the magnetic element and the multi-layer inductor 150, and oscillates the substrate 102 relative to the chassis 192 of the device.

9.1 Paused Scanning During Haptic Feedback Cycle

In one implementation, the controller 190: reads electrical values from the set of drive and sense electrode pairs 105 during scan cycles at a scan frequency (e.g., 200 Hz) during operation; and interprets inputs on the touch sensor surface 172 (and their force magnitudes) based on a set of electrical values read from the drive and sense electrode pairs 105 during each scan cycle. Then, in response to detecting an input on the touch sensor surface 172 (or detecting an input of force magnitude greater than a threshold force on the touch sensor surface 172) during the current scan cycle, the controller 190: drives an oscillating voltage across the multi-layer inductor 150 during a haptic feedback cycle following the current scan cycle; pauses reading electrical values from the set of drive and sense electrodes during the haptic feedback cycle; and then resumes reading electrical values from the set of drive and sense electrodes—and interpreting inputs on the touch sensor surface 172 based on these electrical values—following completion of the haptic feedback cycle.

Generally, in this implementation, the controller 190 can: execute a sequence of scan cycles to detect and characterize force magnitudes of inputs applied over the touch sensor surface 172 during these scan cycles; pause scanning of the touch sensor (and or the deflection spacers 160) while executing a haptic feedback cycle in response to detecting an input exceeding a threshold force magnitude; and then resume scanning of the touch sensor upon completion of the haptic feedback cycle.

More specifically, during a scan cycle, the controller 190 can: drive the multi-layer inductor 150 to a ground potential; sample capacitance (or resistance) values between drive and sense electrode pairs in the touch sensor; transform these values into locations (and force magnitudes) of inputs applied over the touch sensor surface 172 during the scan cycle; sample resistance (or capacitance) values from the set of deflection spacers 160; interpret force magnitudes of these inputs on the touch sensor surface 172; and generate a touch image representing both the locations and force magnitudes of these inputs on the touch sensor surface 172.

Then, in response to the force magnitude of a detected input exceeding a threshold force magnitude (e.g., a "click" force of 160 grams), the controller 190 can: release the multi-layer inductor 150 from the ground potential; and trigger the drive circuit to polarize the multi-layer inductor 150 according to a particular AC waveform (e.g., selected based on the threshold force magnitude) to induce oscillation of the touch sensor surface 172 relative to the chassis 192 during a haptic feedback cycle (or a "haptic feedback cycle"). The controller 190 can also pause scanning of the touch sensor prior to or during the haptic feedback cycle. The controller 190 can then resume executing scan cycles at the touch sensor and/or the deflection spacers 160 after completion of the haptic feedback cycle (e.g., once the multi-layer inductor 150 is depolarized and/or returned to ground potential).

9.2 Interleaved Scanning and Haptic Feedback Cycle

Alternatively, after detecting an input on the touch sensor surface 172 (or after detecting an input of force magnitude greater than a threshold force on the touch sensor surface 172) during the current scan cycle, the controller 190 can: drive the multi-layer inductor 150 with an oscillating voltage at a first frequency (e.g., 50 Hz); and interleave higher-frequency (e.g., 200 Hz) scan cycles between intervals of peak magnetic field coupling between the multi-layer inductor 150 and the magnetic elements during this haptic feedback cycle. For example, in this implementation, the controller 190 can continue to capture electrical values from drive and sense electrode pairs 105 in the touch sensor and detect and track inputs on the touch sensor surface 172 during a haptic feedback cycle by interleaving scan cycles at the touch sensor between voltage reversals across the multi-layer inductor 150 during this haptic feedback cycle.

In this implementation, the controller 190 can: read electrical values from the set of drive and sense electrode pairs 105 during scan cycles at a scan frequency (e.g., 200 Hz) during operation; and interpret inputs on the touch sensor surface 172 (and their force magnitudes) based on a set of electrical values read from the drive and sense electrode pairs 105 during each scan cycle. Then, in response to detecting an input on the touch sensor surface 172 (or detecting an input of force magnitude greater than a threshold force on the touch sensor surface 172) during the current scan cycle, the controller 190: drives an oscillating voltage, at a feedback frequency (e.g., 50 Hz) less than the scan frequency, across the multi-layer inductor 150 during a haptic feedback cycle; intermittently reads electrical values from the set of drive and sense electrodes at the scan frequency—between voltage reversals across the multi-layer inductor 150 at the feedback frequency—during the haptic feedback cycle; interprets inputs on the touch sensor surface 172 during the haptic feedback cycle based on these intermittent electrical values; and returns to reading electrical values from the set of drive and sense electrode pairs 105 at the scan frequency following completion of the haptic feedback cycle.

9.3 Preset Force Threshold

As described above, the controller 190 can execute a haptic feedback cycle in response to detecting a touch input on the touch sensor surface 172 that meets or exceeds one or more preset force thresholds in Block S120. For example, the controller 190 can initiate a haptic feedback cycle in response to detecting a touch input on the touch sensor surface 172 that exceeds a threshold force (or pressure) magnitude corresponding to tuned break forces (or pressures) of mechanical buttons of common user input devices (e.g., mechanical keys keyboard, mechanical volume and home buttons on smartphones, buttons on physical computer mice, a mechanical trackpad button or snapdome), such as 165 grams. Therefore, the controller 190 can selectively execute a haptic feedback cycle in response to detecting an input on the touch sensor surface 172 that exceeds this threshold force in order to emulate haptic feedback of such mechanical buttons.

9.4 User-Elected Force Threshold

Alternatively, the controller 190 can implement a user-customized force threshold to trigger a haptic feedback cycle, such as based on a user preference for greater input sensitivity (corresponding to a lower force threshold) or based on a user preference for lower input sensitivity (corresponding to a greater force threshold) set through a graphical user interface executing on a computing device connected to or incorporating the system 100.

9.5 Variable Force Threshold

In another implementation, the controller 190 can segment the touch sensor surface 172 into two or more active and/or inactive regions, such as based on a current mode or orientation of the system 100, as described below, and the controller 190 can discard an input on an inactive region of the touch sensor surface 172 but initiate a haptic feedback cycle in response to detecting a touch input of sufficient force magnitude within an active region of the touch sensor surface 172.

In this implementation, the controller 190 can additionally or alternatively assign unique threshold force (or pressure) magnitudes to discrete regions of the touch sensor surface 172 and selectively execute haptic feedback cycles responsive to inputs—on various regions of the touch sensor surface 172—that exceed threshold force magnitudes assigned to these individual regions of the touch sensor surface 172. For example, the controller 190 can: assign a first threshold magnitude to a left-click region of the touch sensor surface 172; and assign a second threshold magnitude—greater than the first threshold magnitude in order to reject aberrant right-clicks on the touch sensor surface 172—to a right-click region of the touch sensor surface 172. In this example, the controller 190 can also: assign a third threshold magnitude to a center scroll region of the touch sensor surface 172, wherein the third threshold magnitude is greater than the first threshold magnitude in order to reject aberrant scroll inputs on the touch sensor surface 172; but also link the center scroll region to a fourth threshold magnitude for a persistent scroll event, wherein the fourth threshold magnitude is less than the first threshold magnitude.

9.6 Standard Click and Deep Click

Figure 19:
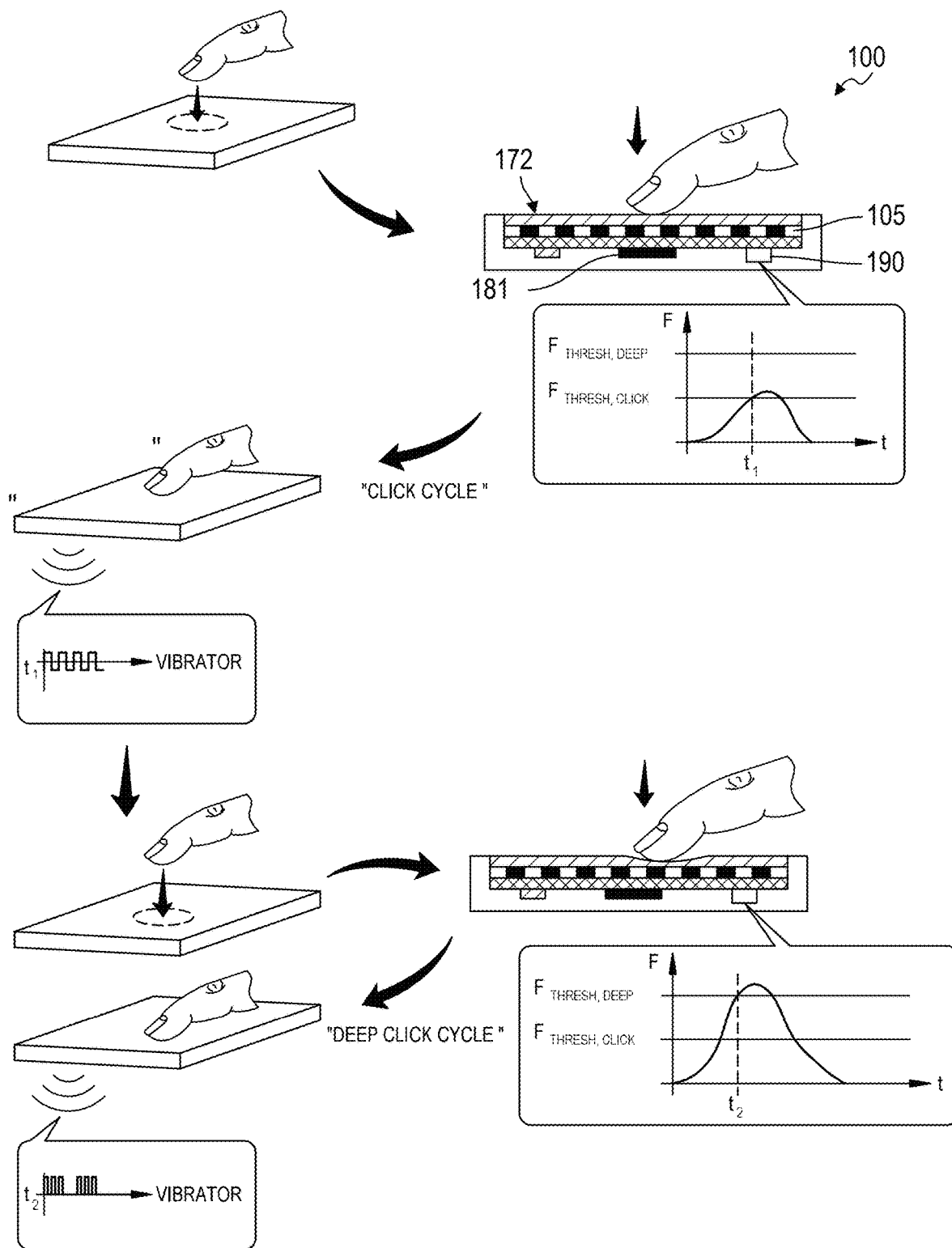
FIG. 19 is a flowchart representation of one variation of the system.

In one variation shown in FIG. 19, the controller 190: executes a "standard-click haptic feedback cycle" in Blocks Silo and S120 in response to application of a force that exceeds a first force magnitude and that remains less than a second force threshold (hereinafter a "standard click input"); and executes a "deep haptic feedback cycle" in Blocks S114 and S124 in response to application of a force that exceeds the second force threshold (hereinafter a "deep click input"). In this variation, during a deep haptic feedback cycle, the controller 190 can drive the multi-layer inductor 150 for an extended duration of time (e.g., 750 milliseconds), at a higher amplitude (e.g., by driving the haptic feedback cycle at a higher peak-to-peak voltage), and/or at a different (e.g., lower) frequency in order to tactilely indicate to a user that a deep click input was detected at the touch sensor surface 172.

In one example, the controller 190 can: output a left-click control command and execute a standard-click haptic feedback cycle in response to detecting an input of force magnitude between a low "standard" force threshold and a high "deep" force threshold; and output a right-click control command function and execute a deep-haptic feedback cycle in response to detecting an input of force magnitude greater than the high "deep" force threshold. The system 100 can therefore: detect inputs of different force magnitudes on the touch sensor surface 172; assign an input type to an input based on its magnitude; serve different haptic feedback to the user by driving the multi-layer inductor 150 according to different schema based on the type of a detected input; and output different control functions based on the type of the detected input.

9.7 Hysteresis

Figure 18:
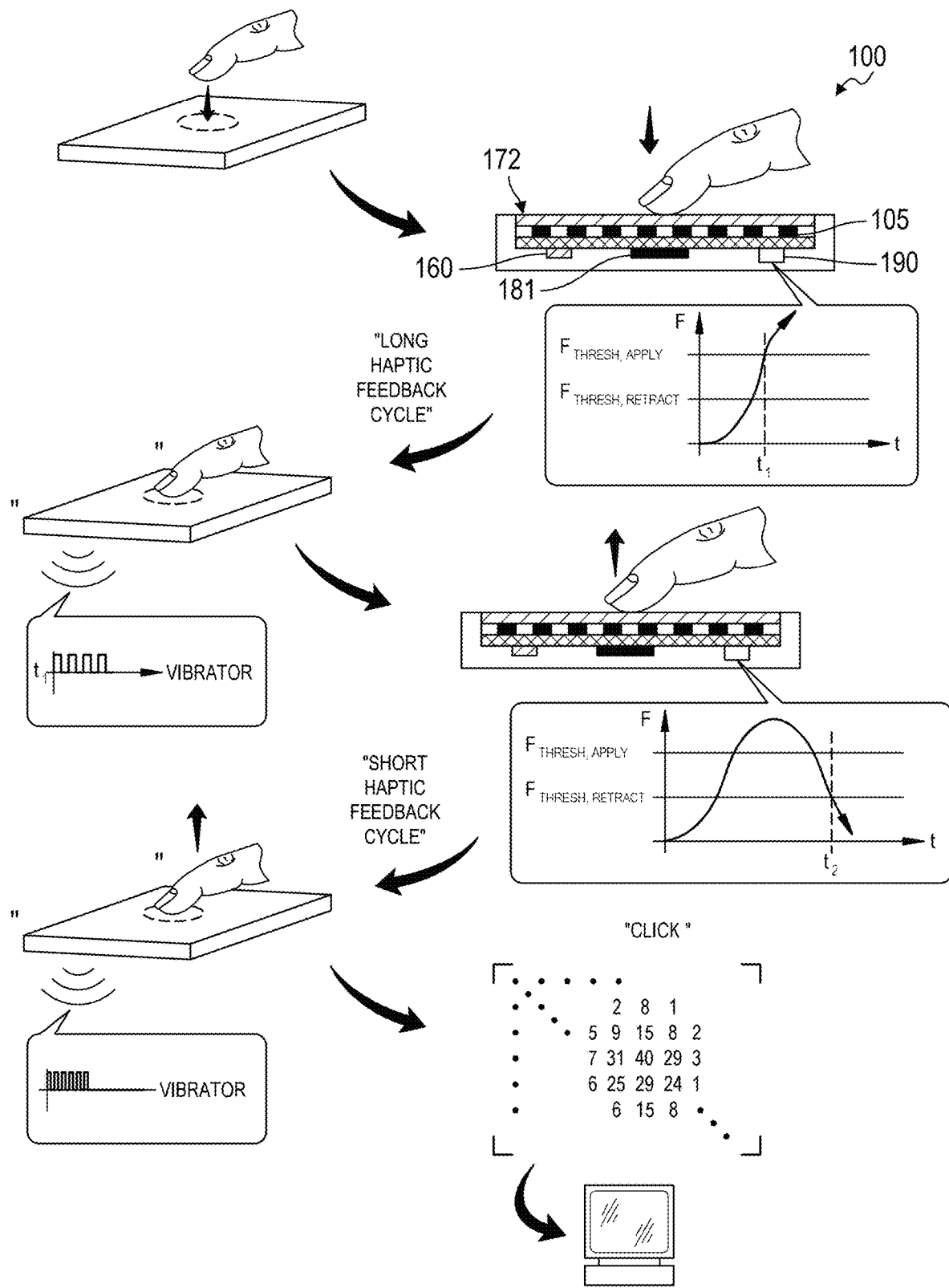
FIG. 18 is a flowchart representation of one variation of the system.

In one variation shown in FIG. 18, the controller 190 implements hysteresis techniques to trigger haptic feedback cycles during application and retraction of a single input on the touch sensor surface 172. In particular, in this variation, the controller 190 can selectively: drive the multi-layer inductor 150 according to a "down-click" oscillation profile during a haptic feedback cycle in response to detecting a new input—of force greater than a high force threshold (e.g., 165 grams)—applied to the touch sensor surface 172; track this input in contact with the touch sensor surface 172 over multiple scan cycles; and then drive the multi-layer inductor 150 according to an "up-click" oscillation profile during a later haptic feedback cycle in response to detecting a drop in force magnitude of this input to less than a low force threshold (e.g., 60 grams). Accordingly, the system 100 can: replicate the tactile "feel" of a mechanical snap button being depressed and later released; and prevent "bouncing" haptic feedback when the force magnitude of an input on the touch sensor surface 172 varies around the force threshold.

More specifically, when the force magnitude of an input on the touch sensor surface 172 reaches a high force threshold, the controller 190 can execute a single "down-click" haptic feedback cycle—suggestive of depression of a mechanical button—until the input is released from the touch sensor surface 172. However, the controller 190 can also execute an "up-click" haptic feedback cycle—suggestive of release of a depressed mechanical button—as the force magnitude of this input drops below a second, lower threshold magnitude. Therefore, the controller 190 can implement hysteresis techniques to prevent "bouncing" in haptic responses to the inputs on the touch sensor surface 172, to indicate to a user that a force applied to the touch sensor surface 172 has been registered (i.e., has reached a first threshold magnitude) through haptic feedback, and to indicate to the user that the user's selection has been cleared and force applied to the touch sensor surface 172 has been registered (i.e., the applied force has dropped below a second threshold magnitude) through additional haptic feedback.

10. Multiple Multi-Layer Inductors

In one variation, the system 100 can also include multiple multi-layer inductor 150 and magnetic element pairs. In one example, the system 100 includes: a first multi-layer inductor 150 arranged proximal a first edge of the substrate 102; and a first magnetic element 181 arranged in the chassis 192 under the first multi-layer inductor 150 and thus near the first edge of the substrate 102. In this example, the system 100 can also include: a second magnetic element 182 rigidly coupled to the chassis 192 and offset from the first magnetic element 181; and a second inductor coupled to the substrate 102 below the touch sensor surface 172, arranged proximal a second edge of the substrate 102 opposite the first edge, and configured to magnetically couple to the second magnetic element 182. Furthermore, in this example, the controller 190 can: selectively polarize the first multi-layer inductor 150 responsive to detection of the touch input on the touch sensor surface 172 proximal the first edge of the substrate 102 to oscillate the substrate 102 in the vibration plane relative to the chassis 192 with peak energy perceived proximal this first edge of the substrate 102; and selectively polarize the second inductor responsive to detection of a second touch input on the touch sensor surface 172 proximal the second edge of the substrate 102 to oscillate the substrate 102 in the vibration plane relative to the chassis 192 with peak energy perceived proximal this second edge of the substrate 102.

In a similar implementation, the system 100 can include a first multi-layer inductor 150—as described above—and a second inductor/magnetic element pair that cooperates with the first inductor-magnetic element pair to oscillate the substrate 102. In this variation, the first inductor-magnetic element pair can include a coil mounted to the substrate 102 offset to the right of the center of mass of the substrate 102 by a first distance. The first inductor-magnetic element pair can also include an array of magnets aligned in a row under the multi-layer inductor 150. The array of magnets can cooperate with the multi-layer inductor 150 of the first inductor-magnetic element pair to define an axis of vibration of the first inductor-magnetic element pair. The second inductor-second magnetic element 182 pair can include a coil mounted to the substrate 102 offset to the left of the center of mass of the substrate 102 by a second distance. The second inductor-second magnetic element 182 pair can also include an array of magnets aligned in a row. The array of magnets can cooperate with the multi-layer inductor 150 of the second inductor-second magnetic element 182 pair to define an axis of vibration of the second inductor-second magnetic element 182 pair.

In one implementation, the array of magnets of the first inductor-magnetic element pair can be arranged in a row parallel the array of magnets of the second inductor-second magnetic element 182 pair such that the axis of vibration of the first inductor-magnetic element pair is parallel to the axis of vibration of the second inductor-second magnetic element 182 pair. In this implementation, the multi-layer inductor 150 of the first inductor-magnetic element pair can be mounted to the substrate 102 offset from the center of mass of the substrate 102 by the first distance equal to the second distance between the multi-layer inductor 150 of the second inductor-second magnetic element 182 pair and the center of mass. Therefore, a midpoint between the multi-layer inductor 150 of the first inductor-magnetic element pair and the multi-layer inductor 150 of the second inductor-second magnetic element 182 pair can be coaxial with the center of mass. Therefore, the first inductor-magnetic element pair and second inductor-second magnetic element 182 pair can cooperate to vibrate the substrate 102 along an overall axis of vibration that extends parallel the axis of vibration of the first magnet and the axis of vibration of the second magnet and through the center of mass of the substrate 102.

The controller 190 can drive the first inductor-magnetic element pair to oscillate the substrate 102 at a first frequency and the second inductor-second magnetic element 182 pair to oscillate at a similar frequency in phase with vibration of the first multi-layer inductor 150. Therefore, the first and second multi-layer inductors 150 can cooperate to oscillate the substrate 102 linearly along the overall axis of vibration. However, the controller 190 can additionally or alternatively drive the first multi-layer inductor 150 to oscillate the substrate 102 at the first frequency and the second multi-layer inductor 150 to oscillate at a second frequency distinct from the first frequency and/or out of phase with vibration of the first multi-layer inductor 150. Therefore, the first and second multi-layer inductors 150 can cooperate to rotate the substrate 102—within a plane parallel the touch sensor surface 172—about the center of mass.

Additionally or alternatively, the controller 190 can selectively drive either the first multi-layer inductor 150 or the second multi-layer inductor 150 to oscillate at a particular time. The controller 190 can selectively (and exclusively) drive the first multi-layer inductor 150 to mimic a sensation of a click over a section of the substrate 102 adjacent the first multi-layer inductor 150. The controller 190 can alternatively drive the second multi-layer inductor 150 to mimic a sensation of a click over a section of the substrate 102 adjacent the second multi-layer inductor 150 while minimizing vibration over a section of the substrate 102 adjacent the first multi-layer inductor 150. For example, the controller 190 can selectively drive the first multi-layer inductor 150 to execute the haptic feedback cycle in order to mimic the sensation of a click on the right side of the substrate 102 (or a "right" click) while the second multi-layer inductor 150 remains inactive.

However, the controller 190 can also drive the first multi-layer inductor 150 to oscillate according to a particular vibration waveform. Simultaneously, the controller 190 can drive the second multi-layer inductor 150 to oscillate according to a vibration waveform out of phase (e.g., 180° out of phase) with the particular vibration waveform of the first multi-layer inductor 150. For example, the second multi-layer inductor 150 can output the vibration waveform of an amplitude smaller than the amplitude of the particular vibration waveform. In this example, the vibration waveform of the second multi-layer inductor 150 can also be 180° out of phase with the particular vibration waveform of the first multi-layer inductor 150. Therefore, the second multi-layer inductor 150 can be configured to counteract (or decrease the amplitude of) the particular vibration waveform output by the first multi-layer inductor 150.

11. Separate Inductor

In one variation, a region of the substrate 102 is routed or otherwise removed to form a shallow recess through a subset of layers of the substrate 102. For example, a three-layer-thick region of the substrate 102 near the lateral and longitudinal centers of the substrate 102 can be removed from the bottom face of the substrate 102. A discrete, thin, wire coil can be soldered to a set of vias exposed at a base of the recess and then installed (e.g., bonded, potted) within the recess such that the exposed face of the coil is approximately flush (e.g., within 100 microns) with the bottom face of the substrate 102.

Additionally or alternatively, the system 100 can include: a first integrated inductor fabricated across multiple layers of the substrate 102, as described; and a second coil arranged over and electrically coupled to the first integrated inductor and configured to cooperate with the first integrated inductor to form a larger inductor exhibiting greater magnetic coupling to the adjacent magnetic element. For example, the second coil can include: a multi-loop wire coil; or a second integrated inductor fabricated across multiple layers of a second substrate 102 that is then bonded and/or soldered to the (first) substrate 102 adjacent the first integrated inductor.

12. Waterproofing

Figure 9A:
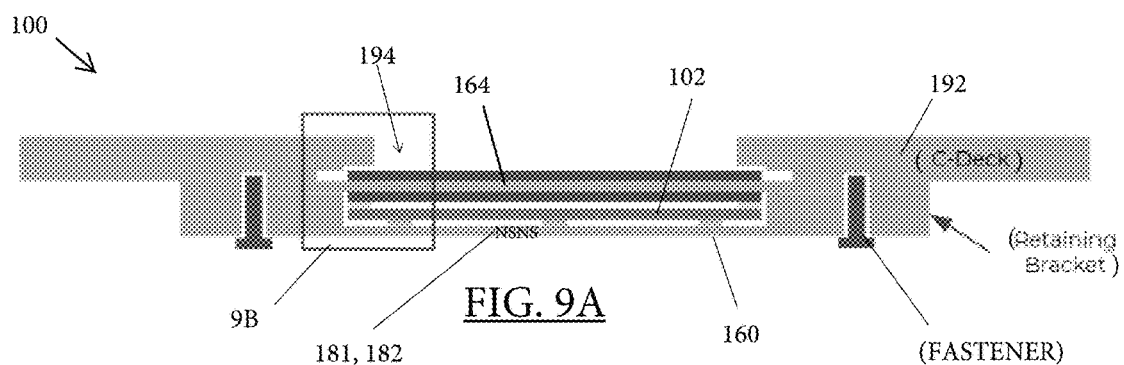
FIGS. 9A and 9B are schematic representations of one variation of the system.
Figure 9B:
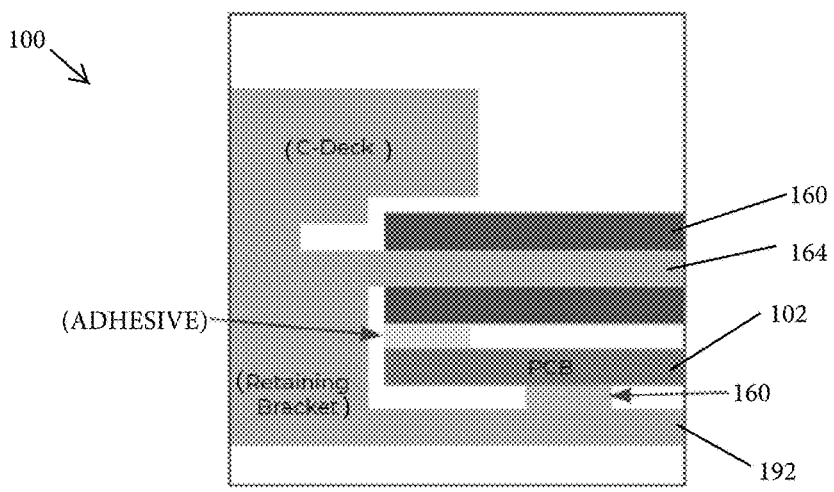

In one variation shown in FIGS. 9A and 9B, a waterproofing membrane 164: is applied over the touch sensor; extends outwardly from the perimeter of the substrate 102; is bonded, clamped, or otherwise retained near a perimeter of the receptacle 194; and thus cooperates with the chassis 192 to seal the touch sensor, the substrate 102, and the deflection spacers 160, etc. within the receptacle 194, thereby preventing moisture and particulate ingress into the receptacle 194 and onto the substrate 102.

For example, the waterproofing membrane 164 can include a silicone or PTFE (e.g., expanded PTFE) film bonded over the touch sensor with an adhesive. The system 100 can also include a glass or other cover layer 170 bonded over the waterproofing membrane 164 and extending up to a perimeter of the substrate 102.

Furthermore, the chassis 192 can define a flange (or "shelf," undercut) extending inwardly toward the lateral and longitudinal center of the receptacle 194. The outer section of the waterproofing member that extends beyond the substrate 102 can be inserted into the receptacle 194 and brought into contact with the underside of the flange. A circumferential retaining bracket or a secondary chassis 192 member can then be fastened to the chassis 192 under the flange and (fully) above the perimeter of the receptacle 194 in order to clamp the waterproofing membrane 164 between the chassis 192 and the circumferential retaining bracket or secondary chassis 192 member, thereby sealing the waterproofing membrane 164 about the receptacle 194.

In one implementation, the waterproofing membrane 164 includes a convolution between the perimeters of the substrate 102 and the receptacle 194. In this implementation, the convolution can be configured to deflect or deform in order to accommodate oscillation of the substrate 102 during a haptic feedback cycle. For example, the waterproofing membrane 164 can include a polyimide film with a semi-circular ridge extending along a gap between the outer perimeter of the substrate 102 and the inner perimeter of the receptacle 194.

In a similar implementation, the substrate 102 and the touch sensor are arranged over the waterproofing membrane 164, which is sealed against the chassis 192 along an underside of the receptacle 194 by a retaining bracket, as described above such that the touch sensor assembly is located fully above a waterproof barrier across the receptacle 194 and such that waterproof membrane oscillates to vibrate the touch sensor assembly when the multi-layer inductor 150 is actuated.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A system comprising:
a substrate defining a unitary structure and comprising:
a first layer:
comprising a first spiral trace;
coiled in a first direction; and
defining a first end and a second end; and
a second layer:
arranged below the first layer; and
comprising a second spiral trace:
coiled in a second direction opposite the first direction;
defining a third end and a fourth end, the third end electrically coupled to the second end of the first spiral trace; and
cooperating with the first spiral trace to form a multi-layer inductor defining a primary axis and a secondary axis;
a first magnetic element:
arranged below the substrate;
defining a first polarity facing the multi-layer inductor;
extending along the primary axis of the multi-layer inductor; and
arranged on a first side of the primary axis of the multi-layer inductor;
a second magnetic element:
arranged below the substrate adjacent the first magnetic element;
defining a second polarity, opposite the first polarity, facing the multi-layer inductor;
extending along the primary axis of the multi-layer inductor; and
arranged on a second side of the primary axis of the multi-layer inductor; and
a controller configured to, in response to an input on a touch sensor surface arranged over the substrate, drive an oscillating voltage across the multi-layer inductor during a haptic feedback cycle to:
induce alternating magnetic coupling between the multi-layer inductor and the first magnetic element and the second magnetic element; and
oscillate the substrate relative to the first magnetic element and the second magnetic element.

2. The system of claim 1, further comprising: a set of deflection spacers, each deflection spacer in the set of deflection spacers arranged over a discrete deflection spacer location, in a set of discrete deflection spacer locations, on a bottom surface of the substrate below the first layer; and an array of spring elements coupling the set of deflection spacers to a chassis of a computing device; supporting the substrate on the chassis; and configured to yield to oscillation of the substrate, responsive to the oscillating voltage across the multi-layer inductor, during the haptic feedback cycle.

3. The system of claim 2:
further comprising a unitary metallic structure:
arranged between the substrate and the chassis;
defining an aperture below the multi-layer inductor; and
comprising a set of flexures arrange about the aperture and defining the array of spring elements; and
further comprising a magnetic yoke arranged in the aperture of the unitary metallic structure; and
wherein the first magnetic element and the second magnetic element are arranged on the magnetic yoke below the multi-layer inductor.

4. The system of claim 2:
wherein the substrate further comprises
a bottom layer:
arranged below the second layer opposite the first layer; and
comprising a set of sensor traces arranged at the set of discrete deflection spacer locations;
wherein each deflection spacer in the set of deflection spacers comprises a force-sensitive material exhibiting variations in local contact resistance responsive to variations in applied force; and
wherein the controller is configured to:
read resistance values from the set of sensor traces;
interpret a force magnitude of the input applied to the touch sensor surface based on resistance values read from the set of sensor traces; and drive the oscillating voltage across the multi-layer inductor during the haptic feedback cycle in response to the force magnitude of the input exceeding a threshold force.

5. The system of claim 4:
wherein the array of spring elements comprise a unitary metallic structure arranged between the substrate and the chassis and defining a nominal plane;
wherein each spring element, in the array of spring elements:
is formed in the unitary metallic structure;
defines a stage coupled to a deflection spacer, in the set of deflection spacers, opposite the bottom layer of the substrate; and
is configured to return toward the nominal plane in response to absence of inputs applied to the touch sensor surface; and
wherein each deflection spacer, in the set of deflection spacers, electrically couples an adjacent sensor trace, in the set of sensor traces, with a resistance that varies according to magnitude of forces applied to the touch sensor surface and carried into the deflection spacer.

6. The system of claim 4:
wherein a first spring element, in the array of spring elements, yields to the input applied to a first region of the touch sensor surface proximal the first spring element at a first time;
wherein a first deflection spacer, in the set of deflection spacers:
compresses between the first spring element and a first support location, in the array of support locations, on the bottom layer of the substrate; and
exhibits a decrease in local contact resistance proportional to a force magnitude of the input; and
wherein the controller is configured to:
detect a first change in resistance value across a first sensor trace, adjacent the first deflection spacer, at the first time; and
interpret the force magnitude of the input, partially carried by the first spring element, based on the first change in resistance value.

7. The system of claim 4, wherein the substrate further comprises a top layer: arranged over the first layer opposite the second layer; and comprising an array of drive and sense electrode pairs; and wherein the controller is configured to: read capacitance values from the set of sensor traces at a scan frequency during a first time period; interpret the force magnitude of the input applied to the touch sensor surface based on capacitance values read from the drive and sense electrode pairs during the first time period; in response to the force magnitude of the input exceeding the threshold force: drive the oscillating voltage across the multi-layer inductor during the haptic feedback cycle, following the first time period; and pause reading electrical values from the drive and sense electrode pairs during the haptic feedback cycle; and resume reading capacitance values from the sensor traces following completion of the haptic feedback cycle.

8. The system of claim 2:
wherein the substrate further comprises
a bottom layer:
arranged below the second layer opposite the first layer; and
comprising a set of sensor traces arranged at the set of discrete deflection spacer locations;

further comprising a coupling plate configured to:
couple to the chassis adjacent the array of spring elements; and
effect capacitance values of the set of sensor traces responsive to displacement of the substrate toward the coupling plate; and
wherein the controller is further configured to:
read capacitance values from the set of sensor traces;
interpret a force magnitude of the input applied to the touch sensor surface based on capacitance values read from the set of sensor traces; and
drive the oscillating voltage across the multi-layer inductor during the haptic feedback cycle in response to the force magnitude of the input exceeding a threshold force.

9. The system of claim 8:
wherein the array of spring elements and the coupling plate comprise a unitary metallic structure:
arranged between the substrate and the chassis;
defining a nominal plane; and
defining an array of capacitive coupling regions adjacent the set of discrete deflection spacer locations;
wherein each spring element, in the array of spring elements:
is formed in the unitary metallic structure;
extends from a capacitive coupling region, in the array of capacitive coupling regions; and
is configured to return toward the nominal plane in response to absence of inputs applied to the touch sensor surface; and
wherein each sensor trace, in the set of sensor traces:
capacitively couples to an adjacent capacitive coupling region, in the array of capacitive coupling regions, of the unitary metallic structure; and
moves toward the adjacent capacitive coupling region in response to application of inputs on the touch sensor surface proximal the sensor trace.

10. The system of claim 8:
wherein a first spring element, in the array of spring elements, yields to a touch input applied to a first region of the touch sensor surface proximal the first spring element at a first time;
wherein a first sensor trace, in the array of sensor traces, adjacent the first region of the touch sensor surface moves toward a first capacitive coupling region, in the array of capacitive coupling regions, by a distance proportional to a force magnitude of the input; and
wherein the controller is configured to:
detect a first change in capacitance value of the first sensor trace at the first time; and
interpret the force magnitude of the input based on the first change in capacitance value.

11. The system of claim 1:
further comprising a touchscreen arranged over the substrate and comprising:
a digital display;
a touch sensor arranged across the display; and
a cover layer arranged over the display and defining the touch sensor surface; and
wherein the controller is configured to drive the oscillating voltage across the multi-layer inductor during the haptic feedback cycle in response to the touchscreen detecting the input on the touch sensor surface.

12. The system of claim 1: wherein the substrate further comprises a top layer: arranged over the first layer opposite the second layer; and comprising an array of drive and sense electrode pairs; further comprising a cover layer arranged over the top layer and defining the touch sensor surface; and wherein the controller is configured to: read a set of electrical values from the drive and sense electrode pairs; detect the input on the touch sensor surface based on the set of electrical values; and drive the oscillating voltage across the multi-layer inductor during the haptic feedback cycle in response to the input on the touch sensor surface.

13. The system of claim 12: wherein the controller is configured to: read the set of electrical values, representing capacitive coupling between drive and sense electrode pairs, from the drive and sense electrode pairs; and detect the input at a first location on the touch sensor surface based on a deviation of a subset of electrical values, in the set of electrical values, from baseline capacitance values across a subset of drive and sense electrode pairs proximal the first location; and further comprising an intermediate layer: interposed between the top layer and the first layer; and comprising a contiguous trace area defining an electrical shield configured to shield the drive and sense electrode pairs from electrical noise generated by the multi-layer inductor when driven with an oscillating voltage by the controller.

14. The system of claim 1:
wherein the first spiral trace defines a first planar coil spiraling inwardly in a clockwise direction within the first layer; and
wherein the second spiral trace defines a second planar coil spiraling outwardly in a counter-clockwise direction within the second layer and cooperating with the first spiral trace to pass current in a common direction about a center of the multi-layer inductor.

15. The system of claim 1:
wherein the first spiral trace defines a first planar coil spiraling outwardly from the first end to the second end within the first layer, the second end terminating at a periphery of the first spiral trace;
wherein the second spiral trace defines a second planar coil spiraling inwardly from the third end to the fourth end within the second layer, the fourth end terminating proximal a center of the second spiral trace, the third end coupled to the second end proximal a periphery of the second spiral trace;
wherein the first layer further comprises a third spiral trace defining a third planar coil:
comprising a fifth end and a sixth end;
parallel to the first spiral trace; and
spiraling inwardly from the fifth end to the sixth end within the first layer, the sixth end terminating proximal a center of the second spiral trace and coupled to the first end of the first spiral trace, the sixth end terminating at the periphery of the first spiral trace; and
wherein the controller drives the oscillating voltage across the sixth end of the third spiral trace and the fourth end of the second spiral trace during the haptic feedback cycle in response to the input on the touch sensor surface.

16. The system of claim 1:
wherein the first layer further comprises a third spiral trace:
adjacent the first spiral trace
coiled in the second direction; and
defining a fifth end and a sixth end, the fifth end electrically coupled to the first end of the first spiral trace;

wherein the second layer further comprises a fourth spiral trace:
adjacent the second spiral trace
coiled in the first direction;
defining a seventh end and an eighth end, the seventh end electrically coupled to the sixth end of the third spiral trace; and
cooperating with the first spiral trace, the second spiral trace, and the third spiral trace to form the multi-layer inductor; and
wherein the controller is configured to, in response to the input on the touch sensor surface, drive the oscillating voltage across the fourth end of the second spiral trace and the eighth end of the fourth spiral trace to:
induce alternating magnetic coupling between the multi-layer inductor and the first magnetic element and the second magnetic element; and
oscillate the substrate relative to the first magnetic element and the second magnetic element.

17. The system of claim 1:
wherein the substrate further comprises:
a third layer:
arranged below the second layer opposite the first layer; and
comprising a third spiral trace:
coiled in the first direction; and
defining a fifth end and a sixth end, the fifth end electrically coupled to the fourth end of the second spiral trace; and
a bottom layer:
arranged below the third layer opposite the second layer; and
comprising a fourth spiral trace:
coiled in the second direction;
defining a seventh end and an eighth end, the seventh end electrically coupled to the sixth end of the third spiral trace; and
cooperating with the first spiral trace, the second spiral trace, and the third spiral trace to form the multi-layer inductor; and
wherein the controller is configured to, in response to the input on the touch sensor surface, drive the oscillating voltage across the first end of the first spiral trace and the eighth end of the fourth spiral trace to:
induce alternating magnetic coupling between the multi-layer inductor and the first magnetic element and the second magnetic element; and
oscillate the substrate and the cover layer relative to the first magnetic element and the second magnetic element.

18. A system comprising:
a substrate defining a unitary structure and comprising:
a first layer comprising a first spiral trace;
coiled in a first direction; and
defining a first end and a second end;
a bottom layer:
arranged below the first layer; and
comprising a second spiral trace:
coiled in a second direction opposite the first direction;
defining a third end and a fourth end, the third end electrically coupled to the second end of the first spiral trace; and
cooperating with the first spiral trace to form a multi-layer inductor defining a primary axis;

a set of deflection spacers, each deflection spacer in the set of deflection spacers arranged over a discrete deflection spacer location, in a set of discrete deflection spacer locations, on the bottom layer of the substrate;

an array of spring elements:
coupling the set of deflection spacers to a chassis of a computing device;
supporting the substrate on the chassis; and
configured to yield to oscillation of the substrate;

a first magnetic element:
arranged in the chassis below the substrate;
defining a first polarity facing the multi-layer inductor; and
extending parallel to the primary axis of the multi-layer inductor; and a controller configured to, in response to an input on a touch sensor surface arranged over the substrate, drive an oscillating voltage across the multi-layer inductor during a haptic feedback cycle to:
induce alternating magnetic coupling between the multi-layer inductor and the first magnetic element; and
oscillate the substrate relative to the first magnetic element and against the set of spring elements.

19. The system of claim 18, wherein the substrate further comprises a bottom layer:
arranged above the first layer opposite the bottom layer; and
comprising a third spiral trace:
coiled in the second direction;
defining a fifth end and a sixth end, the fifth end electrically coupled to the first end of the first spiral trace; and
cooperating with the first spiral trace and the second spiral trace to form the multi-layer inductor.

20. The system of claim 18:
wherein the bottom layer further comprises a set of sensor traces arranged at the set of discrete deflection spacer locations;
further comprising a coupling plate configured to:
couple to the chassis adjacent the array of spring elements; and
effect capacitance values of the set of sensor traces responsive to displacement of the substrate toward the coupling plate; and
wherein the controller is further configured to:
read capacitance values from the set of sensor traces;
interpret a force magnitude of the input applied to the touch sensor surface based on capacitance values read from the set of sensor traces; and
drive the oscillating voltage across the multi-layer inductor during the haptic feedback cycle in response to the force magnitude of the input exceeding a threshold force.

\* \* \* \* \*